US011532628B2

(12) United States Patent
Lin et al.

(10) Patent No.: US 11,532,628 B2
(45) Date of Patent: Dec. 20, 2022

(54) SEMICONDUCTOR DEVICE AND METHOD

(71) Applicant: Taiwan Semiconductor Manufacturing Co., Ltd., Hsinchu (TW)

(72) Inventors: Li-Fong Lin, Hsinchu (TW); Chung-Ting Ko, Kaohsiung (TW); Wan Chen Hsieh, Hsinchu (TW); Tai-Chun Huang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 4 days.

(21) Appl. No.: 17/325,859

(22) Filed: May 20, 2021

(65) Prior Publication Data

US 2022/0278098 A1 Sep. 1, 2022

Related U.S. Application Data

(60) Provisional application No. 63/154,029, filed on Feb. 26, 2021.

(51) Int. Cl.
*H01L 27/092* (2006.01)
*H01L 21/8234* (2006.01)
(Continued)

(52) U.S. Cl.
CPC .. *H01L 27/0924* (2013.01); *H01L 21/823412* (2013.01); *H01L 21/823431* (2013.01);
(Continued)

(58) Field of Classification Search
CPC ......... H01L 27/0924; H01L 21/823412; H01L 21/823431; H01L 21/823481; H01L 29/0673; H01L 29/66795; H01L 29/7851
See application file for complete search history.

(56) References Cited

U.S. PATENT DOCUMENTS 8,836,083 B2 9/2014 Zhou
9,209,247 B2 12/2015 Colinge et al.
(Continued)

FOREIGN PATENT DOCUMENTS

DE 102018128193 A1 4/2020
KR 20090090327 A 8/2009
(Continued)

*Primary Examiner* — Christine A Enad
(74) *Attorney, Agent, or Firm* — Slater Matsil, LLP

(57) ABSTRACT

Improved methods for forming gate isolation structures between portions of gate electrodes and semiconductor devices formed by the same are disclosed. In an embodiment, a method includes forming a channel structure over a substrate; forming a first isolation structure extending in a direction parallel to the channel structure; forming a dummy gate structure over the channel structure and the first isolation structure; depositing a hard mask layer over the dummy gate structure; etching the hard mask layer to form a first opening through the hard mask layer over the first isolation structure; conformally depositing a first dielectric layer over the hard mask layer, in the first opening, and over the dummy gate structure; etching the first dielectric layer to extend the first opening and expose the dummy gate structure; and etching the dummy gate structure to extend the first opening and expose the first isolation structure.

20 Claims, 85 Drawing Sheets

(51) Int. Cl.
    *H01L 29/06*     (2006.01)
    *H01L 29/66*     (2006.01)
    *H01L 29/78*     (2006.01)

(52) U.S. Cl.
    CPC .. *H01L 21/823481* (2013.01); *H01L 29/0673* (2013.01); *H01L 29/66795* (2013.01); *H01L 29/7851* (2013.01)

(56) References Cited

U.S. PATENT DOCUMENTS

| | | |
|---|---|---|
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2014/0252486 A1 | 9/2014 | Lin et al. |
| 2019/0067417 A1 | 2/2019 | Ching et al. |
| 2019/0148539 A1* | 5/2019 | Yang .................. H01L 29/0649 257/401 |
| 2020/0020794 A1* | 1/2020 | Lin .................. H01L 23/5329 |
| 2020/0083222 A1* | 3/2020 | Kim ................ H01L 21/823821 |
| 2020/0105613 A1 | 4/2020 | Hung et al. |
| 2021/0335670 A1* | 10/2021 | Ko .................. H01L 21/823431 |

FOREIGN PATENT DOCUMENTS

| | | |
|---|---|---|
| KR | 20140111577 A | 9/2014 |
| KR | 20200037056 A | 4/2020 |

* cited by examiner

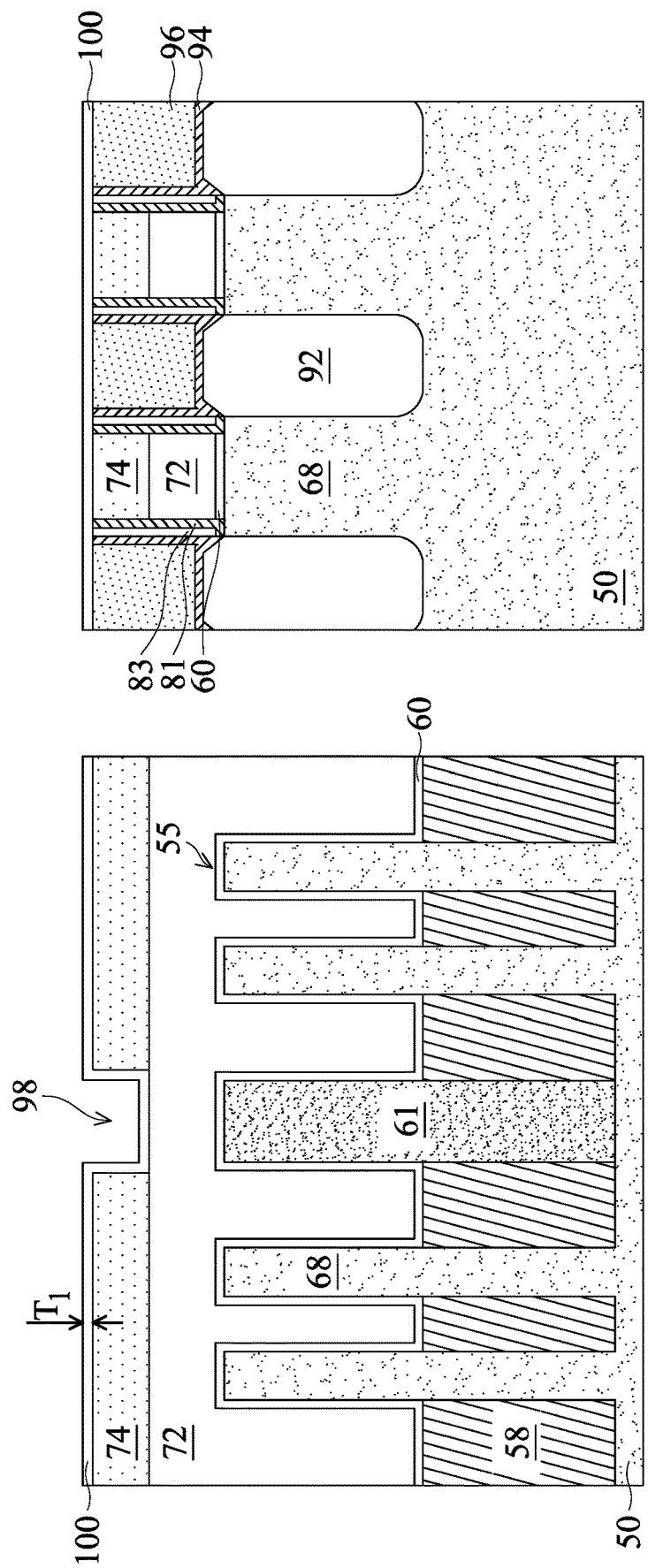

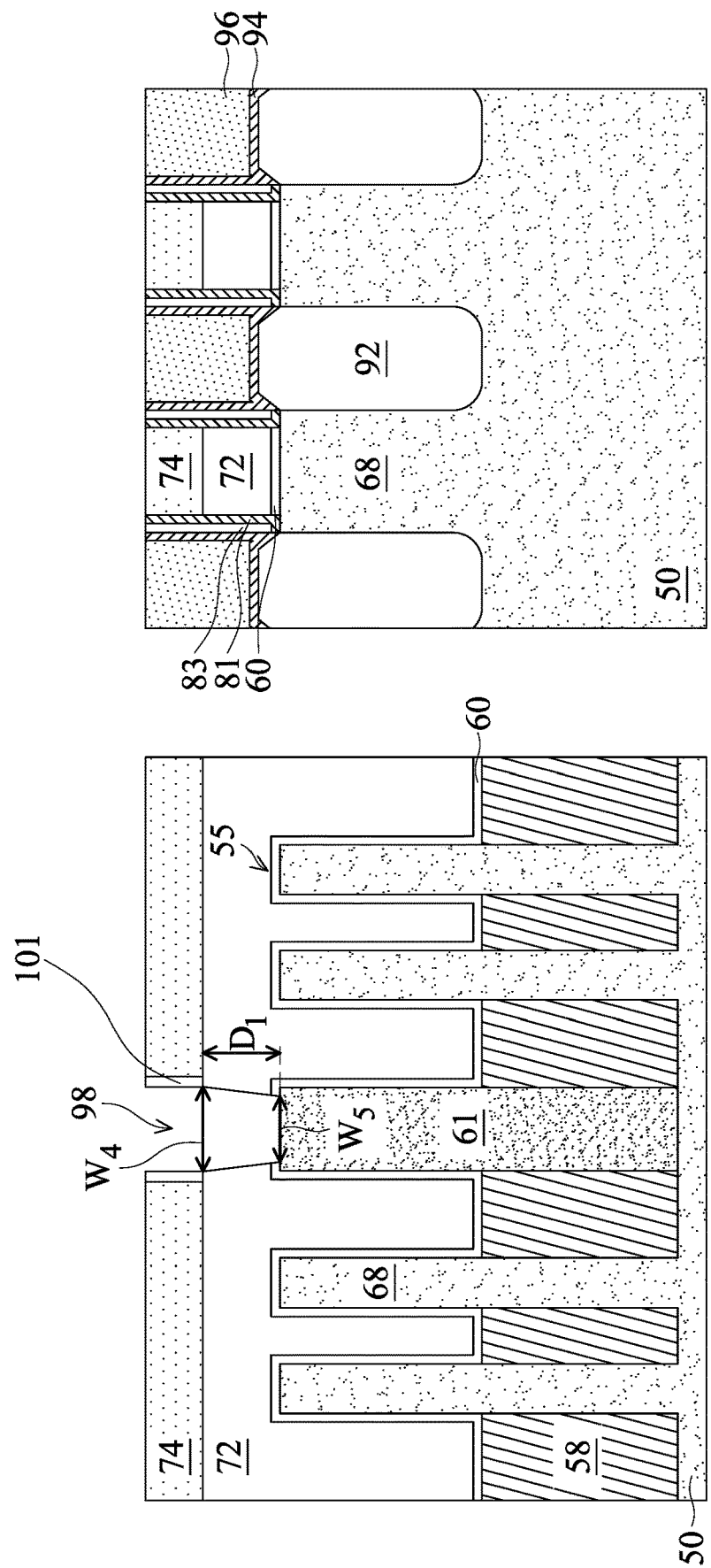

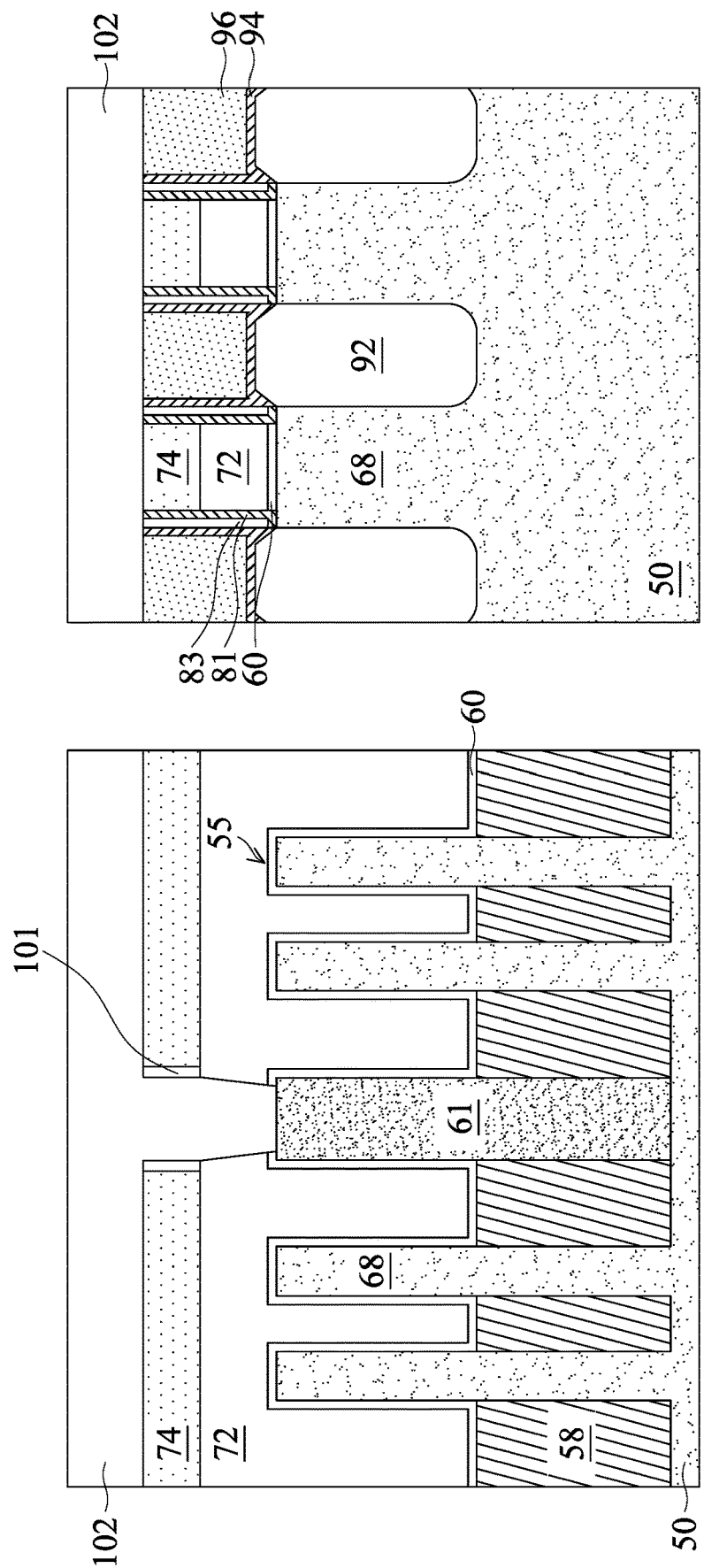

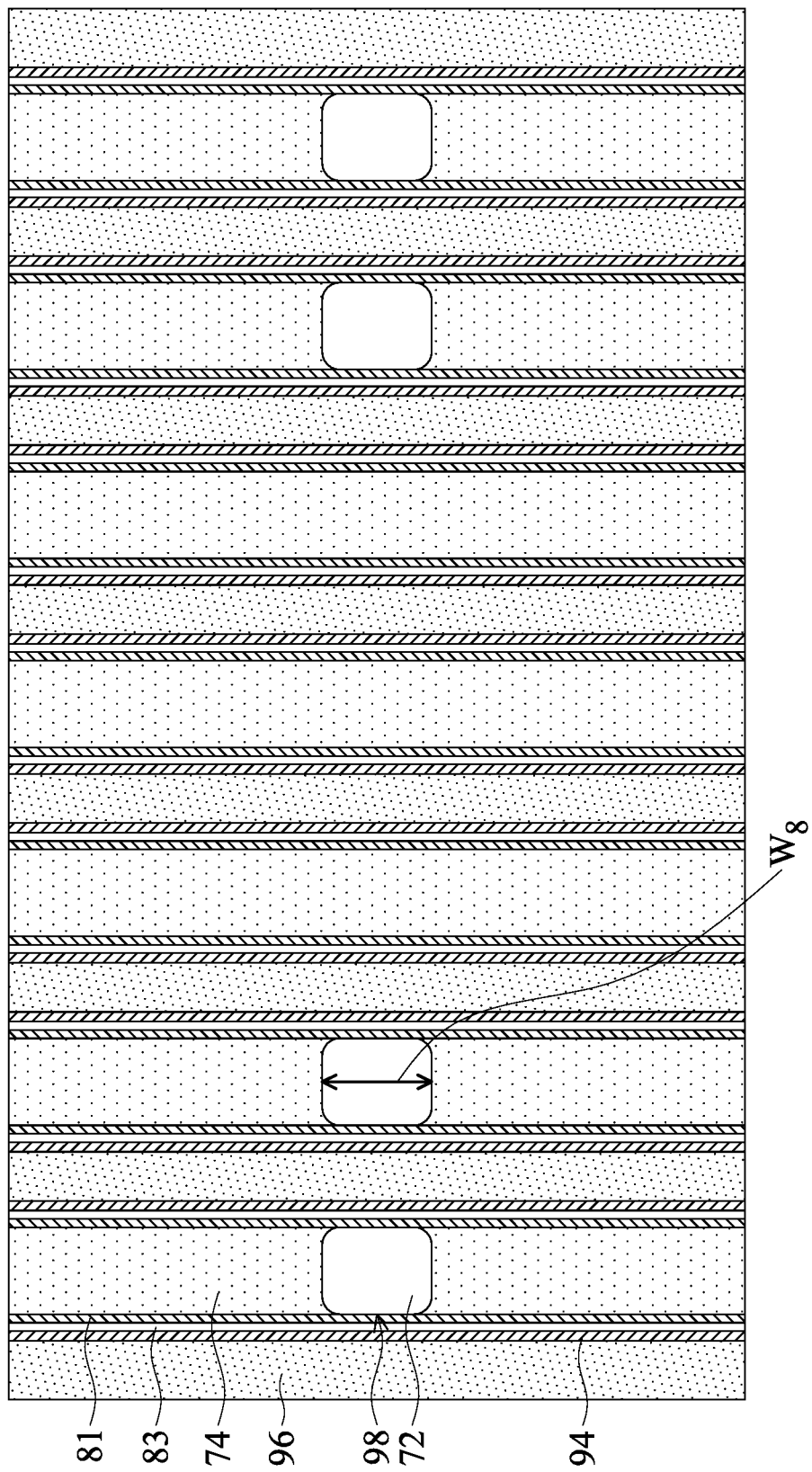

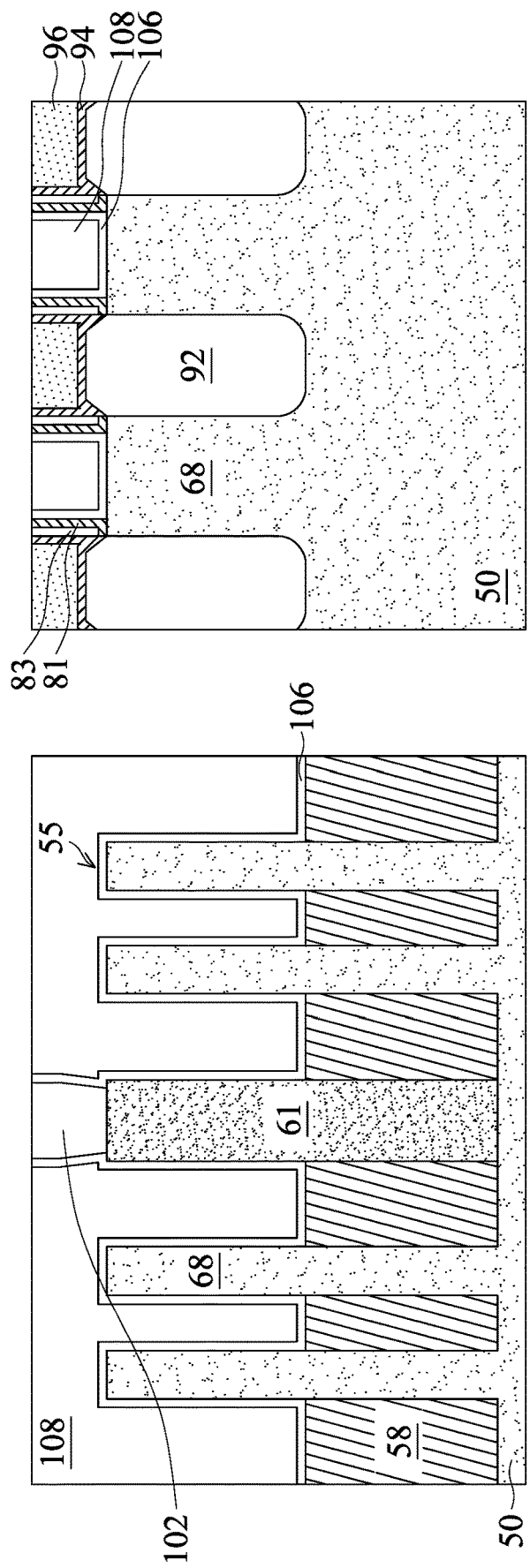

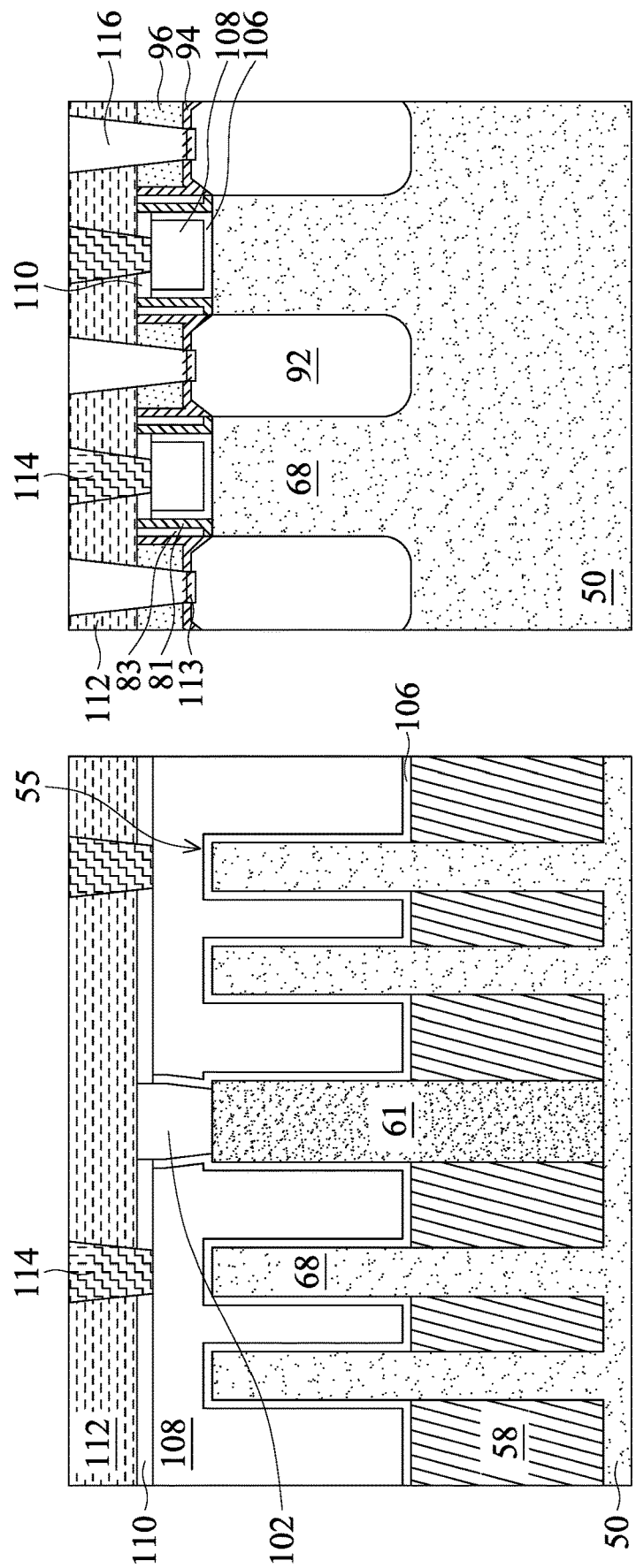

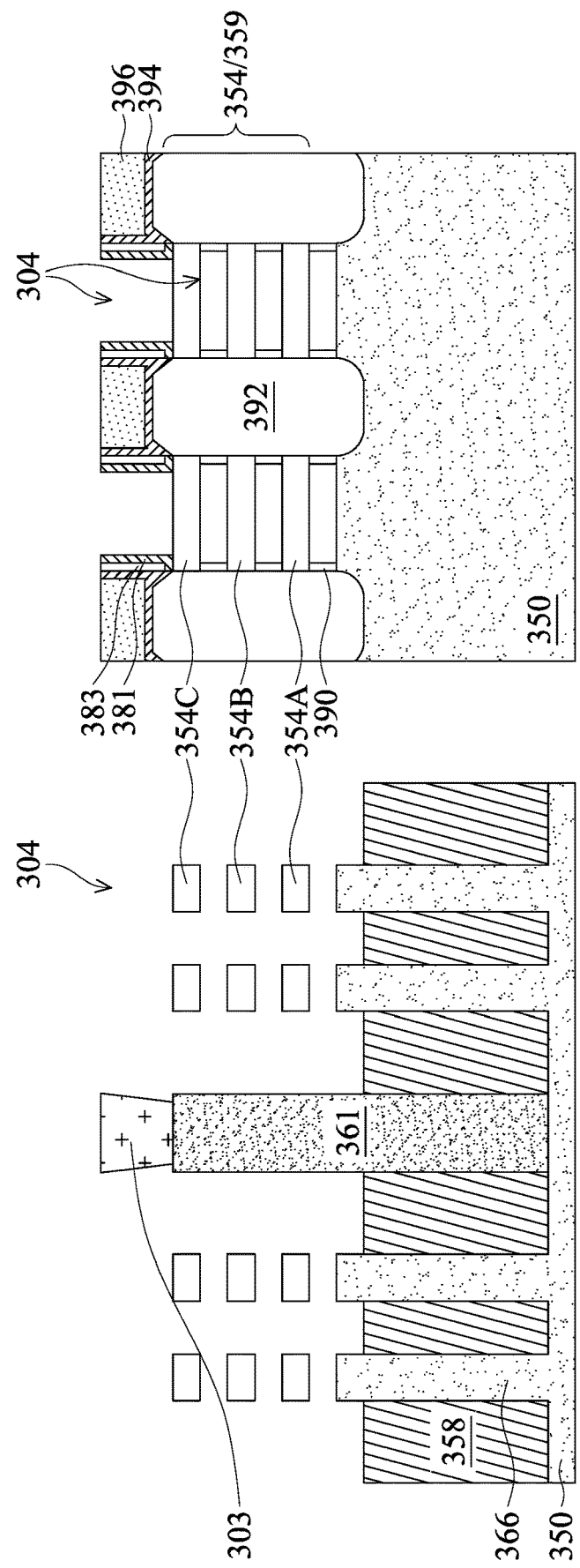

SEMICONDUCTOR DEVICE AND METHOD

PRIORITY CLAIM AND CROSS-REFERENCE

This application claims the benefit of U.S. Provisional Application No. 63/154,029, filed on Feb. 26, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 8C, 9A, 9B, 9C, 9D, 10A, 10B, 10C, 10D, 11A, 11B, 11C, 11D, 12A, 12B, 12C, 12D, 12E, 13A, 13B, 13C, 14A, 14B, 14C, 14D, 15A, 15B, 15C, 15D, 16A, 16B, 16C, 16D, 17A, 17B, 17C, 17D, 17E, 18A, 18B, 18C, 18D, 19A, 19B, 19C, 19D, 20A, 20B, 20C, 20D, 21A, 21B, 21C, 21D, 22A, 22B, 23A, 23B, 24A, 24B, 24C, 24D, 25A, 25B, 25C, 25D, 26A, 26B, 26C, 26D, 27A, 27B, 27C, 27D, 28A, 28B, 28C, 28D, 29A, 29B, 29C, 29D, 30A, and 30B are cross-sectional views and top-down views of intermediate stages in the manufacturing of semiconductor devices, in accordance with some embodiments.

FIGS. 32, 33, 34, 35A, 35B, 35C, 36A, 36B, 36C, 37A, 37B, 37C, 37D, 38A, 38B, 38C, 39A, 39B, 39C, 40A, 40B, 41A, and 41B are cross-sectional views and top-down views of intermediate stages in the manufacturing of semiconductor devices, in accordance with some embodiments.

DETAILED DESCRIPTION

Figure 1:
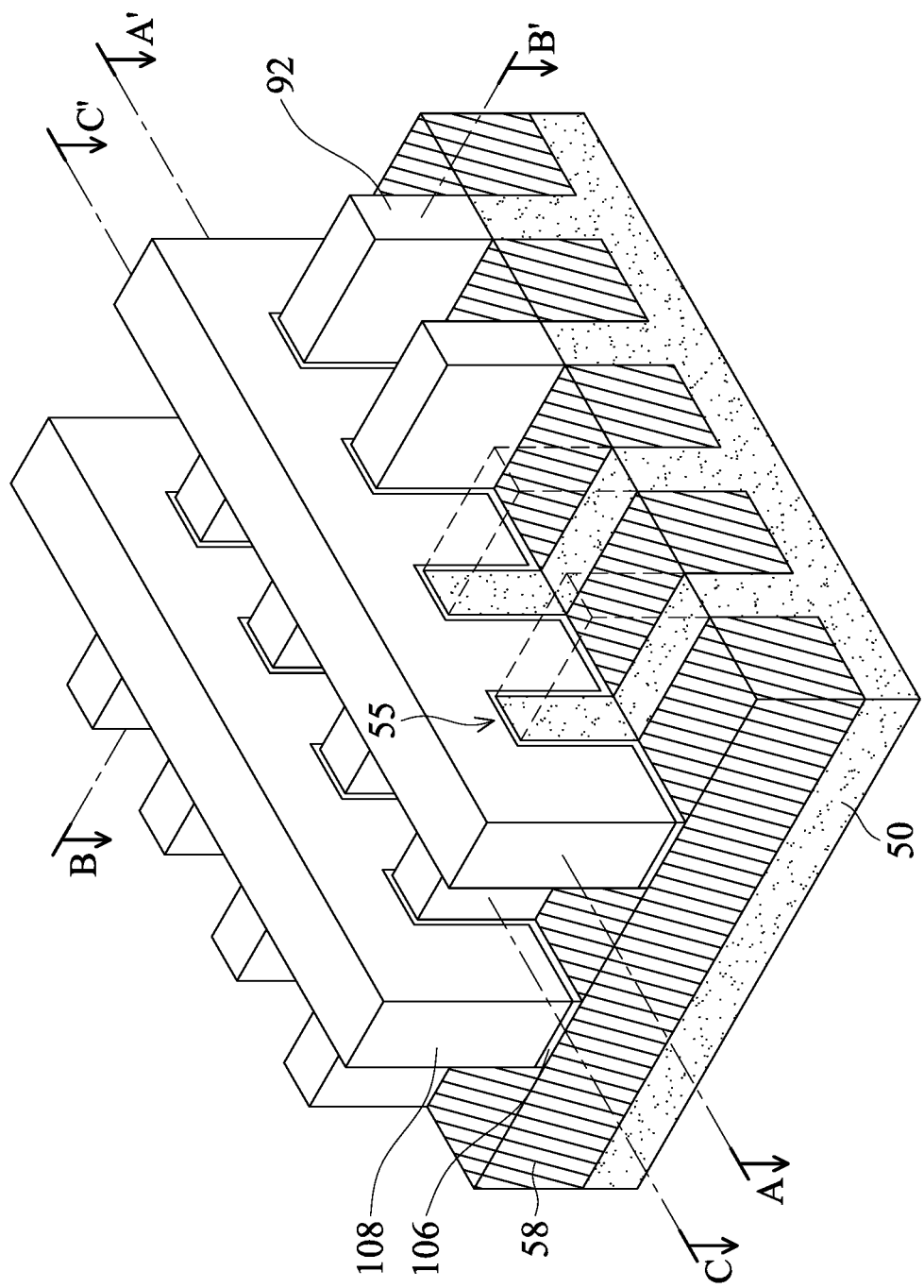
FIG. 1 illustrates an example of a semiconductor device including fin field-effect transistors (FinFETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide an improved method for forming isolation structures in gate electrodes and semiconductor devices formed by said methods. The method includes forming a hard mask over a gate structure (e.g., a dummy gate structure), etching an opening through the hard mask, and depositing a conformal layer over the hard mask and in the opening. The conformal layer may be used to narrow the opening in the hard mask, decreasing a critical dimension of the opening. The conformal layer may be deposited by atomic layer deposition (ALD), plasma-enhanced ALD (PEALD), thermal ALD, or the like. The conformal layer may include a material having a high etch selectivity to a material of the gate structure. For example, the gate structure may comprise polycrystalline silicon and the conformal layer may comprise a nitride (e.g., silicon nitride), an oxide (e.g., silicon oxide), a metal oxide (e.g., aluminum oxide, titanium oxide, or the like), or the like. In some embodiments, the conformal layer may include a material having a low etch selectivity to a material of the gate structure. For example, the gate structure may comprise polycrystalline silicon and the conformal layer may comprise polycrystalline silicon, amorphous silicon, another silicon-based material, or the like.

One or more etching processes, such as anisotropic etching processes, may then be used to extend the opening through the conformal layer and the gate structure, separating adjacent portions of the gate structure from one another. A gate isolation structure may be formed in the opening. Forming the conformal layer in the opening may be used to reduce a critical dimension of the opening and provide better control over the critical dimension of the opening. This helps to reduce device size, improves device performance, and reduces device defects. Moreover, in embodiments in which the conformal layer is formed of a material having a high etch selectivity to a material of the gate structure, scum produced during the processes used to form the opening is reduced, which reduces device defects. In embodiments in which the conformal layer is formed of a material having a low etch selectivity to a material of the gate structure, the conformal layer and the gate structure may be etched simultaneously, reducing processing time and costs.

FIG. 1 illustrates an example of FinFETs, in accordance with some embodiments. The FinFETs comprise fins 55 on a substrate 50 (e.g., a semiconductor substrate). Shallow trench isolation (STI) regions 58 are disposed in the substrate 50 and the fins 55 protrude above and from between neighboring STI regions 58. Although the STI regions 58 are described/illustrated as being separate from the substrate 50, as used herein the term "substrate" may be used to refer to just the semiconductor substrate or a semiconductor substrate inclusive of STI regions. Additionally, although the fins 55 are illustrated as single, continuous materials with the substrate 50, the fins 55 and/or the substrate 50 may comprise a single material or a plurality of materials. In this context, the fins 55 refer to the portions extending between the neighboring STI regions 58.

Gate dielectric layers 106 are along sidewalls and over a top surface of the fins 55, and gate electrodes 108 are over the gate dielectric layers 106. Epitaxial source/drain regions 92 are disposed on opposite sides of the fins 55, the gate dielectric layers 106, and the gate electrodes 108. FIG. 1 further illustrates reference cross-sections that are used in later figures. Cross-section A-A' is along a longitudinal axis of a gate electrode 108 and in a direction, for example, perpendicular to the direction of current flow between the epitaxial source/drain regions 92 of the FinFETs. Cross-section B-B' is perpendicular to cross-section A-A' and is along a longitudinal axis of a fin 55 and in a direction of, for example, the current flow between the epitaxial source/drain regions 92 of the FinFETs. Cross-section C-C' is parallel to cross-section A-A' and extends through the epitaxial source/drain regions 92 of the FinFETs. Subsequent figures refer to these reference cross-sections for clarity.

Some embodiments discussed herein are discussed in the context of fin field effect transistors (FinFETs) formed using gate-last processes. In some embodiments, a gate-first process may be used. Also, some embodiments contemplate aspects used in planar devices (e.g., planar field effect transistors), nanostructure (e.g., nanosheet, nanowire, gate-all-around, or the like) field effect transistors (NSFETs), or the like.

FIGS. 2 through 30B are cross-sectional views of intermediate stages in the manufacturing of FinFETs, in accordance with some embodiments. FIGS. 2 through 7, 8A, 9A, 10A, 11A, 12A, 13A, 14A, 15A, 16A, 17A, 17E, 18A, 19A, 20A, 21A, 22A, 23A, 24A, 25A, 26A, 27A, 28A, 29A, and 30A are illustrated along reference cross-section A-A' illustrated in FIG. 1. FIGS. 8B, 9B, 10B, 11B, 12B, 13B, 14B, 15B, 16B, 17B, 18B, 19B, 20B, 21B, 22B, 23B, 24B, 25B, 26B, 27B, 28B, and 30B are illustrated along reference cross-section B-B' illustrated in FIG. 1. FIGS. 9D, 10D, 11D, 12D, and 12E are illustrated along reference cross-section C-C' illustrated in FIG. 1. FIGS. 14D, 15D, 16D, 17D, 18D, 19D, 20D, 21D, 24D, 25D, 26D, 27D, 28D, and 29D are illustrated along reference cross-section D-D', parallel to cross-section B-B', and illustrated in FIG. 14C. FIGS. 8C, 9C, 10C, 11C, 12C, 13C, 14C, 15C, 16C, 17C, 18C, 19C, 20C, 21C, 24C, 25C, 26C, 27C, 28C, and 29C are top-down views.

Figure 2:
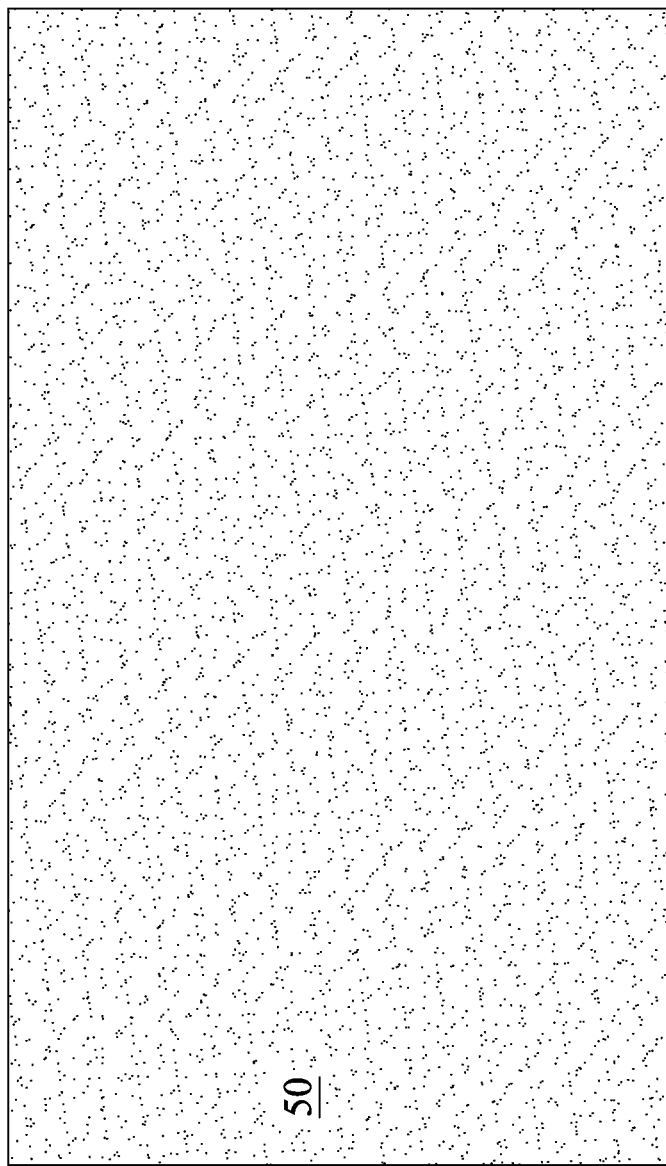

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 may include an n-type region for forming n-type devices, such as NMOS transistors, e.g., n-type FinFETs, and a p-type region for forming p-type devices, such as PMOS transistors, e.g., p-type FinFETs. The n-type region may be physically separated from the p-type region, and any number of device features (e.g., other active devices, doped regions, isolation structures, etc.) may be disposed between the n-type region and the p-type region.

Figure 3:
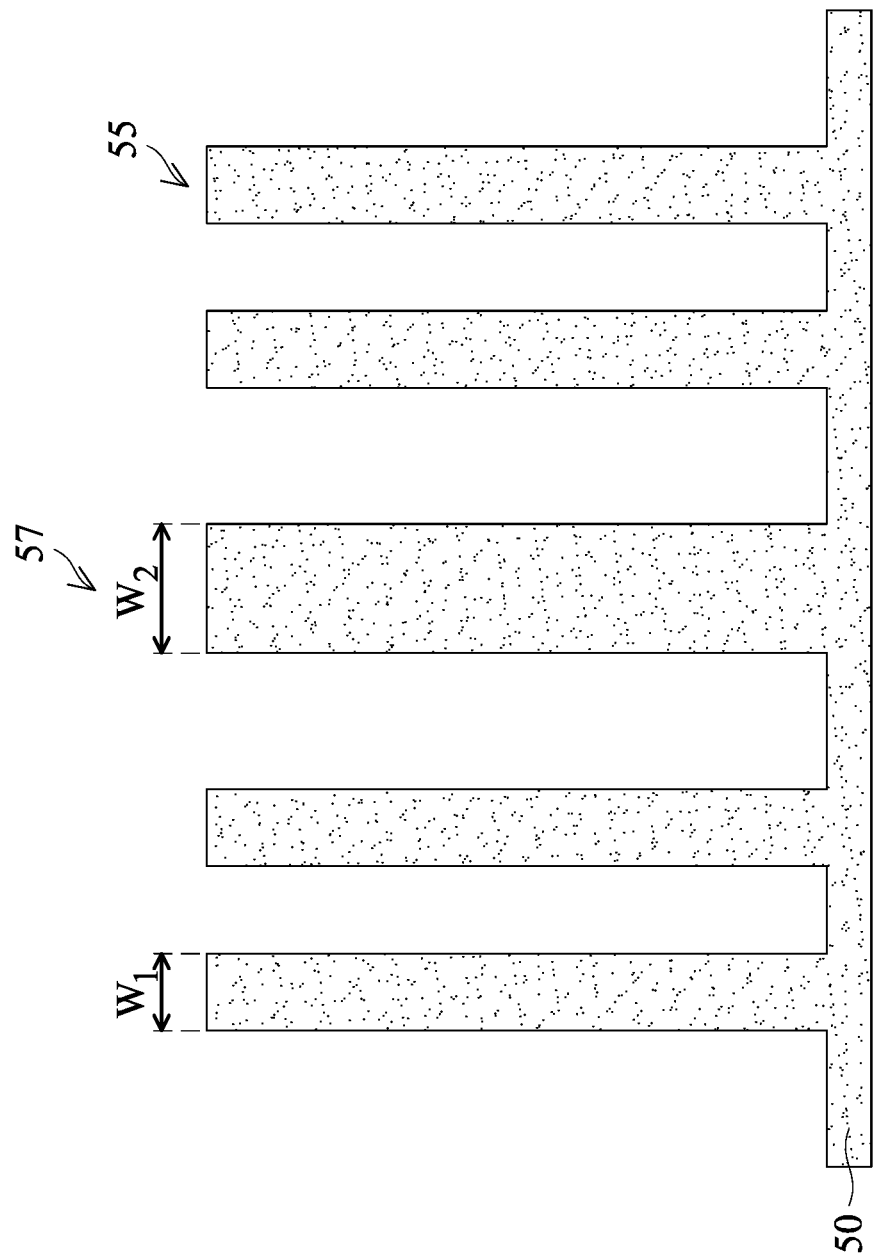

In FIG. 3, fins 55 and a dummy fin 57 are formed in the substrate 50. The fins 55 and the dummy fin 57 are semiconductor strips. In some embodiments, the fins 55 and the dummy fin 57 may be formed in the substrate 50 by etching trenches in the substrate 50. The etching may be any acceptable etch process, such as a reactive ion etch (RIE), a neutral beam etch (NBE), the like, or a combination thereof. The etch may be anisotropic.

The fins 55 and the dummy fin 57 may be patterned by any suitable method. For example, the fins 55 and the dummy fin 57 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 55 and the dummy fin 57. In some embodiments, the mask (or other layer) may remain on the fins 55 and the dummy fin 57. The fins 55 may have widths $W_1$ ranging from about 5 nm to about 15 nm, the dummy fin 57 may have a width $W_2$ ranging from about 10 nm to about 20 nm, and a ratio of the width $W_2$ to the widths $W_1$ may range from about 2 to about 4.

Figure 4:
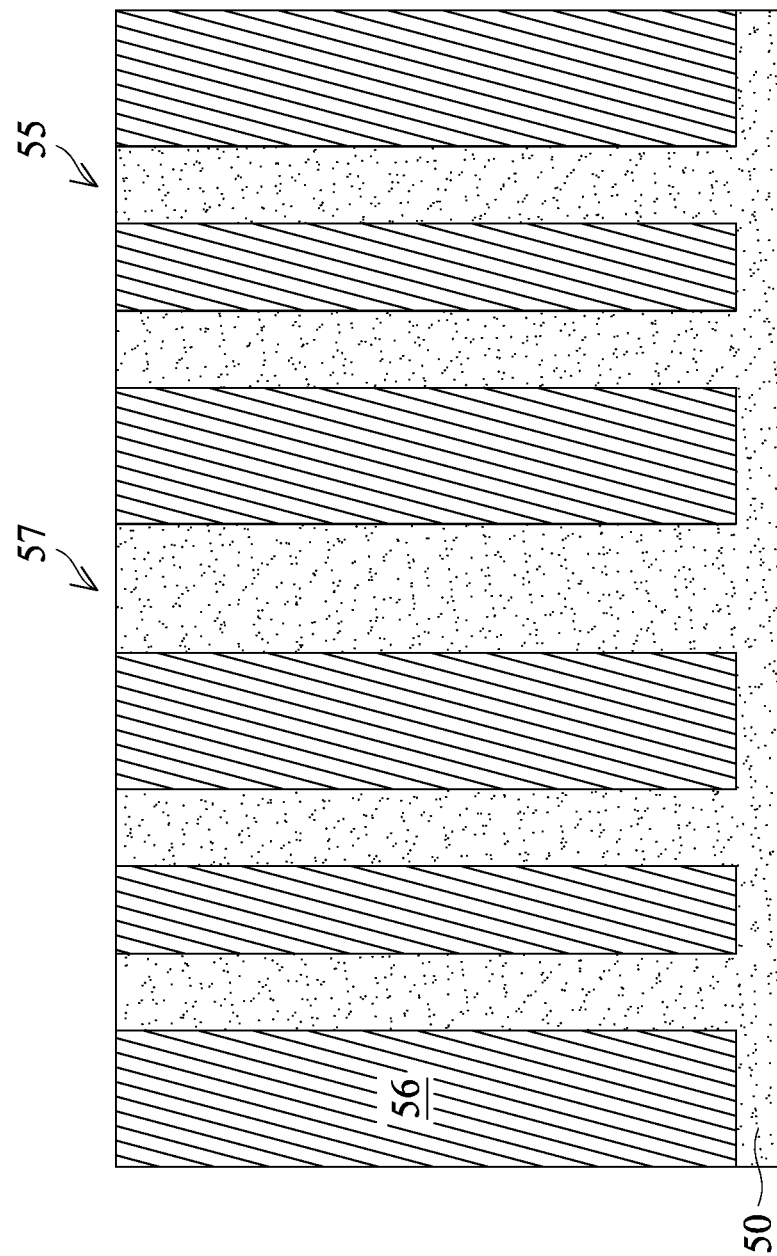

In FIG. 4, an insulation material 56 is formed adjacent the fins 55 and the dummy fin 57. The insulation material 56 may be formed over the substrate 50 and between neighboring ones of the fins 55 and the dummy fin 57. The insulation material 56 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system with post curing to convert the deposited material to another material, such as an oxide), the like, or a combination thereof. Other insulation materials formed by any acceptable process may be used. In the illustrated embodiment, the insulation material 56 is silicon oxide formed by an FCVD process. An anneal process may be performed once the insulation material 56 is formed. In some embodiments, the insulation material 56 is formed such that excess insulation material 56 covers the fins 55 and the dummy fin 57. The insulation material 56 may comprise a single layer or may utilize multiple layers. For example, in some embodiments a liner (not separately illustrated) may first be formed along surfaces of the substrate 50, the fins 55, and the dummy fin 57. Thereafter, a fill material, such as those discussed above may be formed over the liner.

A removal process is then applied to the insulation material 56 to remove excess insulation material over the fins 55 and the dummy fin 57. In some embodiments, a planarization process such as a chemical mechanical polish (CMP), an etch-back process, combinations thereof, or the like may be utilized. The planarization process may planarize the insulation material 56, the fins 55, and the dummy fin 57. The planarization process exposes the fins 55 and the dummy fin 57 such that top surfaces of the fins 55, the dummy fin 57, and the insulation material 56 are level after the planarization process is complete.

Figure 5:
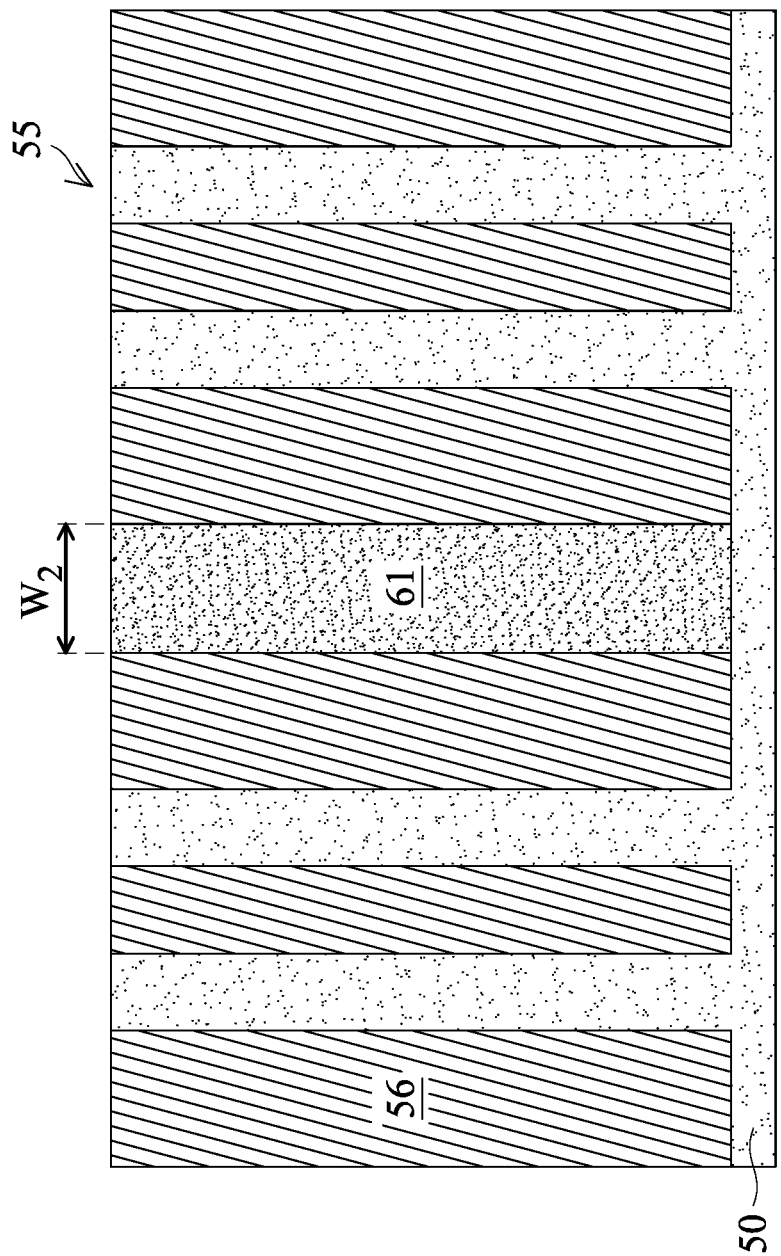

In FIG. 5, the dummy fin 57 is replaced by a dielectric fin 61 (sometimes referred to as a hybrid fin 61 or a fin isolation structure 61). The dielectric fin 61 may be formed by etching the dummy fin 57 to form a recess in the insulation material 56, then filling the recess with a dielectric material. The dielectric fin 61 may be deposited by chemical vapor deposition (CVD), atomic layer deposition (ALD), or the like. The dielectric material may comprise silicon nitride, silicon oxide, combinations or multiple layers thereof, or the like. In some embodiments, the dielectric fin 61 may be formed of doped silicon nitride (e.g., silicon nitride doped with carbon (C), oxygen (O), combinations thereof, or the like). In some embodiments, the dielectric fin 61 may be formed of a dielectric material having a high etch selectivity relative to the materials of the insulation material 56 and to the materials of a subsequently formed dummy gate layer (such as the dummy gate layer 62, discussed below with respect to FIG. 7). The bottom surface of the dielectric fin 61 may be disposed higher than, lower than, or level with bottom surfaces of the insulation material 56. After the dielectric fin 61 is deposited, a removal process, such as a CMP, an etch-back process, or the like, may be performed to planarize the dielectric fin 61, the insulation material 56, and the fins 55. The dielectric fin 61 may have the width $W_2$ ranging from about 10 nm to about 20 nm.

Figure 6:
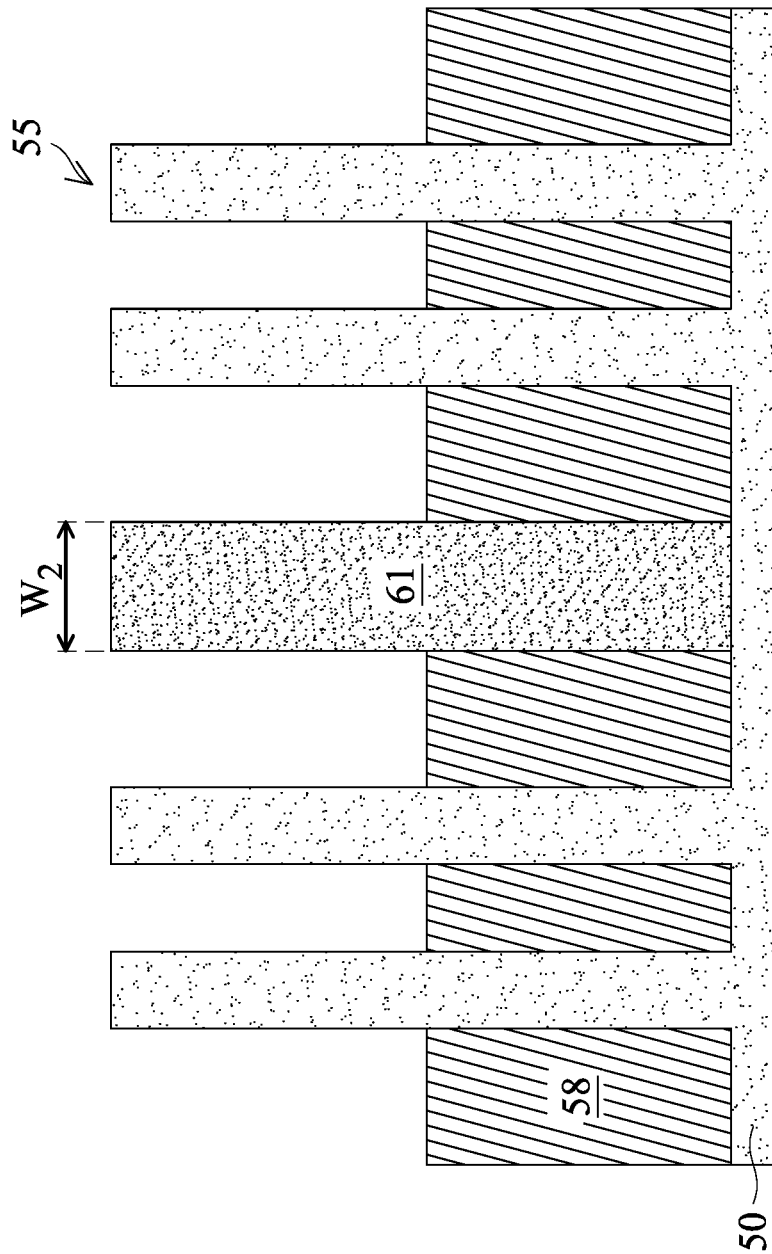

In FIG. 6, the insulation material 56 is recessed to form shallow trench isolation (STI) regions 58. The insulation material 56 is recessed such that upper portions of the fins 55, the dielectric fin 61, and the substrate 50 protrude from between neighboring STI regions 58. Further, the top surfaces of the STI regions 58 may have flat surfaces as illustrated, convex surfaces, concave surfaces (such as dishing), or a combination thereof. The top surfaces of the STI regions 58 may be formed flat, convex, and/or concave by an appropriate etch. The STI regions 58 may be recessed using an acceptable etching process, such as one that is selective to the material of the insulation material 56 (e.g., etches the material of the insulation material 56 at a faster rate than the material of the fins 55, the dielectric fin 61, and the substrate 50). For example, an oxide removal using, for example, dilute hydrofluoric (dHF) acid may be used.

The process described with respect to FIGS. 2-6 is just one example of how the fins 55 and the dielectric fin 61 may be formed. In some embodiments, the fins 55 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form the fins 55. Additionally, in some embodiments, heteroepitaxial structures can be used for the fins 55. For example, the fins 55 in FIG. 6 can be recessed, and a material different from the fins 55 may be epitaxially grown over the recessed fins 55. In such embodiments, the fins 55 comprise the recessed material as well as the epitaxially grown material disposed over the recessed material. In some embodiments, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 55. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in the n-type region different from the material in the p-type region. In some embodiments, upper portions of the fins 55 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not separately illustrated) may be formed in the fins 55 and/or the substrate 50. In some embodiments, a p-type well may be formed in the n-type region, and an n-type well may be formed in the p-type region. In some embodiments, a p-type well or an n-type well are formed in both the n-type region and the p-type region.

In the embodiments with different well types, the different implant steps for the n-type region and the p-type region may be achieved using a photoresist or other masks (not separately illustrated). For example, a photoresist may be formed over the fins 55, the dielectric fin 61, and the STI regions 58 in the n-type region. The photoresist is patterned to expose the p-type region of the substrate 50. The photoresist can be formed by using a spin-on technique and can be patterned using acceptable photolithography techniques. Once the photoresist is patterned, an n-type impurity implant is performed in the p-type region, and the photoresist may act as a mask to prevent n-type impurities from being implanted into the n-type region. The n-type impurities may be phosphorus, arsenic, antimony, or the like implanted in the region to a concentration of equal to or less than $1 \times 10^{18}$ atoms/$cm^3$, such as between about $1 \times 10^{16}$ atoms/$cm^3$ and about $1 \times 10^{18}$ atoms/$cm^3$. After the implant, the photoresist is removed, such as by an acceptable ashing process.

Following the implanting of the p-type region, a photoresist is formed over the fins 55 and the STI regions 58 in the p-type region. The photoresist is patterned to expose the n-type region of the substrate 50. The photoresist can be formed by using a spin-on technique and can be patterned using acceptable photolithography techniques. Once the photoresist is patterned, a p-type impurity implant may be performed in the n-type region, and the photoresist may act as a mask to prevent p-type impurities from being implanted into the p-type region. The p-type impurities may be boron, boron fluoride, indium, or the like implanted in the region to a concentration of equal to or less than $1 \times 10^{18}$ atoms/$cm^3$, such as between about $1\times10^{16}$ atoms/cm$^3$ and about $1\times10^{18}$ atoms/cm$^3$. After the implant, the photoresist may be removed, such as by an acceptable ashing process.

After the implants of the n-type region and the p-type region, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
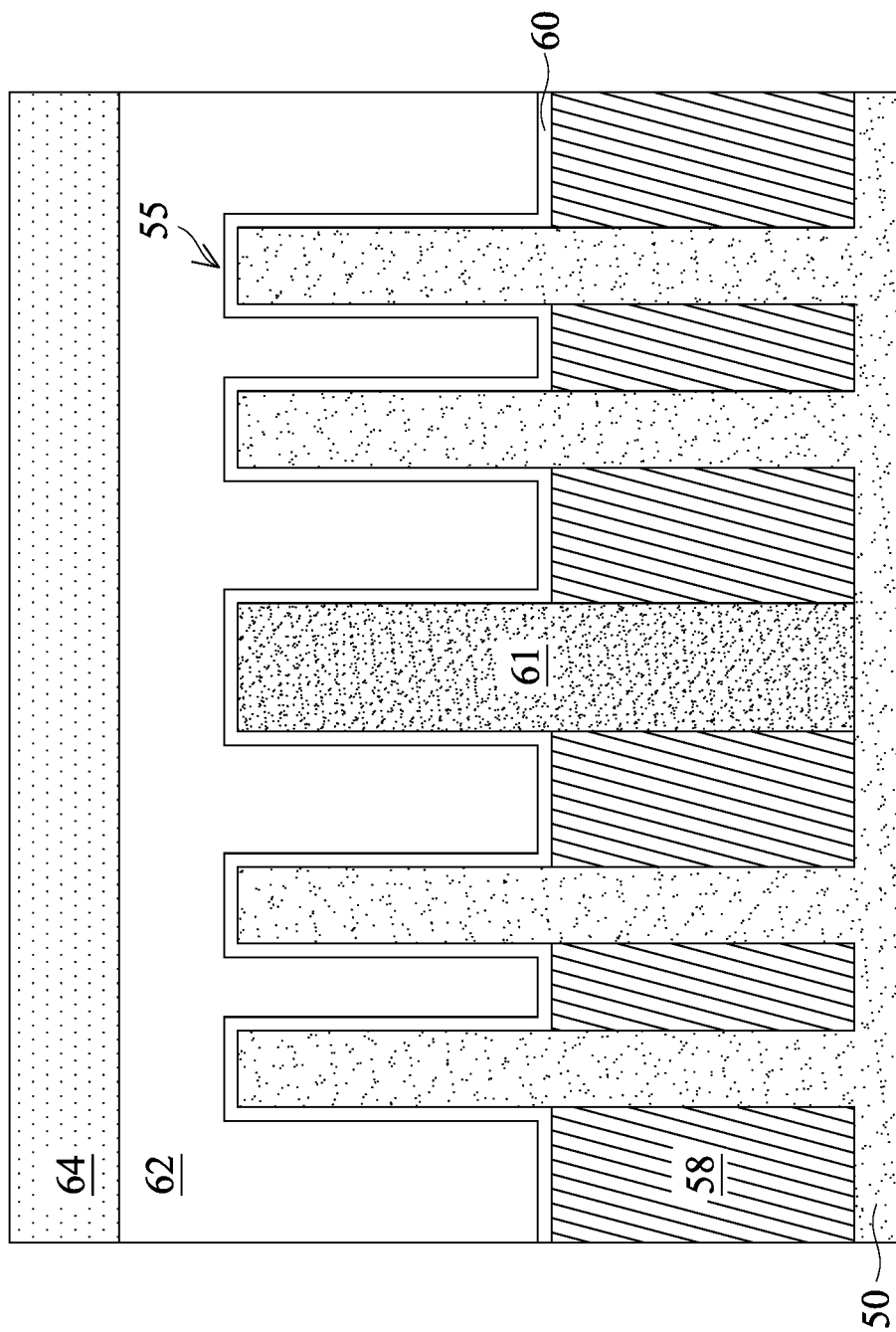

In FIG. 7, dummy dielectric layers 60 are formed on the fins 55, the substrate 50, and the dielectric fin 61. The dummy dielectric layers 60 may be, for example, silicon oxide, silicon nitride, a combination thereof, or the like, and may be deposited or thermally grown according to acceptable techniques. A dummy gate layer 62 is formed over the dummy dielectric layers 60, and a mask layer 64 is formed over the dummy gate layer 62. The dummy gate layer 62 may be deposited over the dummy dielectric layers 60 and then planarized by a process such as CMP. The mask layer 64 may be deposited over the dummy gate layer 62. The dummy gate layer 62 may be conductive or non-conductive materials and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the materials of the STI regions 58 and the dielectric fin 61. The mask layer 64 may include, for example, silicon nitride, silicon oxynitride, or the like. In some embodiments, a single dummy gate layer 62 and a single mask layer 64 are formed across the n-type region and the p-type region. Although the dummy dielectric layers 60 are illustrated in FIG. 7 as being deposited on the fins 55, the substrate 50, the dielectric fin 61, and the STI regions 58, the dummy dielectric layers 60 may cover only the fins 55, the substrate 50, and the dielectric fin 61, without being deposited on the STI regions 58.

FIGS. 8A through 30B illustrate various additional steps in the manufacturing of embodiment devices. FIGS. 8A through 30B illustrate features in either of the n-type region or the p-type region. For example, the structures illustrated in FIGS. 8A through 30B may be applicable to both the n-type region and the p-type region. Differences (if any) in the structures of the n-type region and the p-type region are described in the text accompanying each figure.

Figures 8A, 8B:
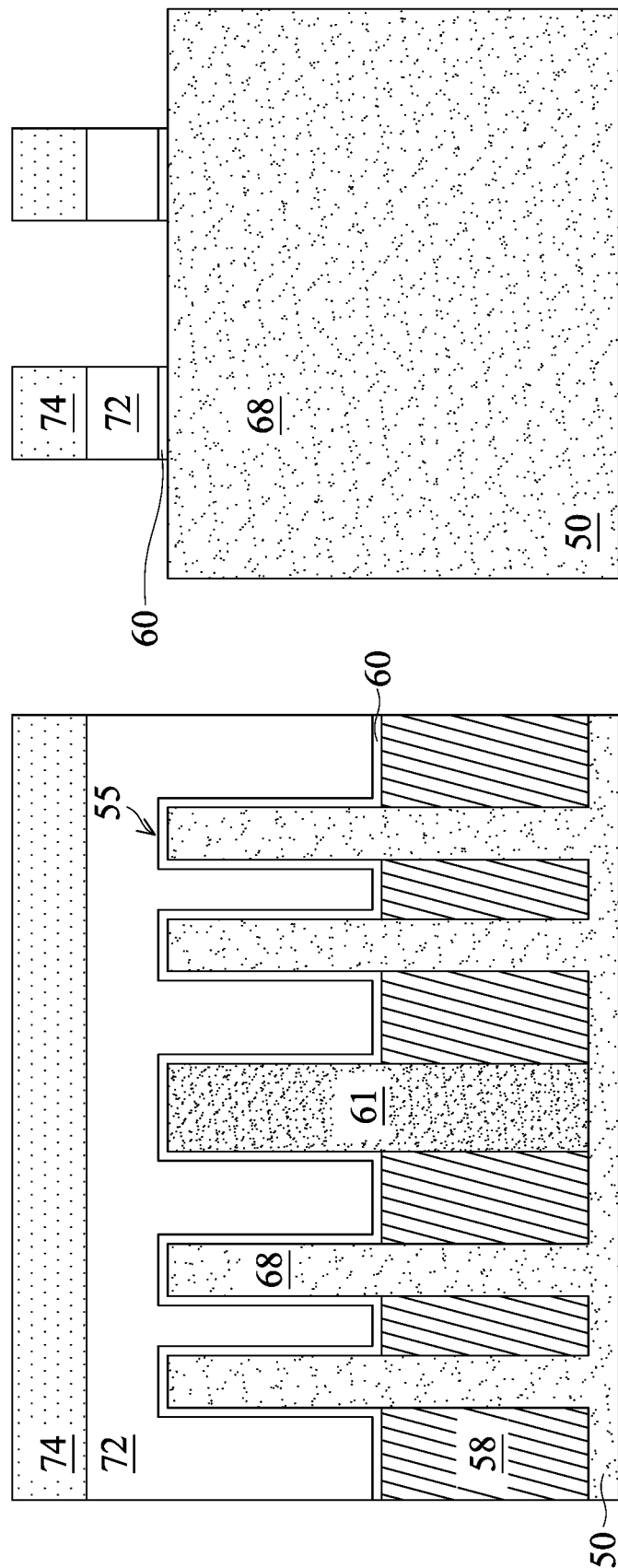
Figure 8C:
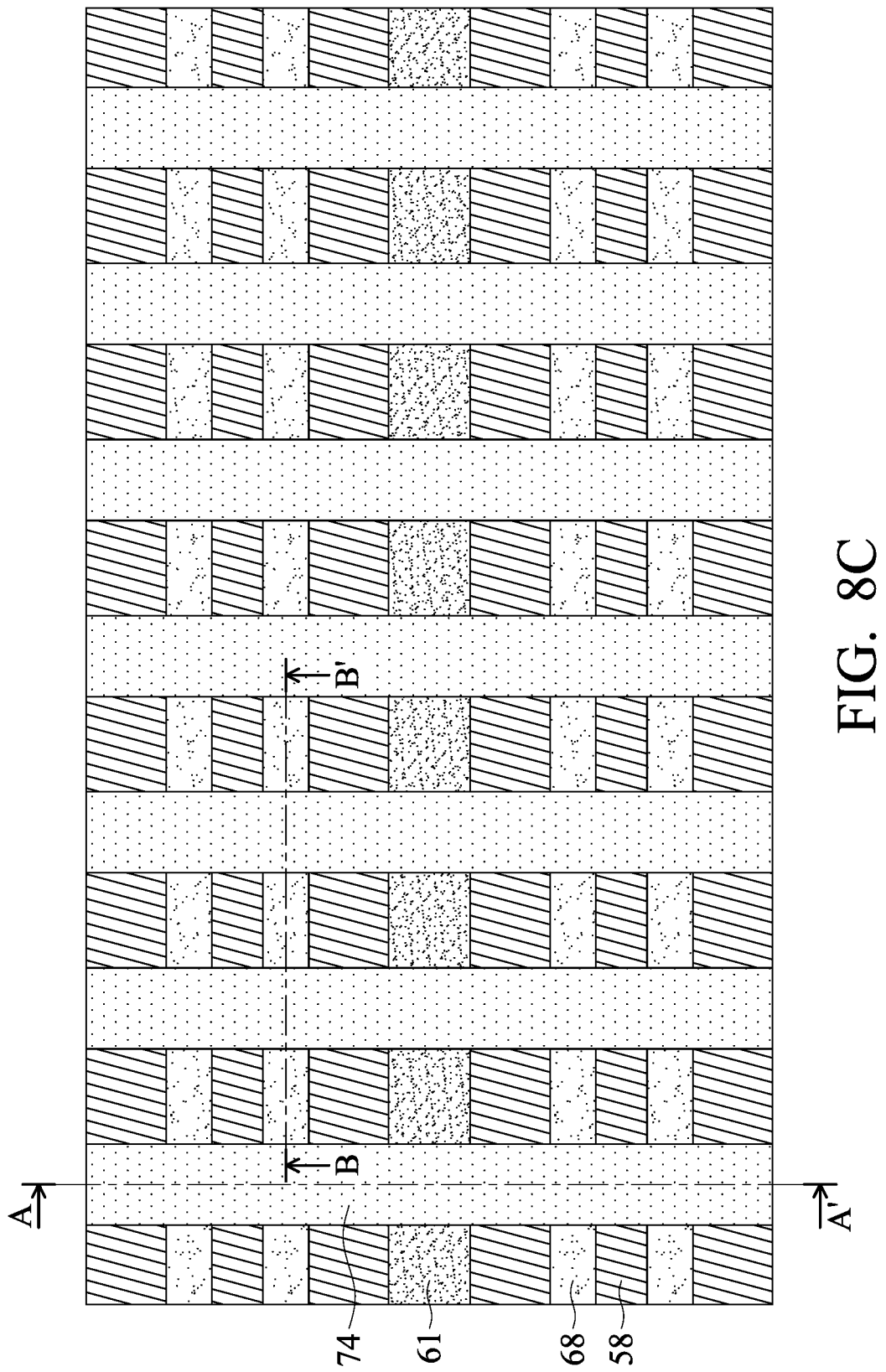

In FIGS. 8A through 8C, the mask layer 64 (see FIG. 7) may be patterned using acceptable photolithography and etching techniques to form masks 74. An acceptable etching technique may be used to transfer the pattern of the masks 74 to the dummy gate layer 62 to form dummy gates 72. In some embodiments, the pattern of the masks 74 may also be transferred to the dummy dielectric layers 60. The dummy gates 72 cover respective channel regions 68 of the fins 55. The pattern of the masks 74 may be used to separate each of the dummy gates 72 from adjacent dummy gates 72. The dummy gates 72 may have lengthwise directions perpendicular to lengthwise directions of the fins 55. The dummy dielectric layers 60, the dummy gates 72, and the masks 74 may be collectively referred to as "dummy gate stacks." FIG. 8C further illustrates the cross-sections A-A' and B-B'.

Figures 9A, 9B:
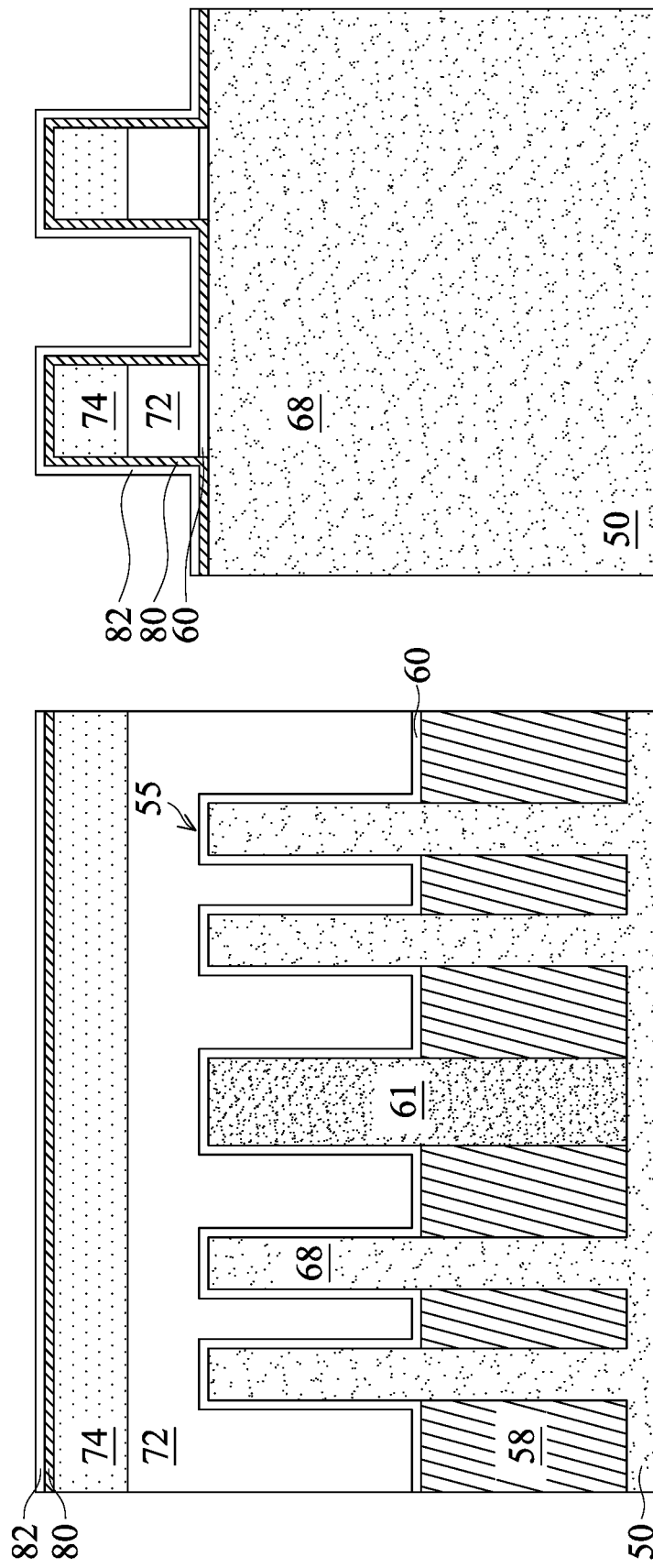
Figure 9C:
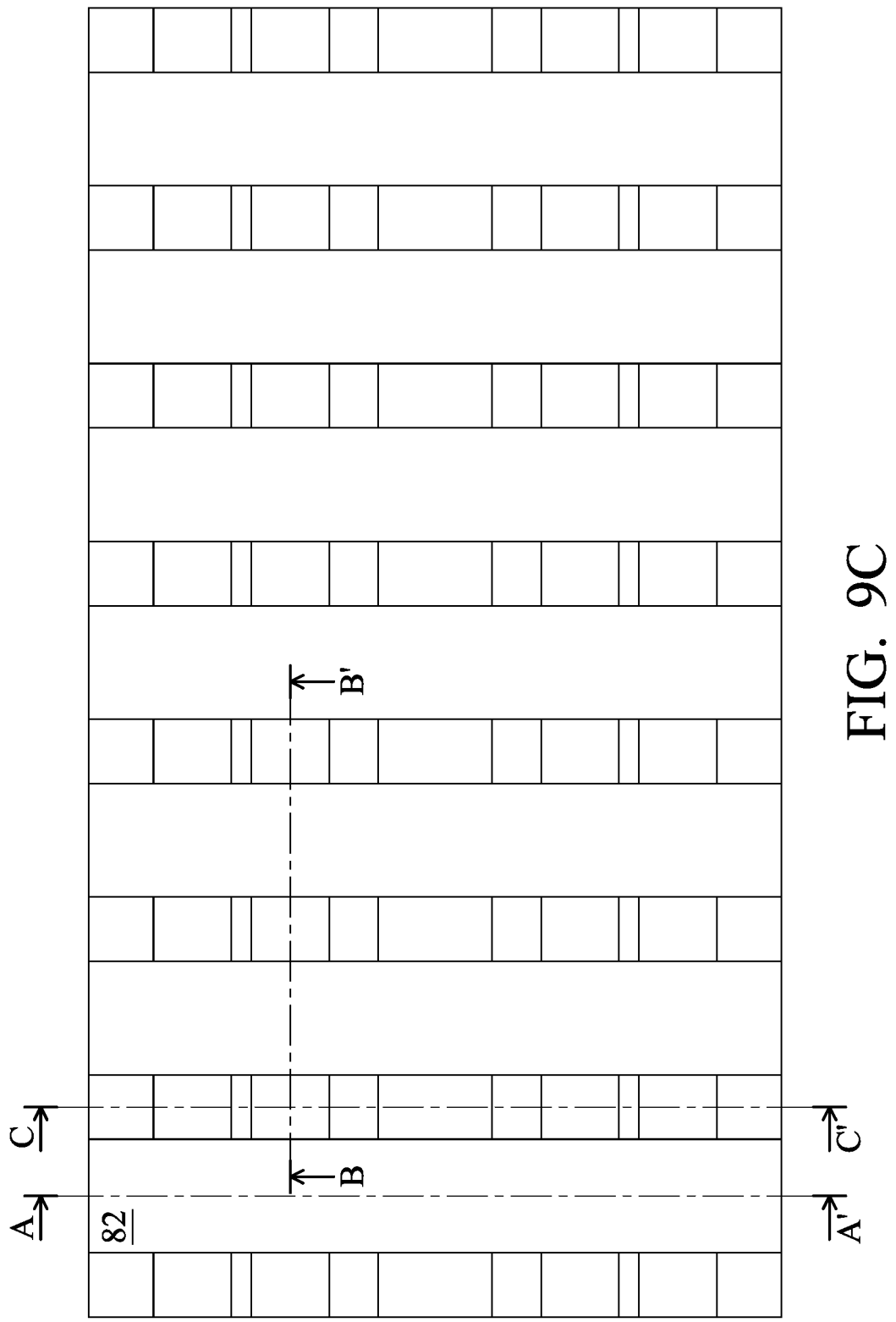
Figure 9D:
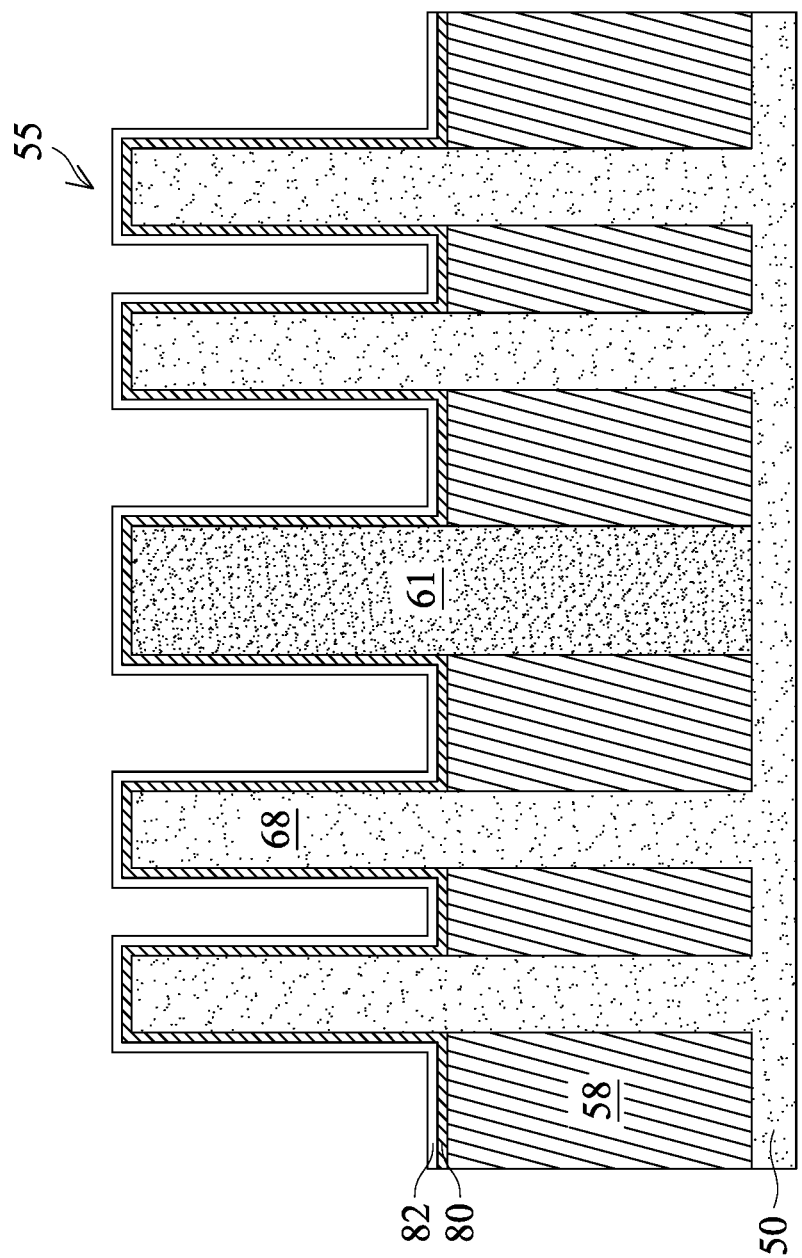

In FIGS. 9A through 9D, a first spacer layer 80 and a second spacer layer 82 are formed over the structures illustrated in FIGS. 8A through 8C. In FIGS. 9A through 9D, the first spacer layer 80 is formed on top surfaces of the STI regions 58, top surfaces and sidewalls of the fins 55 and the masks 74, and sidewalls of the dummy gates 72 and the dummy dielectric layers 60. The second spacer layer 82 is deposited over the first spacer layer 80. The first spacer layer 80 may be formed by thermal oxidation or deposited by CVD, ALD, or the like. The first spacer layer 80 may be formed of silicon oxide, silicon nitride, silicon oxynitride, or the like. The second spacer layer 82 may be deposited by CVD, ALD, or the like. The second spacer layer 82 may be formed of silicon oxide, silicon nitride, silicon oxynitride, or the like. FIG. 9C further illustrates the cross-sections A-A', B-B', and C-C'.

Figures 10A, 10B:
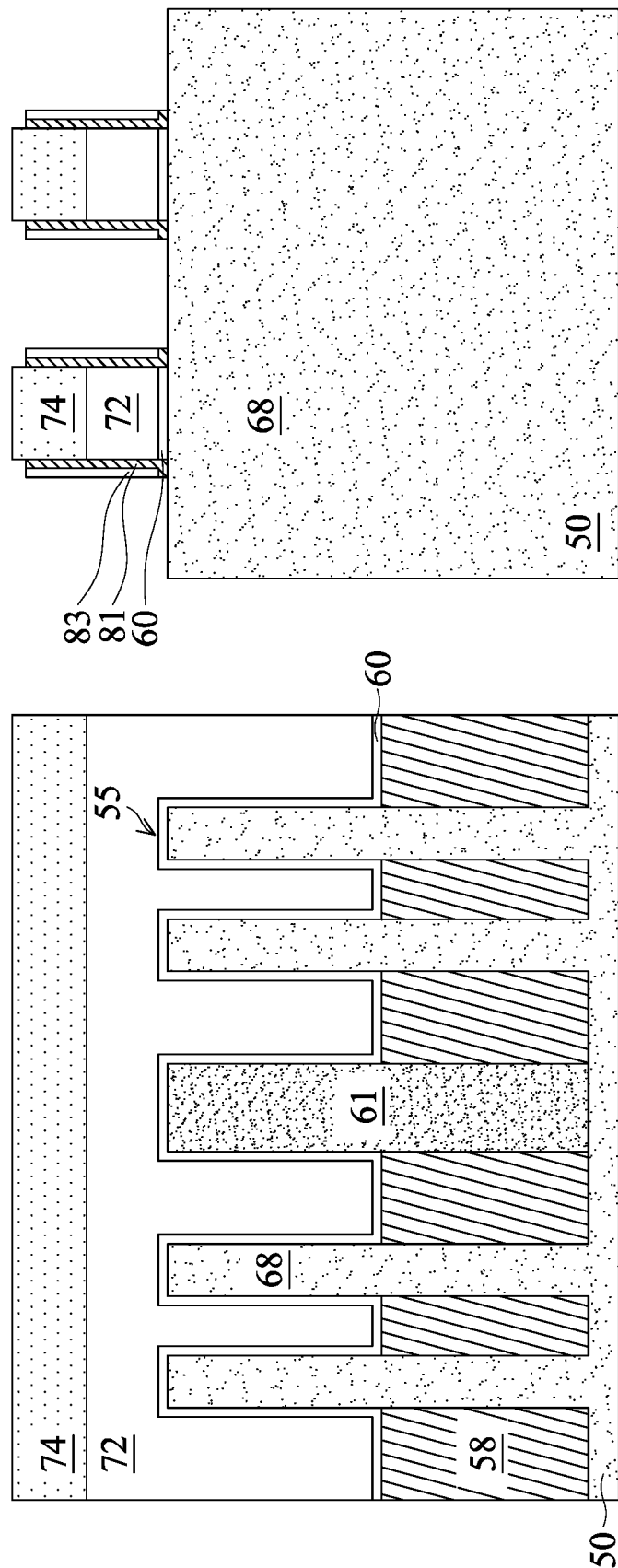
Figure 10C:
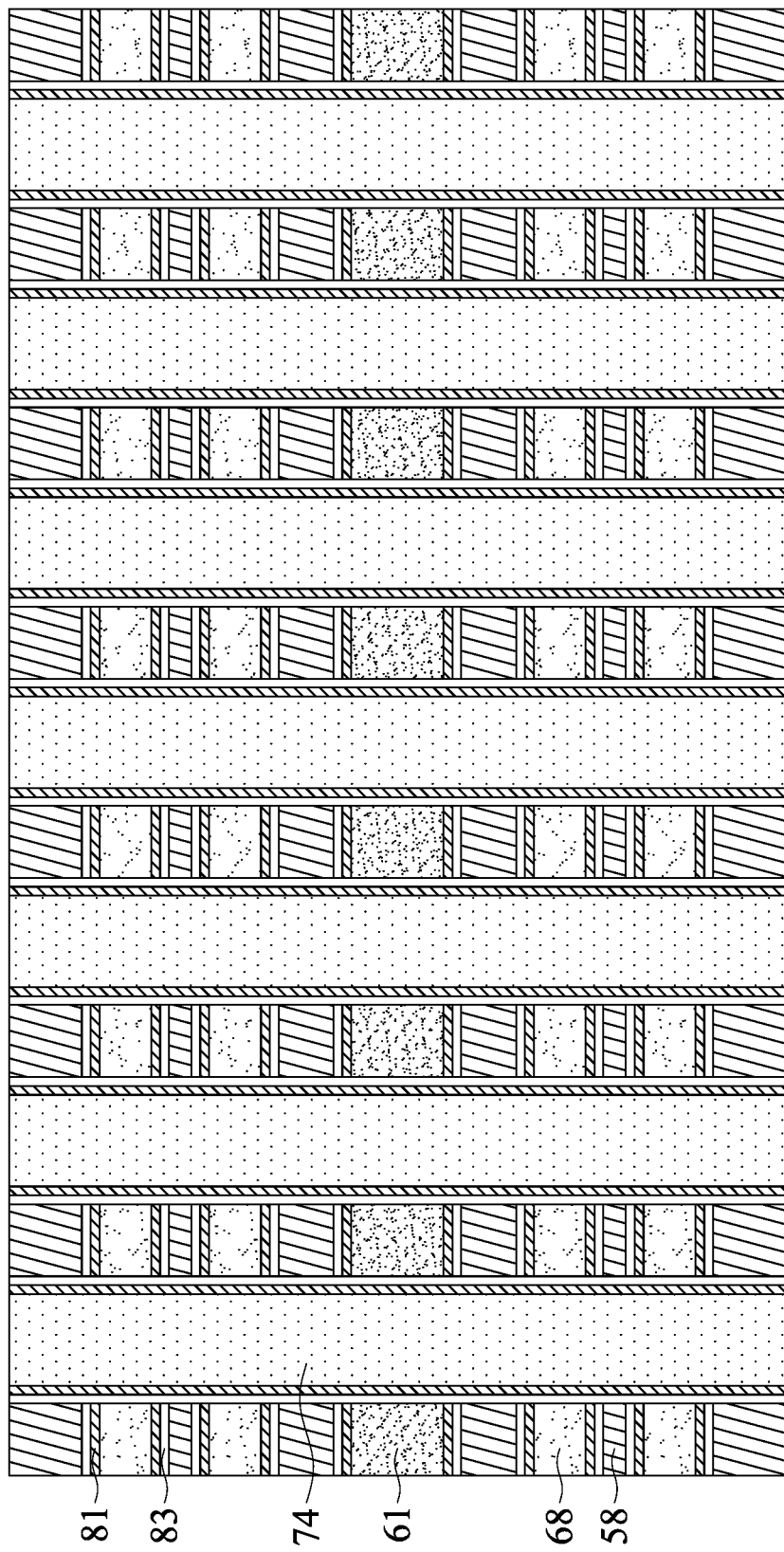
Figure 10D:
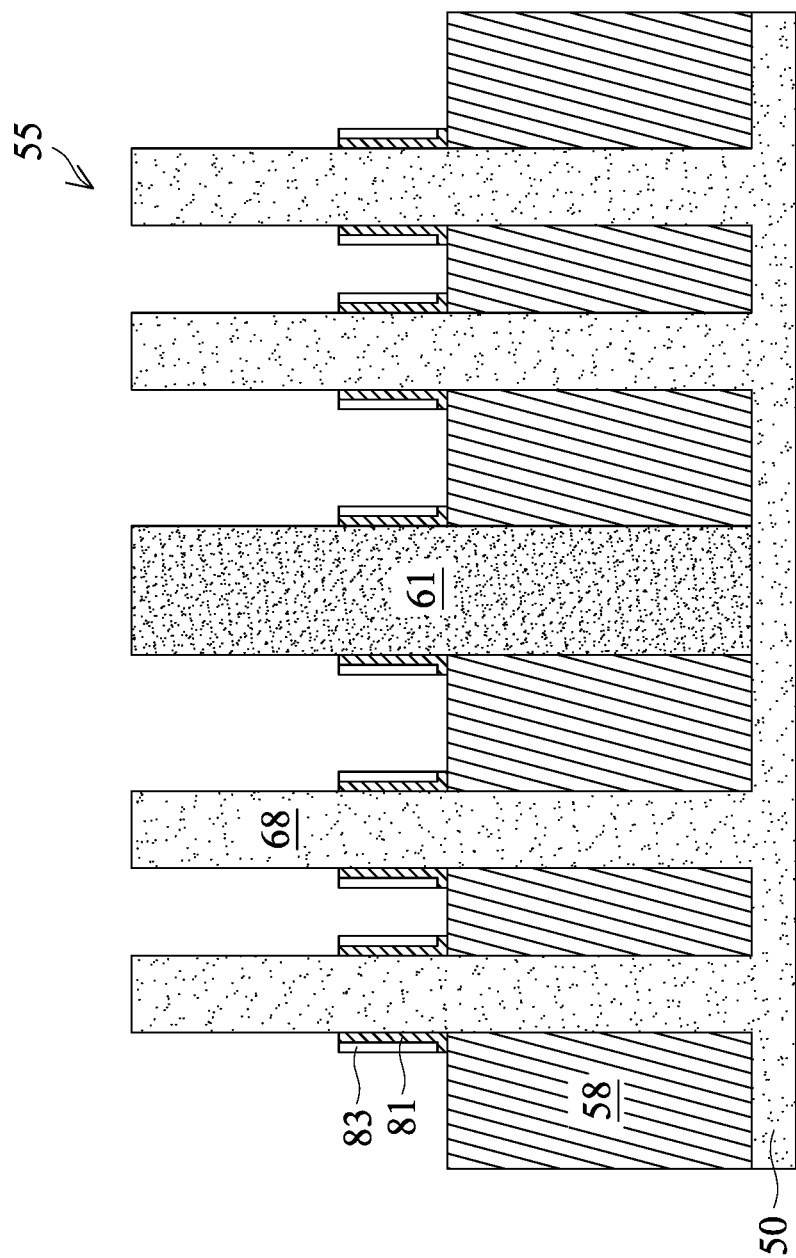

In FIGS. 10A through 10D, the first spacer layer 80 and the second spacer layer 82 are etched to form first spacers 81 and second spacers 83. The first spacer layer 80 and the second spacer layer 82 may be etched using a suitable etching process, such as an anisotropic etching process (e.g., a dry etching process) or the like. The first spacers 81 and the second spacers 83 may be disposed on sidewalls of the fins 55, the dielectric fin 61, the dummy dielectric layers 60, the dummy gates 72, and the masks 74. Heights of the first spacers 81 and the second spacers 83 adjacent the fins 55 and the dielectric fin 61 may be different from heights of the first spacers 81 and the second spacers 83 adjacent the dummy gate stacks. The height differences in the first spacers 81 and the second spacers 83 may be caused by the etching processes used to etch the first spacer layer 80 and the second spacer layer 82 and height differences between the dummy gate stacks and the fins 55/dielectric fin 61. As illustrated in FIGS. 10B and 10D, in some embodiments, the first spacers 81 and the second spacers 83 may extend partially up sidewalls of the fins 55, the dielectric fin 61, and the dummy gate stacks. In some embodiments, the first spacers 81 and the second spacers 83 may extend to top surfaces of the dummy gate stacks, top surfaces of the fins 55, and/or a top surface of the dielectric fin 61.

After the first spacers 81 and the second spacers 83 are formed, implants for lightly doped source/drain (LDD) regions (not separately illustrated) may be performed. In embodiments with different device types, similar to the implants discussed above in FIG. 4, a mask, such as a photoresist, may be formed over the n-type region, while exposing the p-type region, and appropriate type (e.g., p-type) impurities may be implanted into the exposed fins 55 and the substrate 50 in the p-type region. The mask may then be removed. Subsequently, a mask, such as a photoresist, may be formed over the p-type region while exposing the n-type region, and appropriate type impurities (e.g., n-type) may be implanted into the exposed fins 55 and the substrate 50 in the n-type region. The mask may then be removed. The n-type impurities may be the any of the n-type impurities previously discussed, and the p-type impurities may be the any of the p-type impurities previously discussed. The lightly doped source/drain regions may have a concentration of impurities of from about $1\times10^{15}$ atoms/cm$^3$ to about $1\times10^{19}$ atoms/cm$^3$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized (e.g., the first spacers 81 may be formed prior to forming the second spacers 83, additional spacers may be formed and removed, and/or the like).

Furthermore, the n-type and p-type devices may be formed using a different structures and steps.

Figures 11A, 11B:
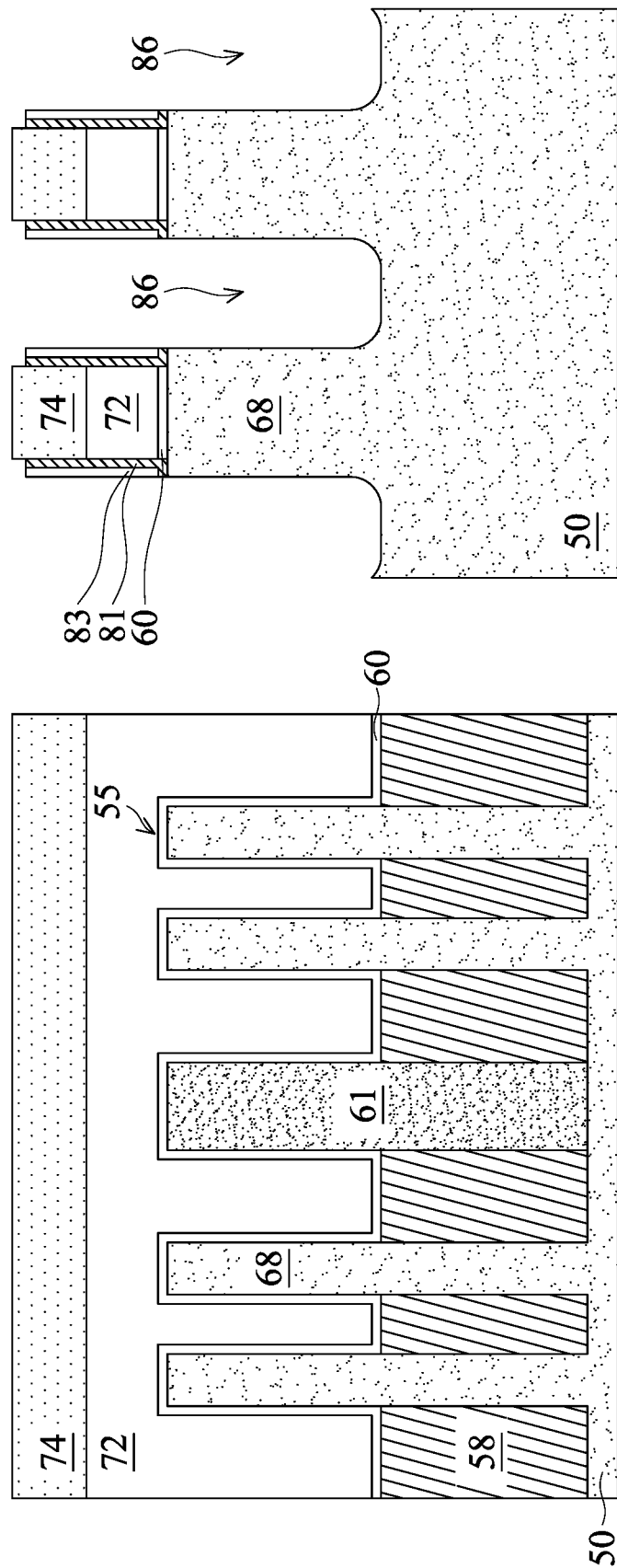
Figure 11C:
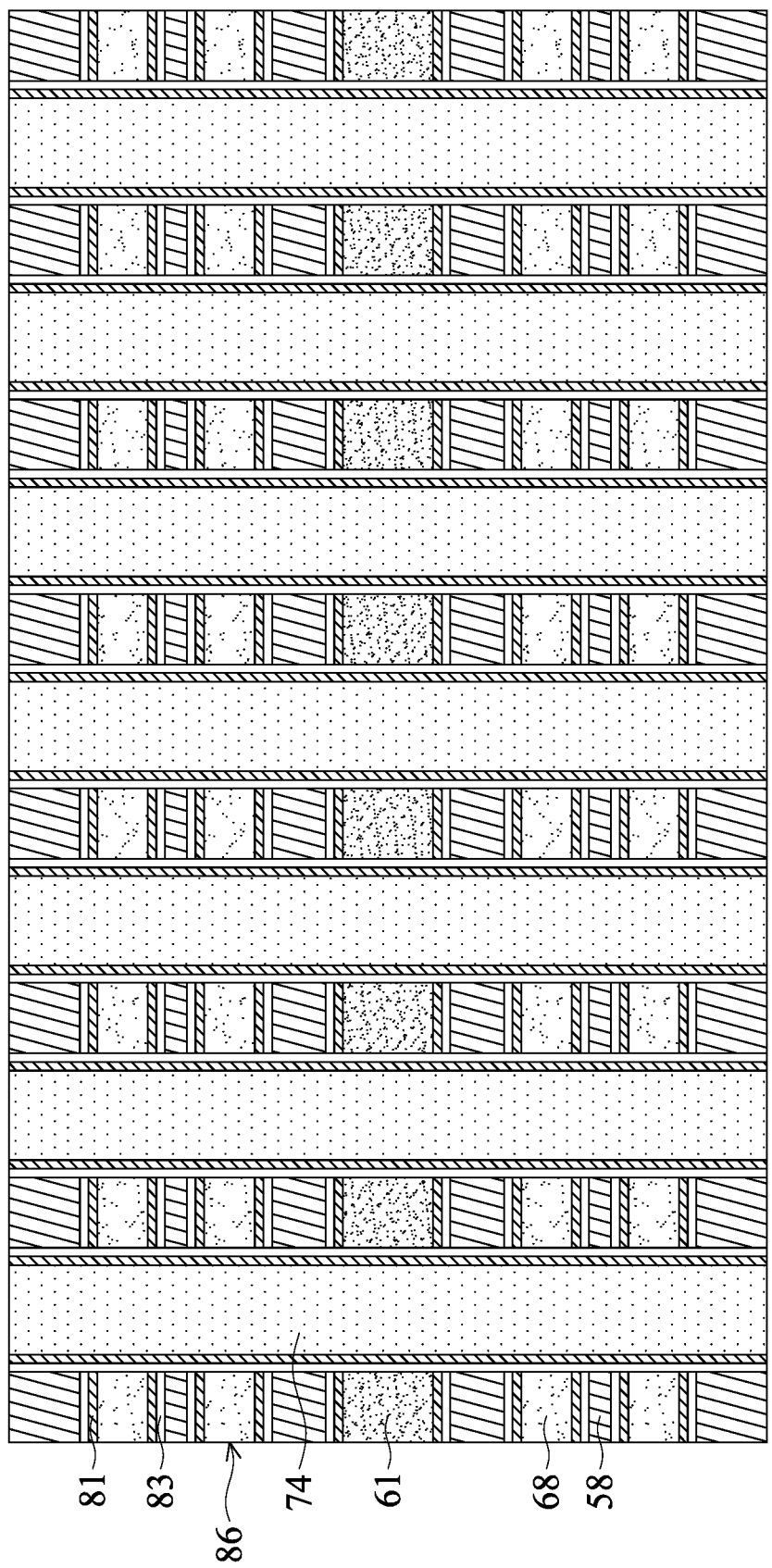
Figure 11D:
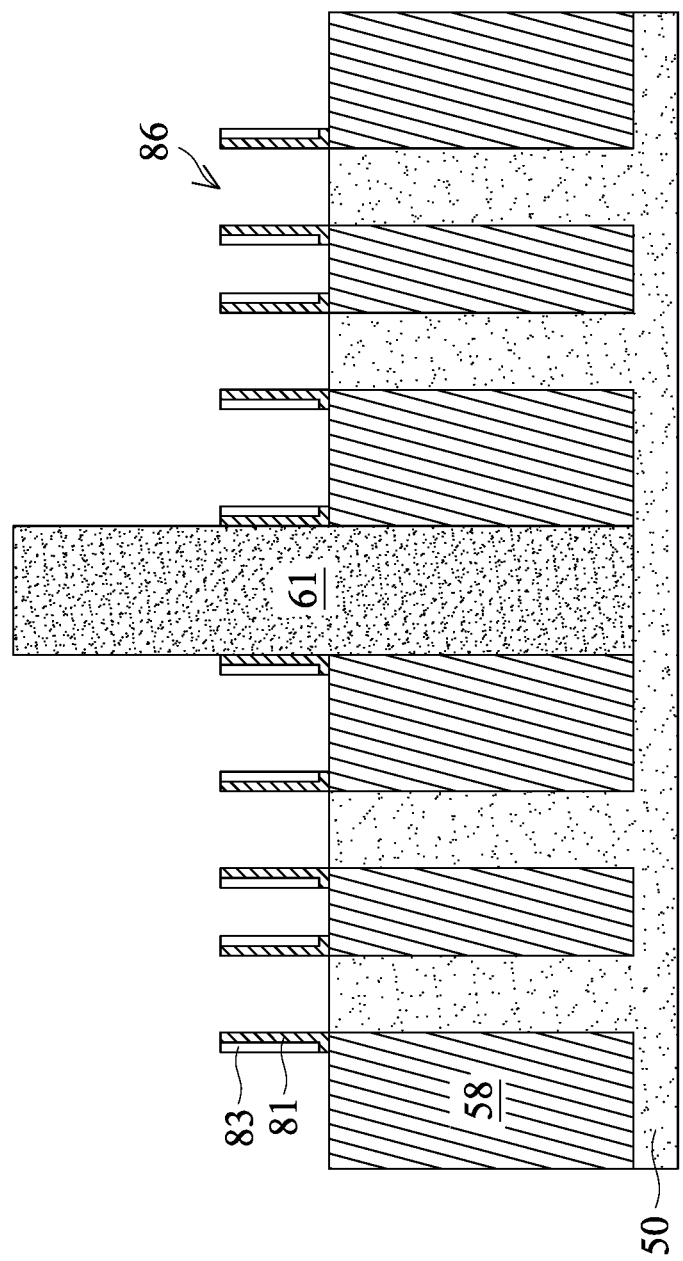

In FIGS. 11A through 11D, the substrate 50 and the fins 55 are etched to form first recesses 86. As illustrated in FIG. 11D, top surfaces of the STI regions 58 may be level with top surfaces of the fins 55. In some embodiments, bottom surfaces of the first recesses 86 are disposed above or below the top surfaces of the STI regions 58. The substrate 50 and the fins 55 are etched using anisotropic etching processes, such as RIE, NBE, or the like. The first spacers 81, the second spacers 83, the masks 74, and the dielectric fin 61 mask portions of the substrate 50 and the fins 55 during the etching processes used to form the first recesses 86. A single etch process or multiple etch processes may be used to form the first recesses 86. Timed etch processes may be used to stop the etching of the first recesses 86 after the first recesses 86 reach a desired depth.

Figure 12B:
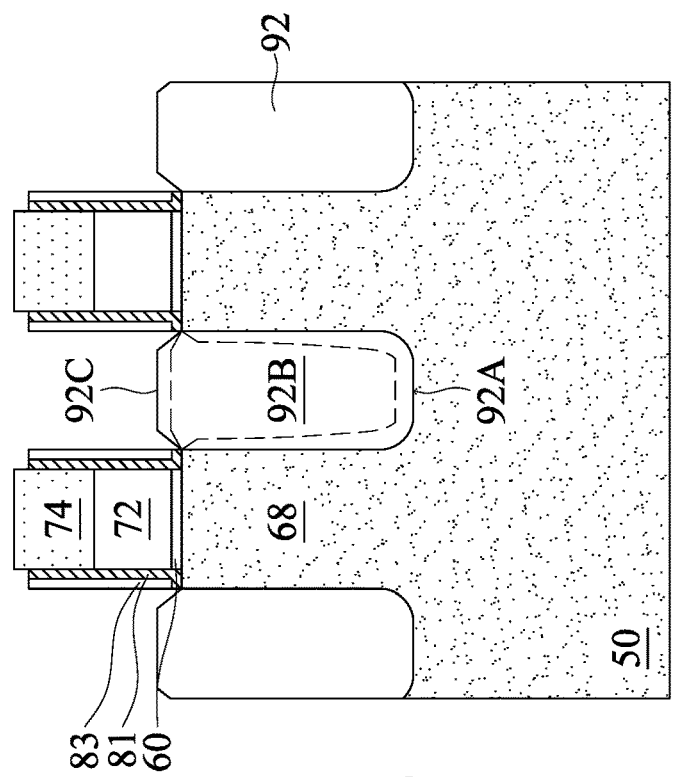

In FIGS. 12A through 12E, epitaxial source/drain regions 92 are formed in the first recesses 86 to exert stress on the channel regions 68 of the fins 55, thereby improving performance. As illustrated in FIG. 12B, the epitaxial source/drain regions 92 are formed in the first recesses 86 such that each dummy gate 72 is disposed between respective neighboring pairs of the epitaxial source/drain regions 92. In some embodiments, the first spacers 81 are used to separate the epitaxial source/drain regions 92 from the dummy gates 72 by an appropriate lateral distance so that the epitaxial source/drain regions 92 do not short out subsequently formed gates of the resulting FinFETs.

The epitaxial source/drain regions 92 in the n-type region may be formed by masking the p-type region. Then, the epitaxial source/drain regions 92 are epitaxially grown in the first recesses 86. The epitaxial source/drain regions 92 may include any acceptable material, such as appropriate for n-type FinFETs. For example, if the fins 55 are silicon, the epitaxial source/drain regions 92 may include materials exerting a tensile strain on the fins 55, such as silicon, silicon carbide, phosphorous-doped silicon carbide, silicon phosphide, or the like. The epitaxial source/drain regions 92 may have surfaces raised from respective surfaces of the fins 55 and may have facets.

The epitaxial source/drain regions 92 in the p-type region may be formed by masking the n-type region. Then, the epitaxial source/drain regions 92 are epitaxially grown in the first recesses 86. The epitaxial source/drain regions 92 may include any acceptable material, such as appropriate for p-type finFETs. For example, if the fins 55 are silicon, the epitaxial source/drain regions 92 may comprise materials exerting a compressive strain on the fins 55, such as silicon-germanium, boron doped silicon-germanium, germanium, germanium tin, or the like. The epitaxial source/drain regions 92 may also have surfaces raised from respective surfaces of the fins 55 and may have facets.

The epitaxial source/drain regions 92, the fins 55, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region and the p-type region, upper surfaces of the epitaxial source/drain regions 92 have facets which expand laterally outward beyond sidewalls of the fins 55. In some embodiments, these facets cause adjacent epitaxial source/drain regions 92 of a same finFET to merge as illustrated by FIG. 12D. In some embodiments, adjacent epitaxial source/drain regions 92 remain separated after the epitaxy process is completed as illustrated by FIG. 12E. In the embodiments illustrated in FIGS. 12D and 12E, the first spacers 81 and the second spacers may be formed covering portions of the sidewalls of the fins 55 that extend above the STI regions 58 thereby blocking the epitaxial growth. In some embodiments, the spacer etch used to form the first spacers 81 and the second spacers 83 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and/or may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12A:
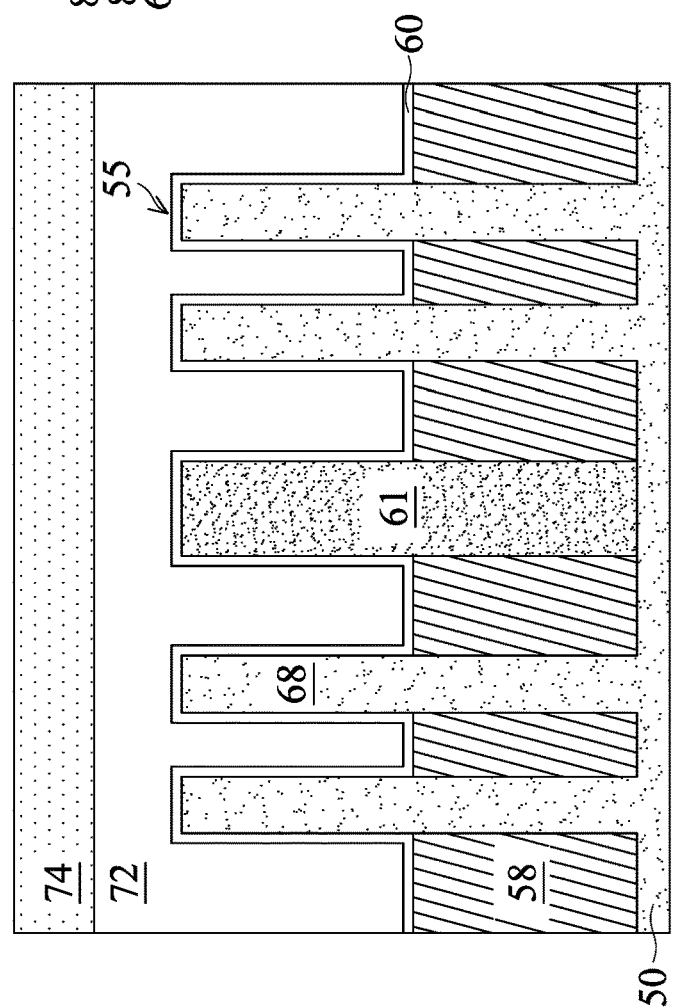
Figure 12C:
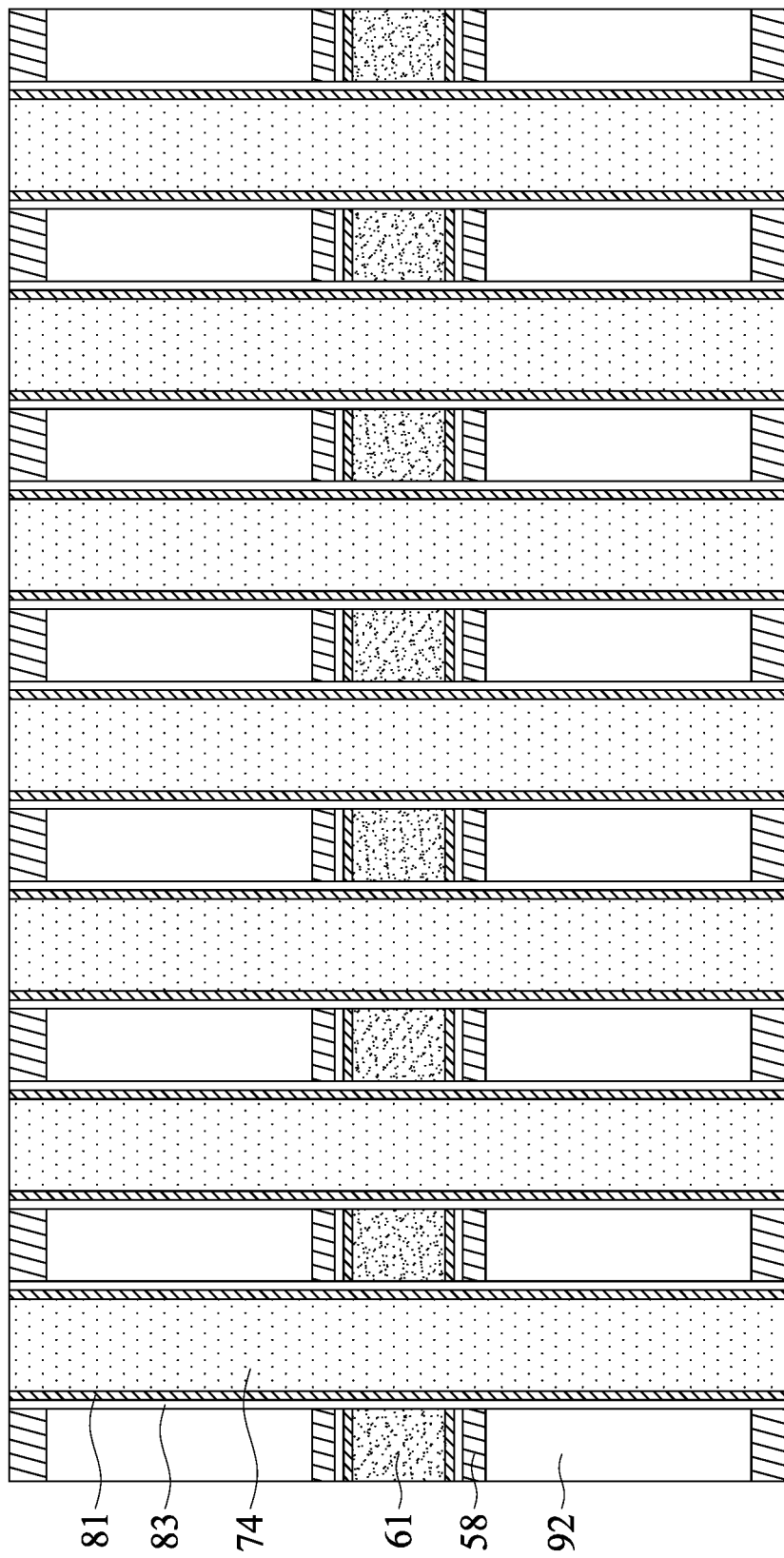
Figure 12D:
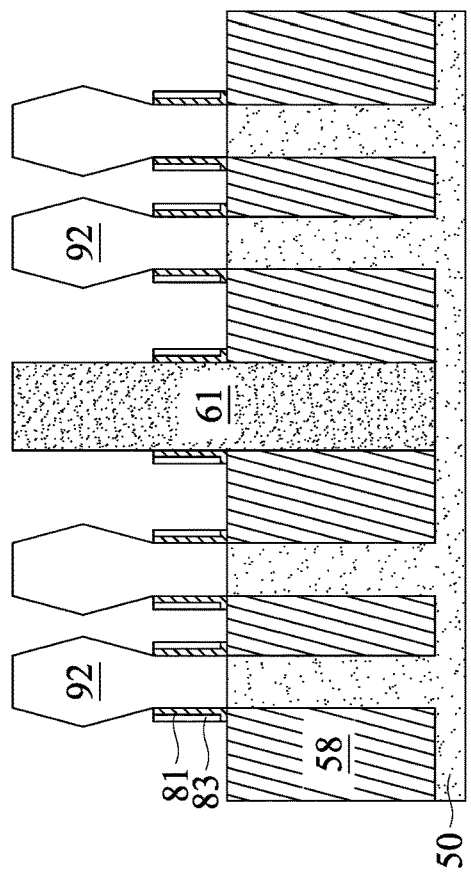
Figure 12E:
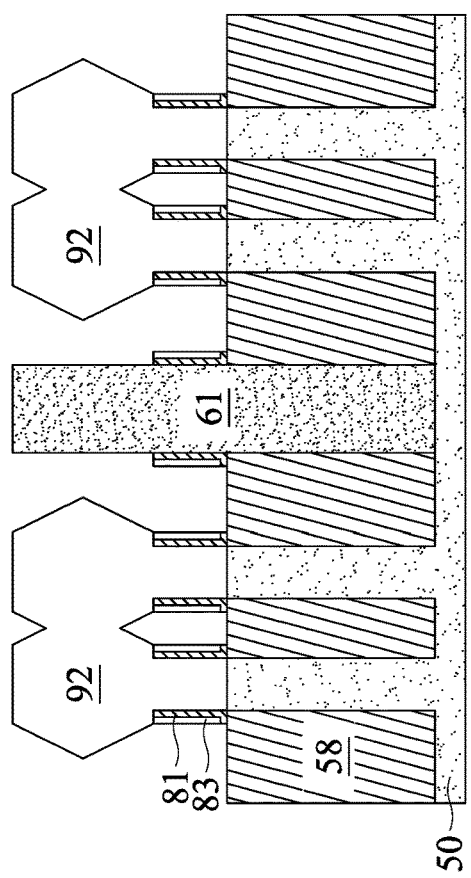
Figure 13B:
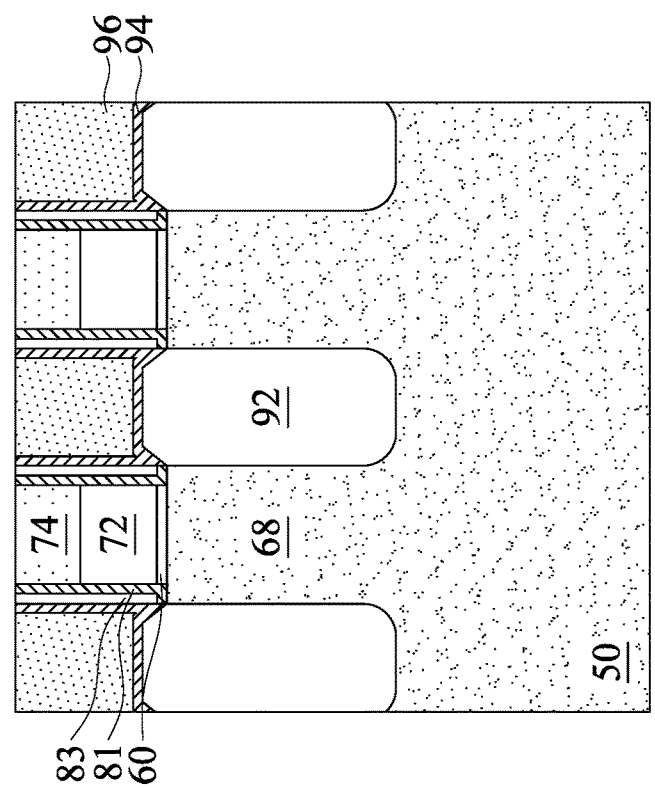
Figure 13A:
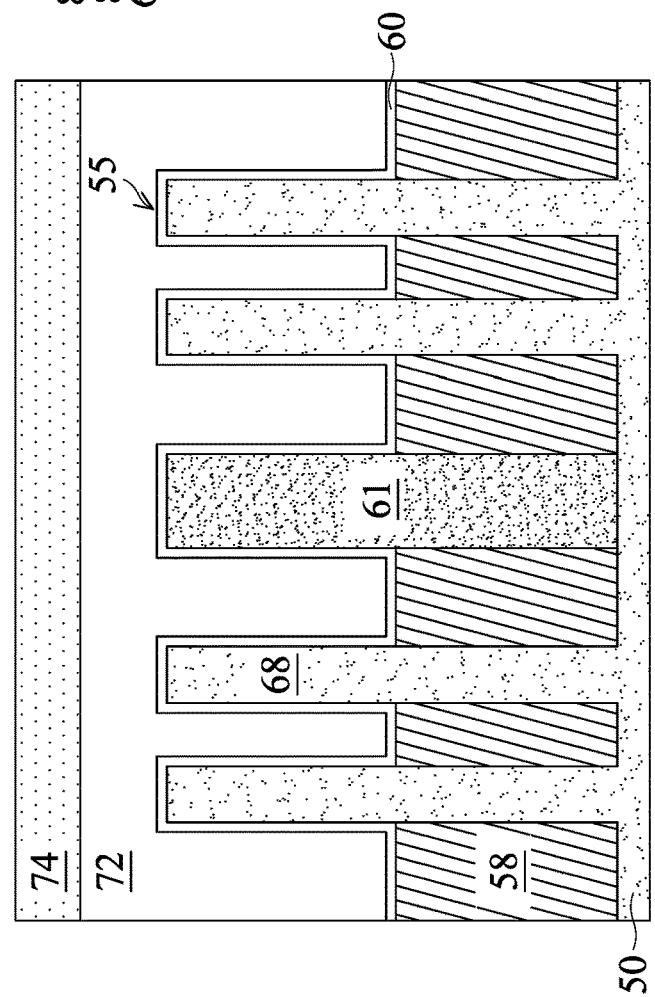
Figure 13C:
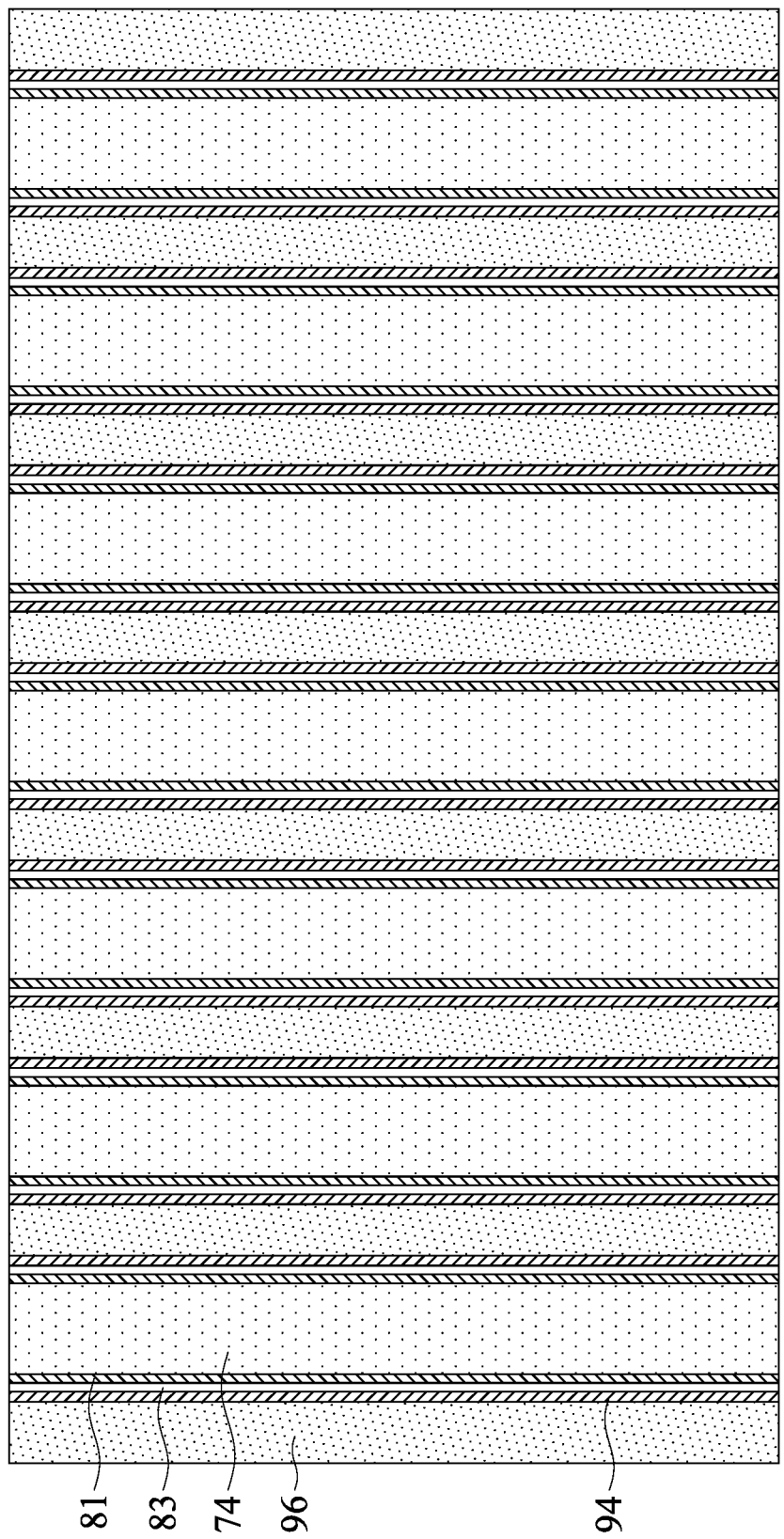

In FIGS. 13A through 13C, a first interlayer dielectric (ILD) 96 is deposited over the structures illustrated in FIGS. 12A through 12C, respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. In some embodiments, the dielectric materials for the first ILD 96 may include silicon oxide, silicon nitride, silicon oxynitride, or the like. Other insulation materials formed by any acceptable process may be used. In some embodiments, a contact etch stop layer (CESL) 94 is disposed between the first ILD 96 and the epitaxial source/drain regions 92, the masks 74, and the first spacers 81. The CESL 94 may comprise a dielectric material, such as, silicon nitride, silicon oxide, silicon oxynitride, or the like, having a different etch rate than the material of the overlying first ILD 96. In some embodiments, the first ILD 96 may be formed of silicon oxide or silicon nitride and the CESL 94 may be formed of silicon oxide or silicon nitride.

Figures 14A, 14B:
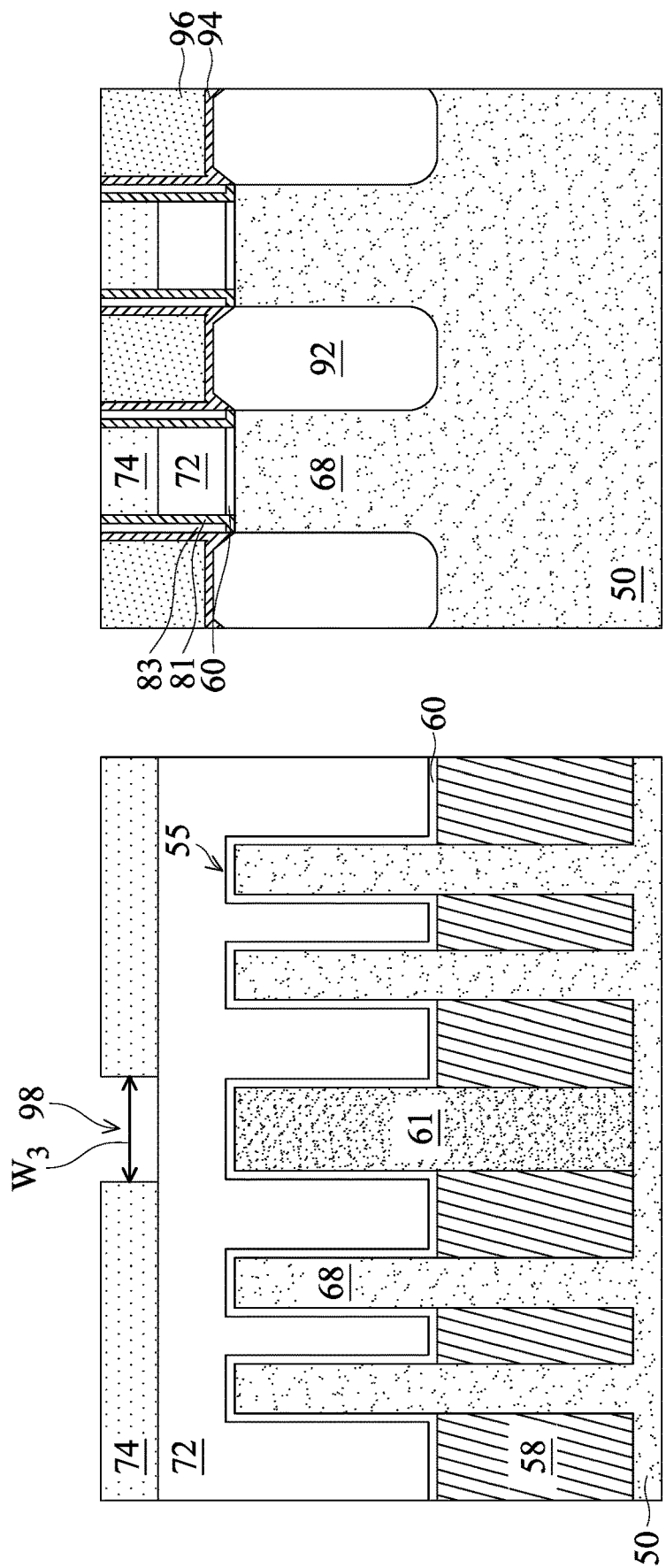
Figure 14C:
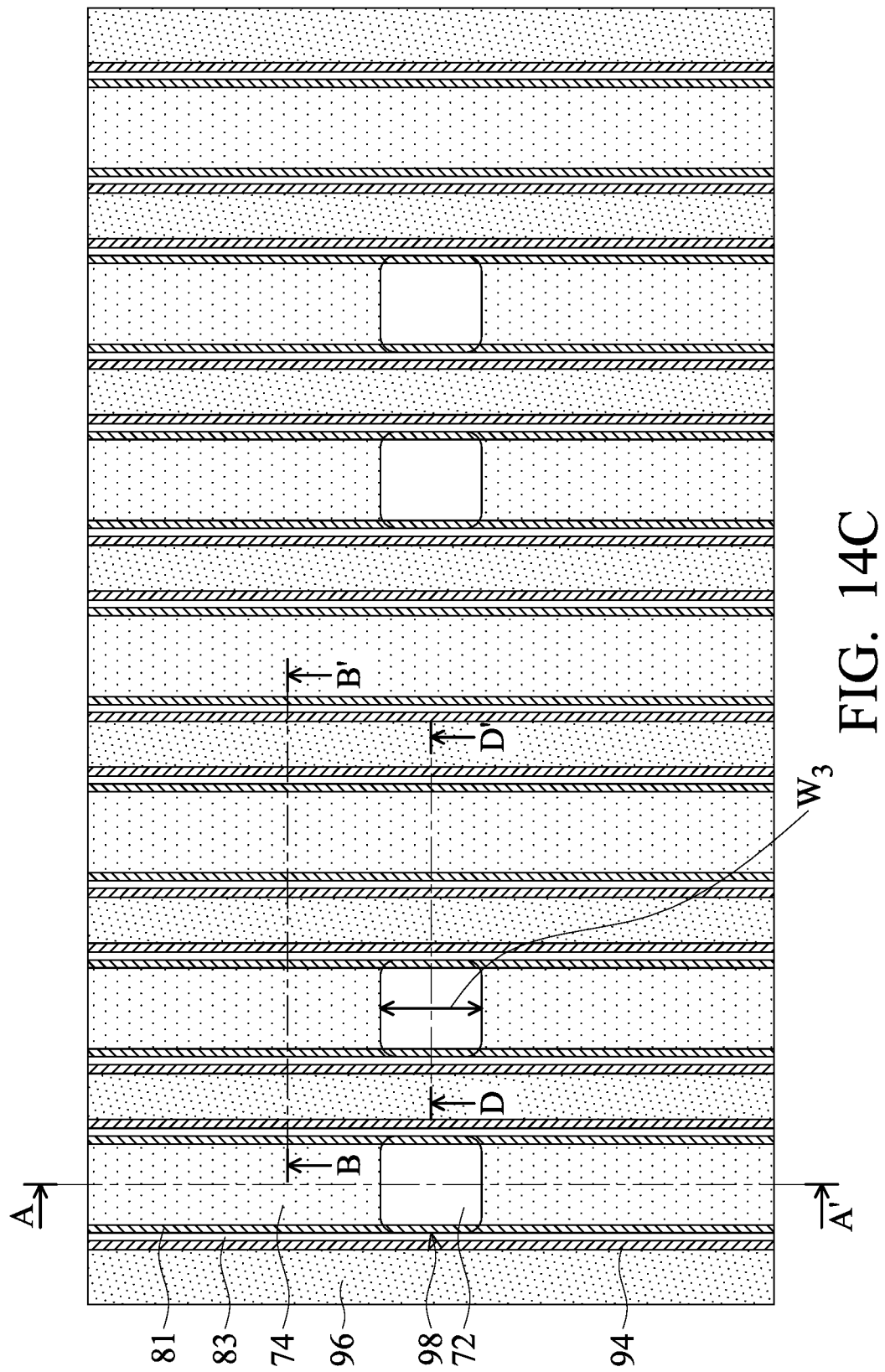
Figure 14D:
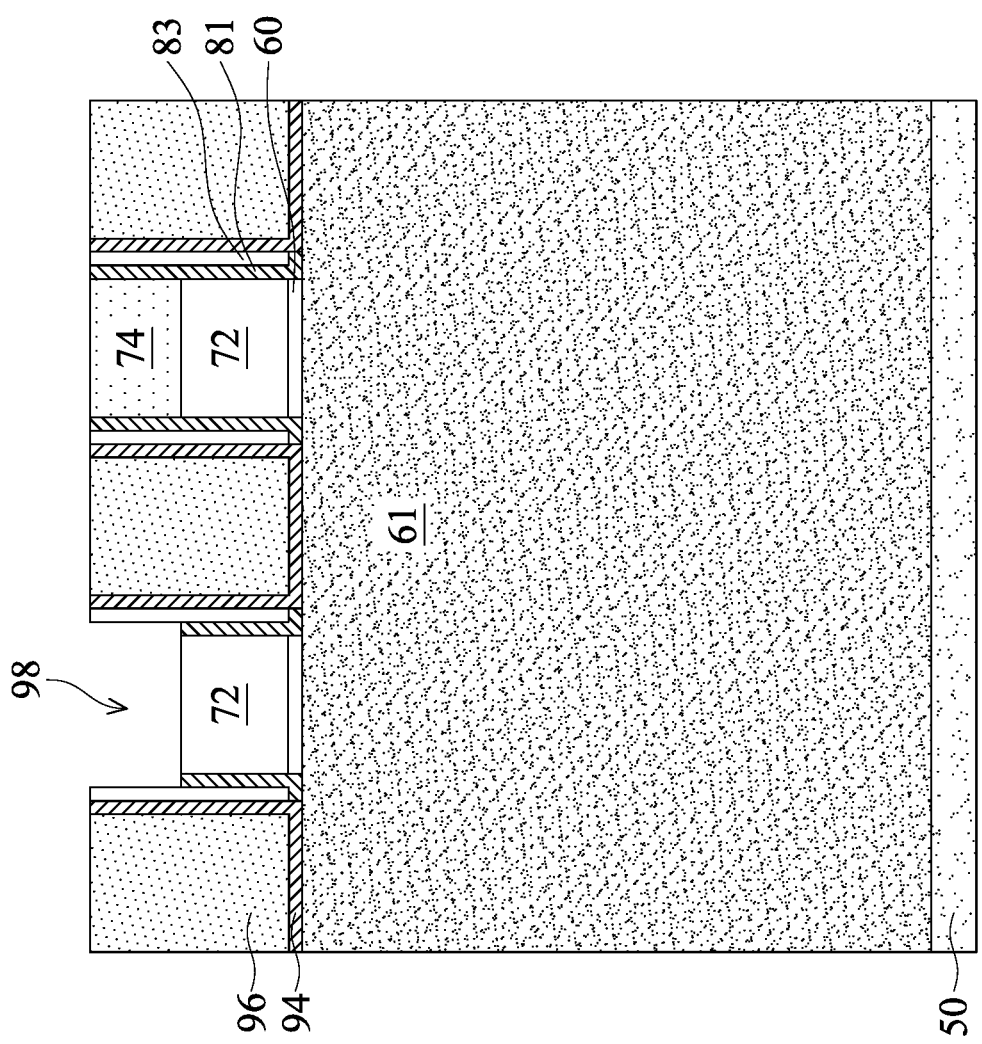
Figure 15C:
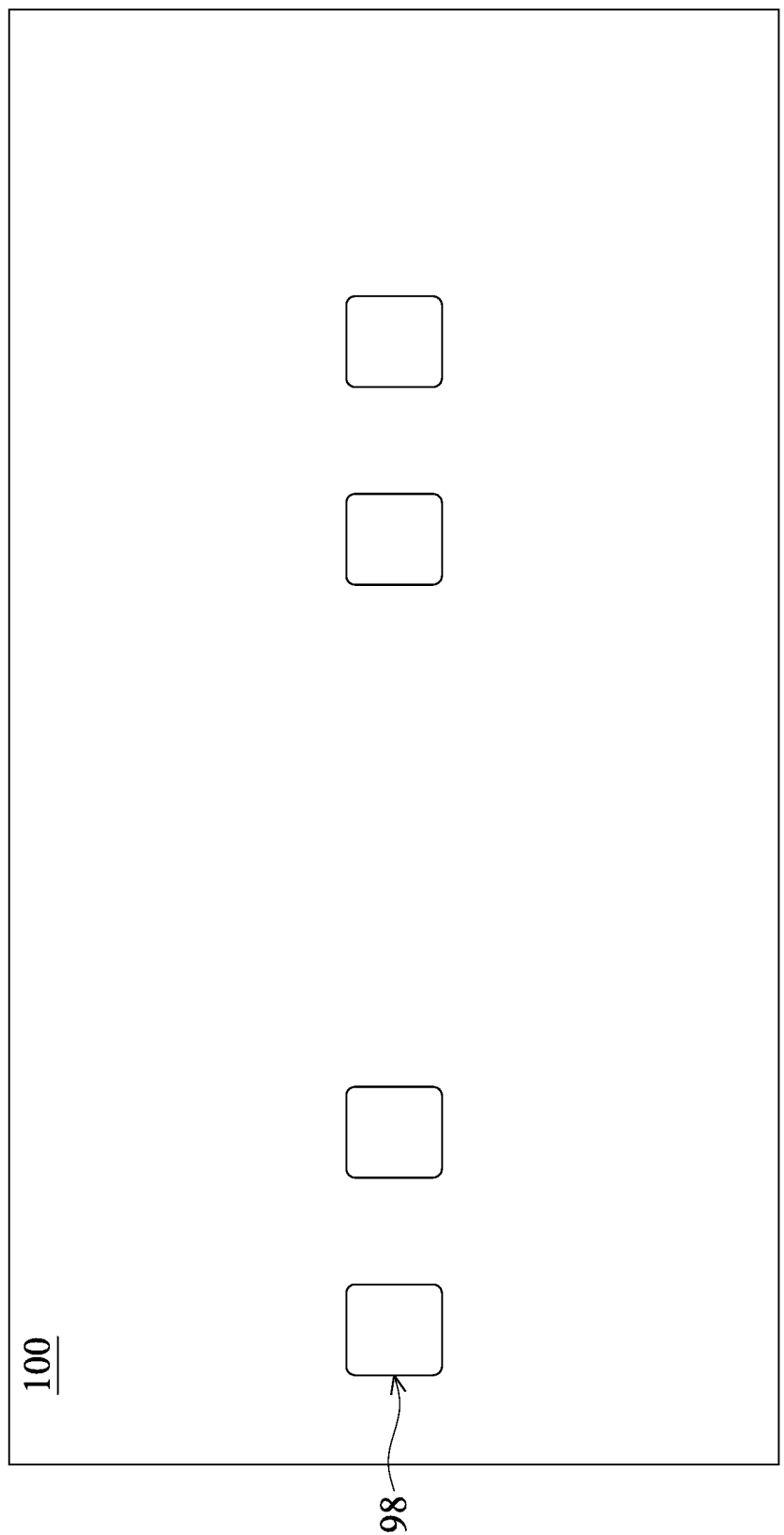
Figure 15D:
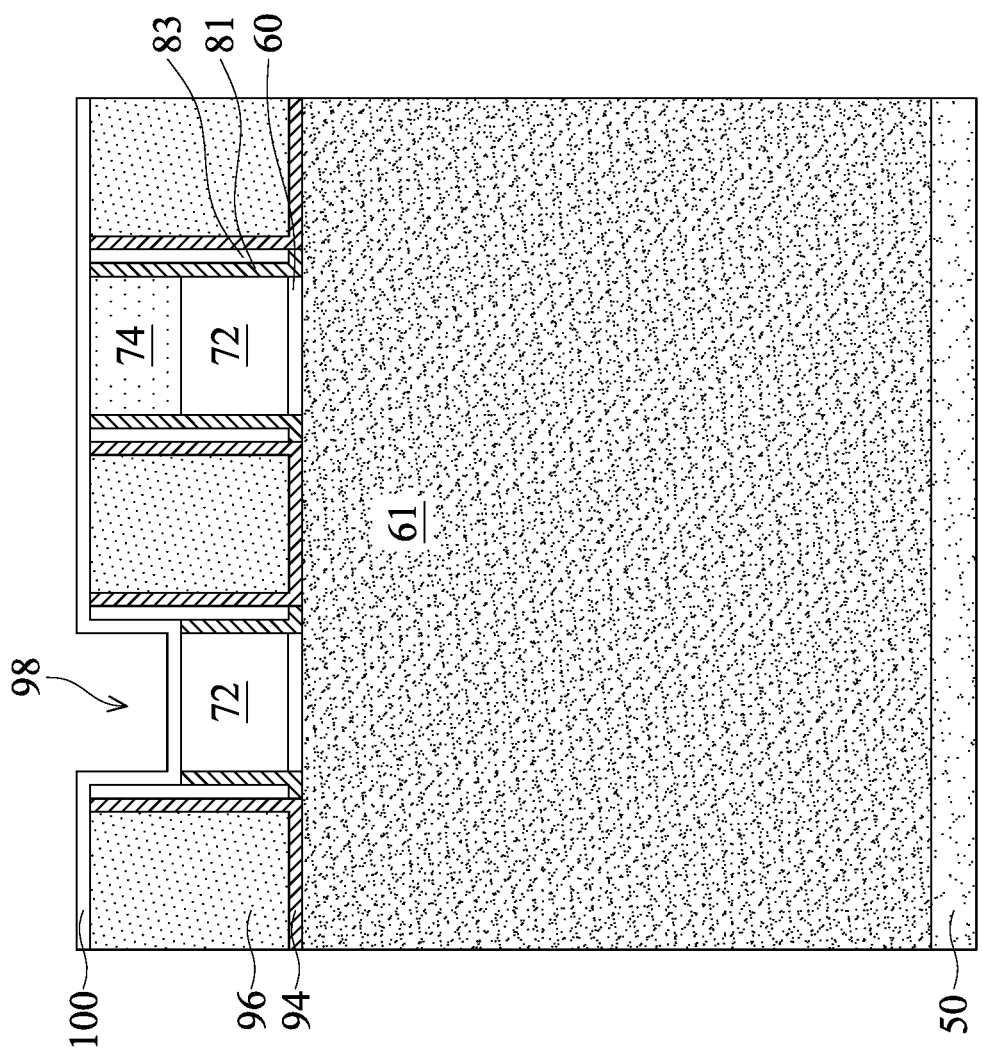

In FIGS. 14A through 14D, the masks 74 are etched to form first openings 98 exposing the dummy gates 72. In some embodiments, the first spacers 81 may be formed of the same materials as the masks 74 and may be etched simultaneously with the masks 74. For example, in some embodiments, the first spacers 81 and the masks 74 may comprise a nitride, such as silicon nitride. The masks 74 may be etched using anisotropic etching processes, such as RIE, NBE, or the like. As illustrated in FIGS. 14A and 14C, the first openings 98 may have a width $W_3$ in a direction perpendicular to a longitudinal axis of the dielectric fin 61. The width $W_3$ may range from about 18 nm to about 40 nm. In some embodiments, the width $W_3$ may be enlarged to range from about 30 nm to about 50 nm. FIG. 14C further illustrates the cross-sections A-A', B-B', and D-D'.

In FIGS. 15A through 15D, a first dielectric layer 100 is deposited over the structures illustrated in FIGS. 14A through 14D, respectively. The first dielectric layer 100 may be deposited by a conformal deposition process, such as ALD, PEALD, thermal ALD or the like. The first dielectric layer 100 may comprise a material having a high etch selectivity relative to a material of the dummy gates 72. For example, in some embodiments, the dummy gates 72 may be formed of polycrystalline silicon or the like and the first dielectric layer 100 may be formed of a nitride (e.g., silicon nitride), an oxide (e.g., silicon oxide), a metal oxide (e.g., aluminum oxide, titanium oxide, or the like), or the like. In some embodiments, both the masks 74 and the first dielectric layer 100 may be formed of silicon nitride, which may improve adhesion between the first dielectric layer 100 and the masks 74 and avoid peeling issues caused by stress between the first dielectric layer 100 and the masks 74. In some embodiments, the first dielectric layer 100 may be formed of silicon oxide, which may release stress caused by depositing the first dielectric layer 100. In some embodiments, the first dielectric layer 100 may comprise a multi-layer structure (the first dielectric layer 100 may be referred to as a first dielectric structure 100). For example, the first dielectric structure 100 may include a layer of silicon oxide over the structures illustrated in FIGS. 14A through 14D and a layer of silicon nitride over the layer of silicon oxide. The layer of silicon oxide may be used to release stress caused by depositing the first dielectric structure 100. Finally, forming the first dielectric layer 100 of silicon nitride using thermal ALD may increase the density of the first dielectric layer 100, and improve control of the process used to deposit the first dielectric layer, improving the quality of the first dielectric layer 100.

The first dielectric layer 100 may be formed to a thickness $T_1$ ranging from about 3 nm to about 5 nm. Forming the first dielectric layer 100 to a thickness greater than 5 nm may require the first openings 98 to have greater widths and may cause increased difficulty in a process subsequently used to etch the first dielectric layer 100 (such as the process described below with respect to FIGS. 16A through 16D. Forming the first dielectric layer 100 to a thickness less than 3 nm may cause increased difficulty in the process used to deposit the first dielectric layer 100.

Figures 16A, 16B:
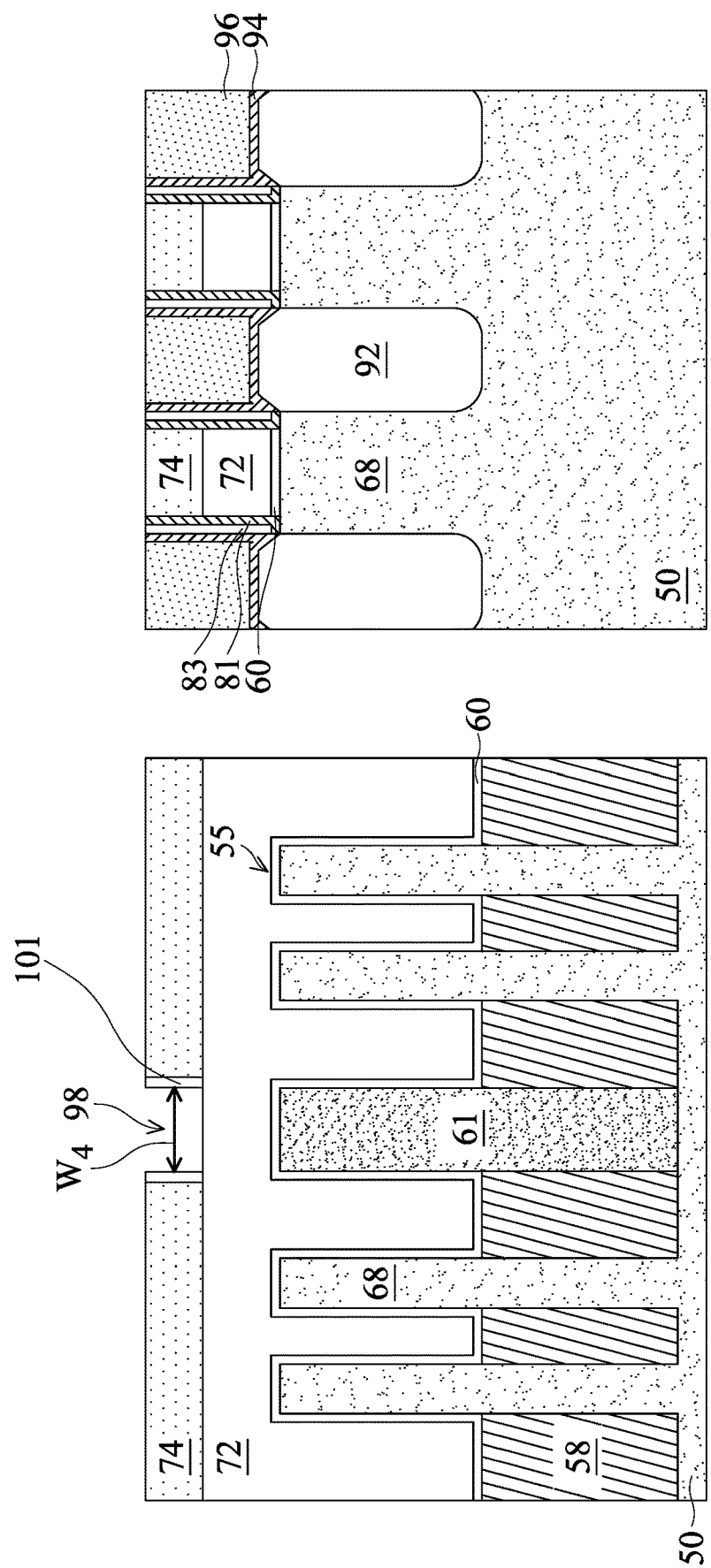
Figure 16C:
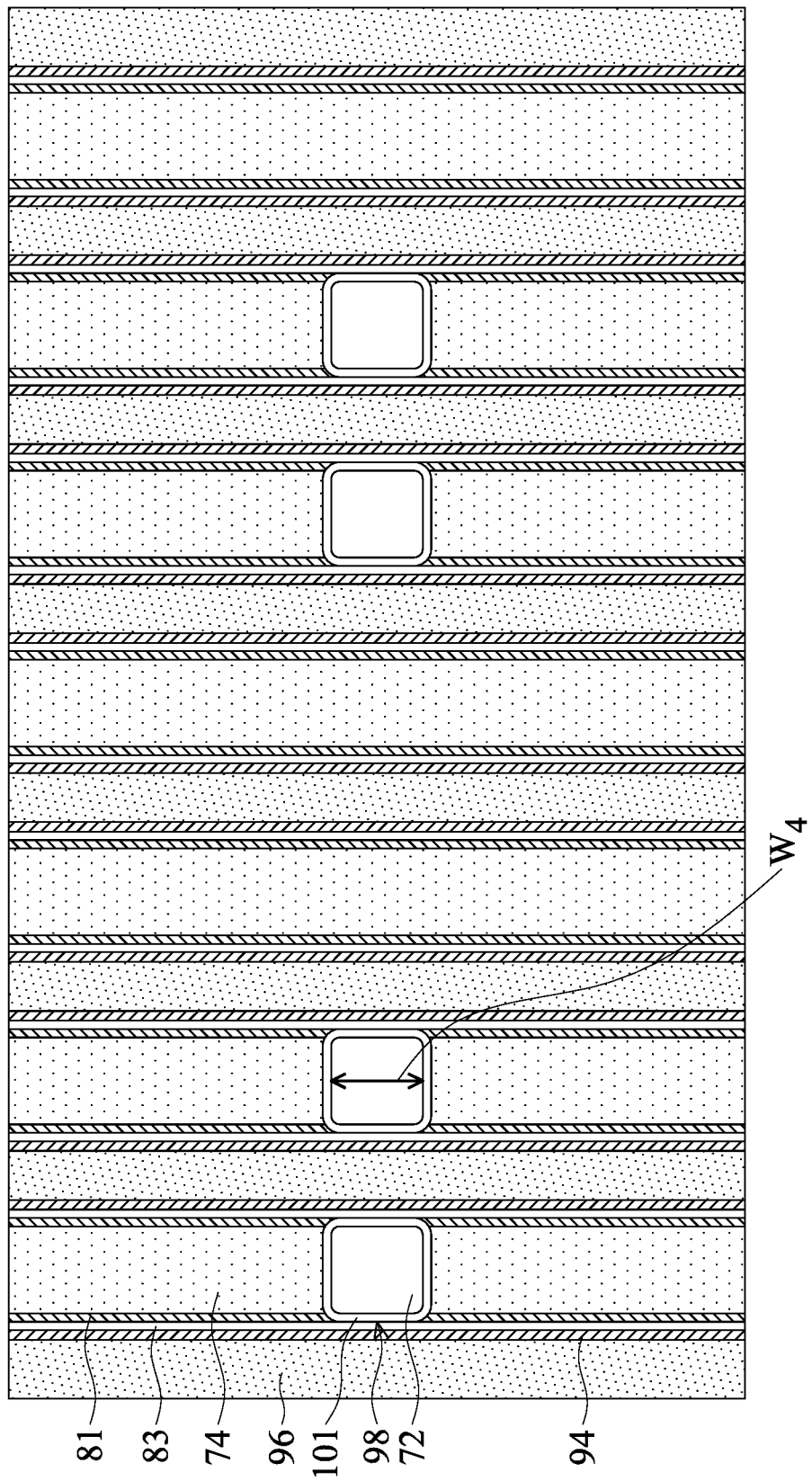
Figure 16D:
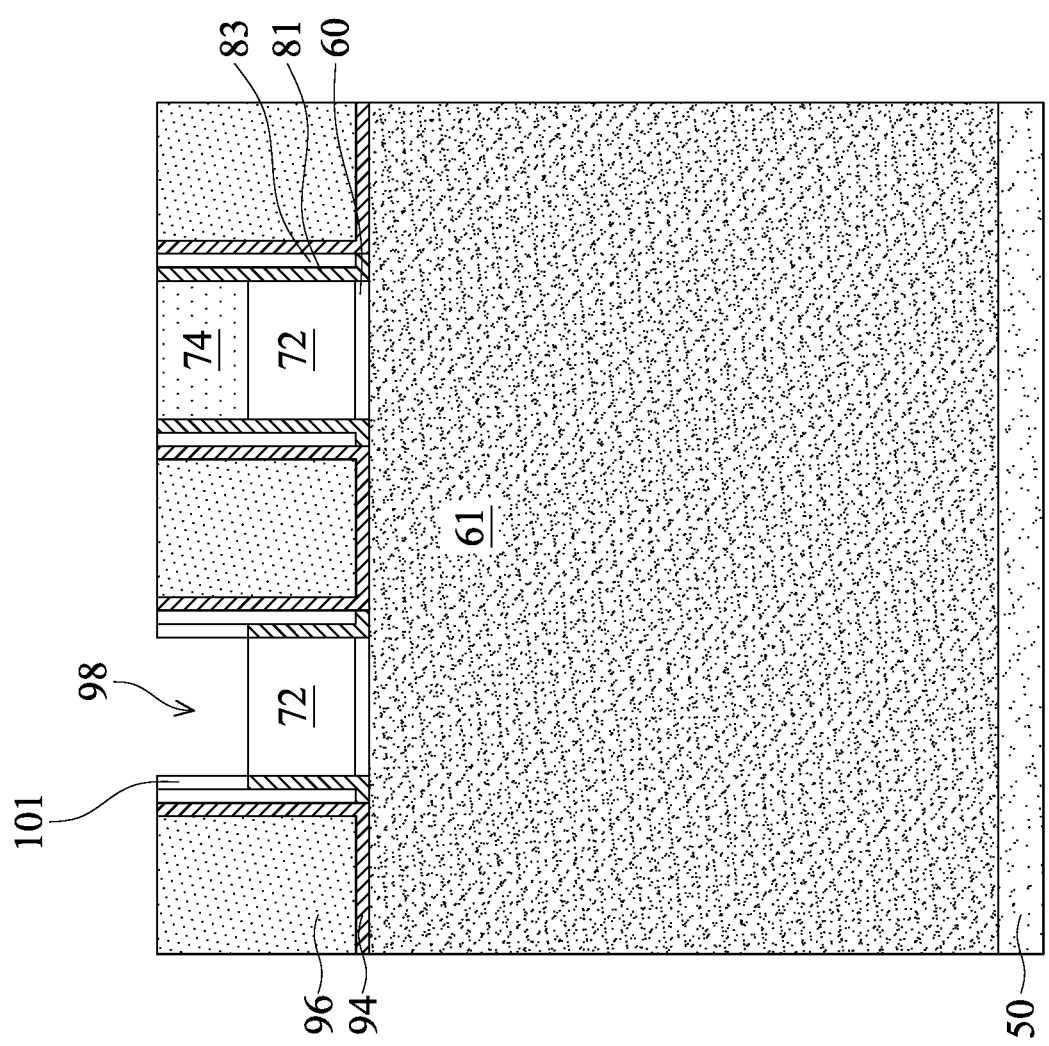

In FIGS. 16A through 16D, the first dielectric layer 100 (see FIGS. 15A through 15D) is etched to form third spacers 101. The first dielectric layer 100 may be etched using a suitable etching process, such as an anisotropic etching process (e.g., a dry etching process) or the like. In embodiments in which the first dielectric layer 100 comprises silicon nitride, the first dielectric layer 100 may be etched by a dry etching process using carbon fluoride compounds, which selectively etch the material of the first dielectric layer 100 relative to the dummy gates 72. The etching process may remove the first dielectric layer 100 from top surfaces of the first ILD 96, the CESL 94, the second spacers 83, and the dummy gates 72. The remaining third spacers 101 may be disposed on sidewalls of the second spacers 83. As illustrated in FIGS. 16A and 16C, opposite ones of the third spacers 101 disposed in the same first opening 98 may be separated from one another by a width $W_4$ in the direction perpendicular to the longitudinal axis of the dielectric fin 61. The width $W_4$ may range from about 12 nm to about 30 nm. In some embodiments, the width $W_4$ may be greater than the width $W_2$ of the dielectric fin 61 by a distance ranging from about 1 nm to about 2 nm and a ratio of the width $W_4$ to the width $W_2$ may range from about 0.5 to about 1.5.

Forming the first openings 98 and then narrowing the first openings 98 using the third spacers 101 provides for greater control over the widths of the first openings 98 and reduces critical dimensions of the first openings 98. This helps to improve device performance, reduce device defects, and reduce feature size. Because the third spacers 101 are formed of a material having high etch selectivity to the underlying dummy gates 72, the dummy gates 72 may be etched with reduced scum. This allows for the third spacers 101 to be formed with the width $W_4$ less than 16 nm. The improved etching process with reduced scum may reduce leakage current, which improves device performance.

In FIGS. 17A through 17E, the dummy gates 72 and the dummy dielectric layers 60 are etched using the masks 74 and the third spacers 101 as masks, extending the first openings 98. The dummy gates 72 may be etched using a suitable etching process, such as an anisotropic etching process (e.g., a dry etching process) or the like. In embodiments in which the dummy gates 72 comprise polycrystalline silicon, the dummy gates 72 may be etched by a dry etching process using fluorine, which selectively etch the material of the dummy gates 72 relative to the third spacers 101, the masks 74, the first ILD 96, the CESL 94, the first spacers 81, and the second spacers 83. Following the etching, the first openings 98 may have the widths $W_4$ level with top surfaces of the dummy gates 72, widths $W_5$ level with bottom surfaces of the dummy dielectric layers 60 on the dielectric fin 61, and depths $D_1$ between the top surfaces of the dummy gates 72 and the bottom surfaces of the dummy dielectric layers 60 on the dielectric fin 61. The widths $W_4$ may range from about 12 nm to about 30 nm, as discussed above; the widths $W_5$ may range from about 12 nm to about 25 nm; and the depths $D_1$ may range from about 80 nm to about 140 nm. Although the first openings 98 are illustrated as having tapered profiles extending through the dummy gates 72 and the dummy dielectric layers 60, the first openings 98 may have vertical sidewalls or reverse tapered profiles (widening in a direction from the top surfaces of the dummy gates 72 to the bottom surfaces of the dummy dielectric layers 60). Forming the first openings 98 and then narrowing the first openings 98 using the third spacers 101 provides for greater control over the widths of the first openings 98 and reduces critical dimensions of the first openings 98. Because the third spacers 101 are formed of a material having a high etch selectivity relative to the dummy gates 72, the dummy gates 72 may be etched for a time sufficient to completely etch through the dummy gates 72, reducing scum left in the first openings 98, which reduces leakage current and allows for smaller critical dimensions to be achieved. As such, the methods described help to improve device performance, reduce device defects, and reduce feature size.

Figure 17C:
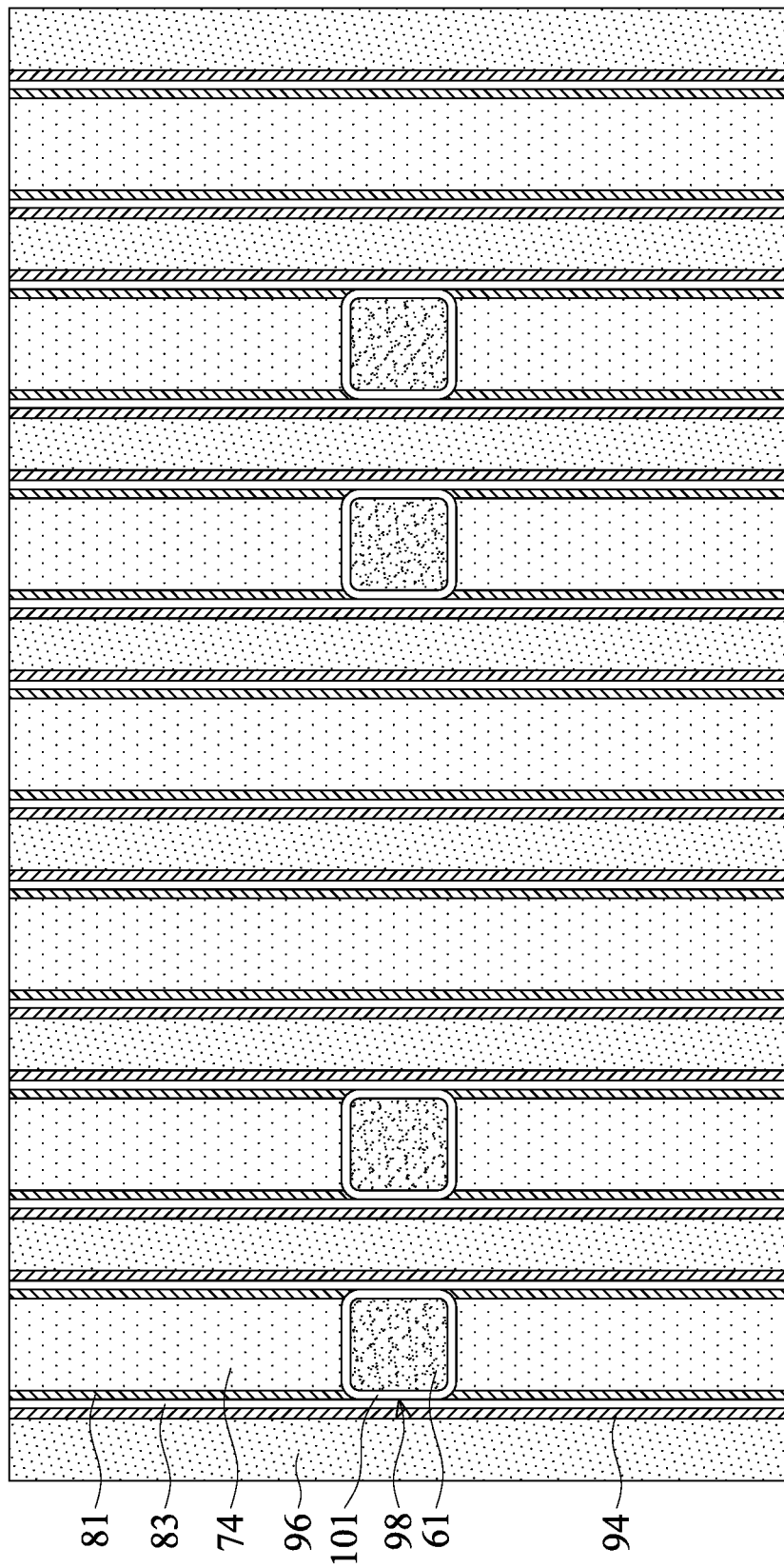
Figure 17E:
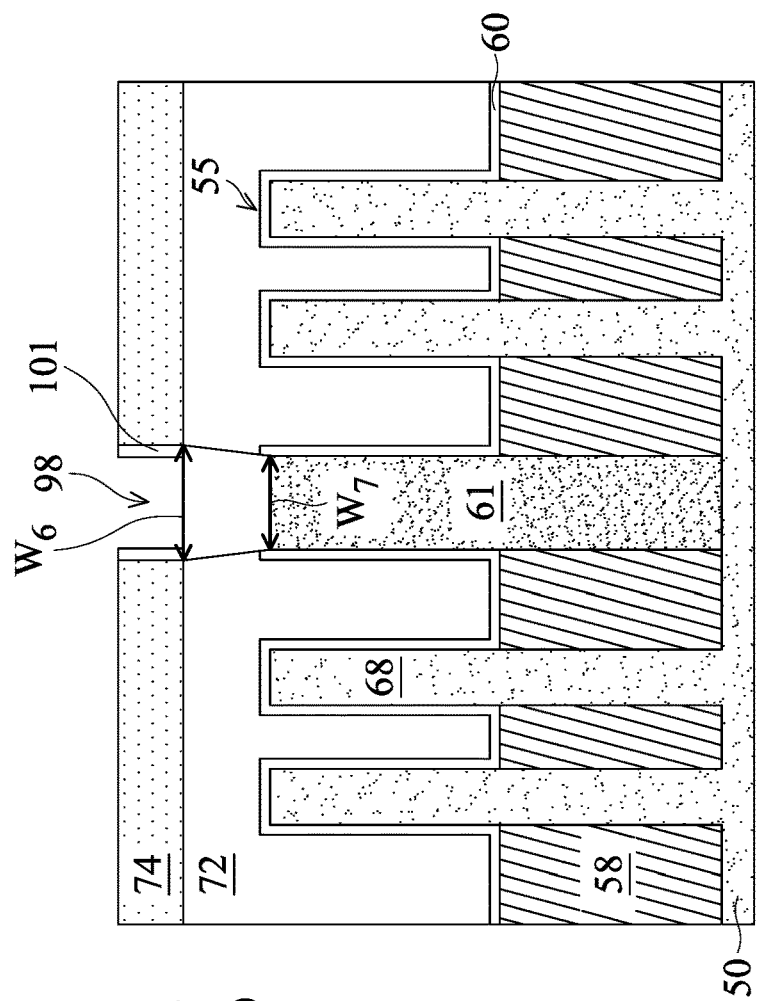
Figure 17D:
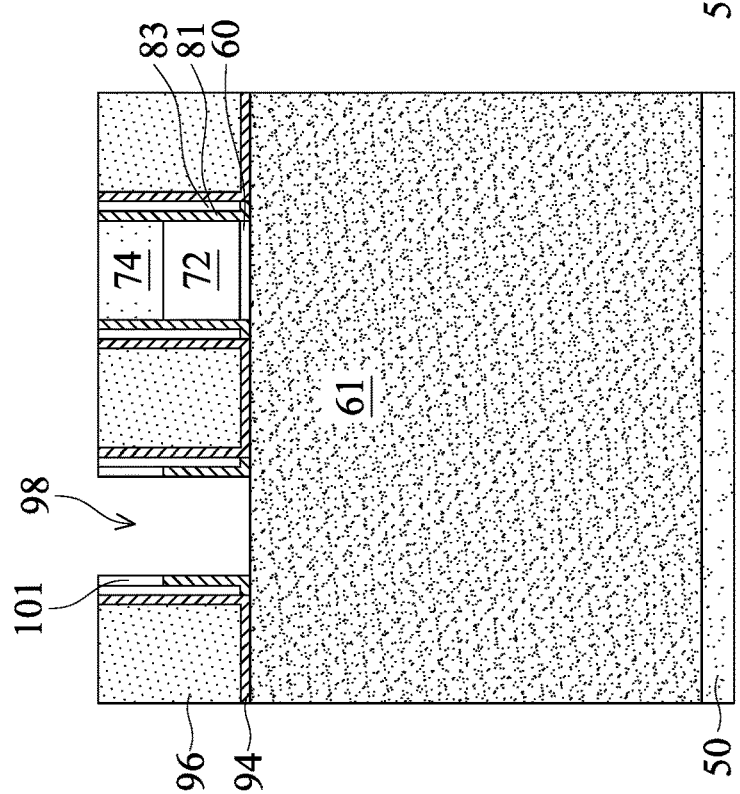
Figure 18C:
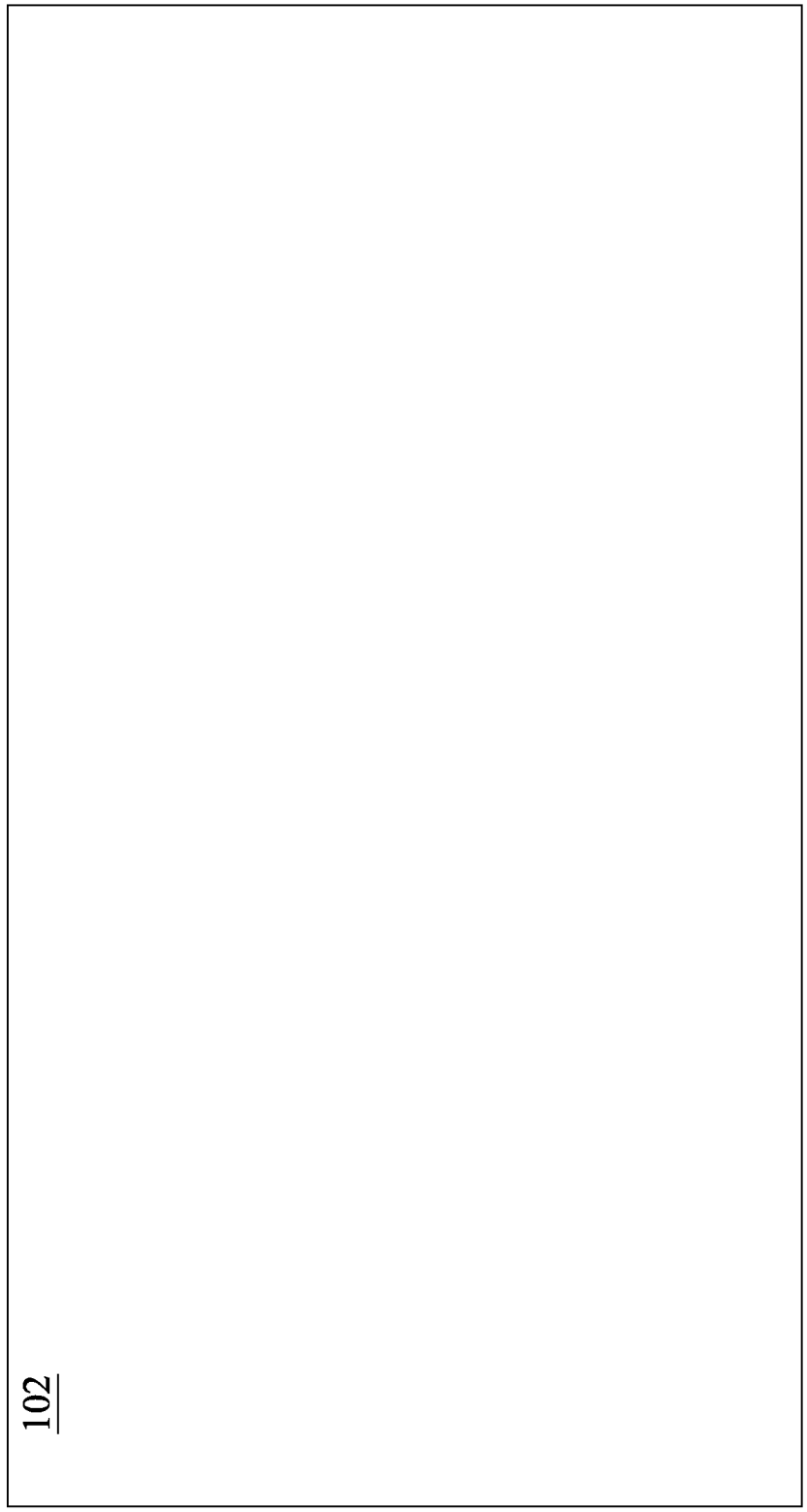
Figure 18D:
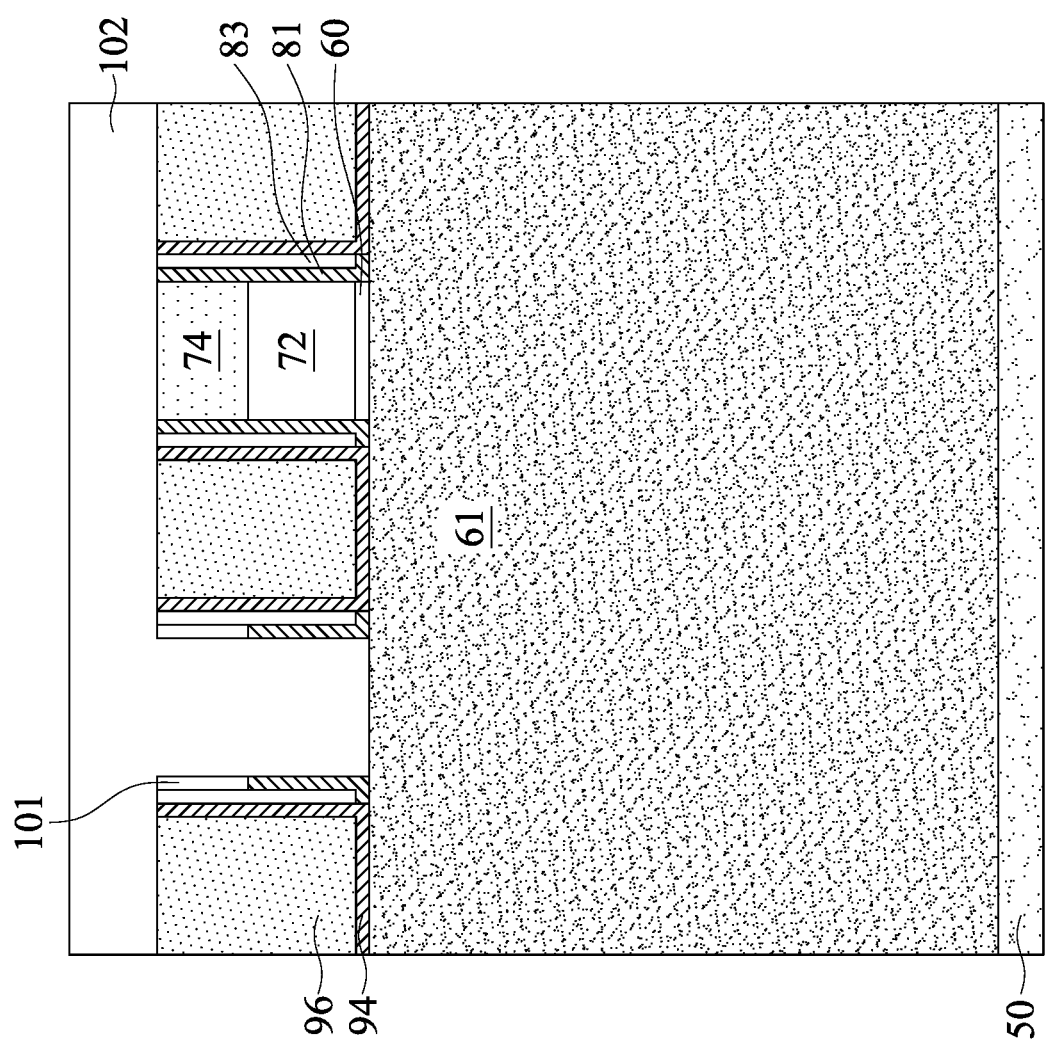
Figures 19A, 19B:
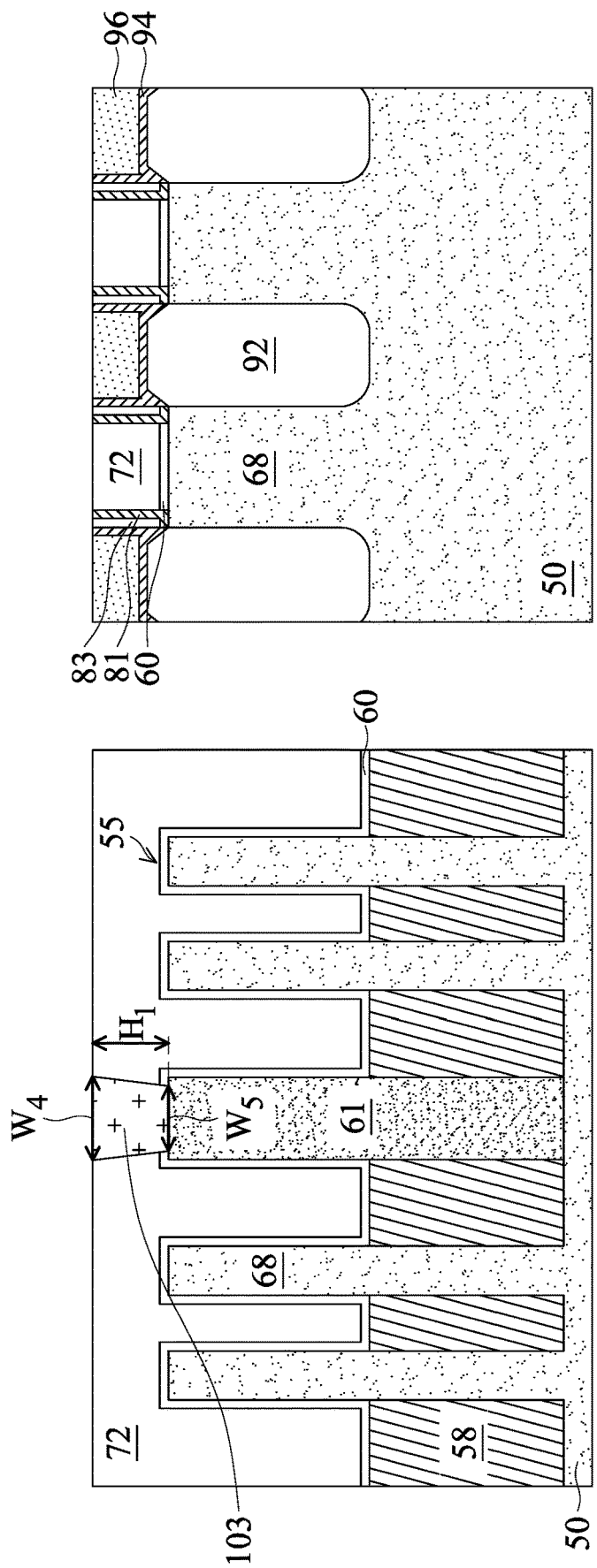
Figure 19C:
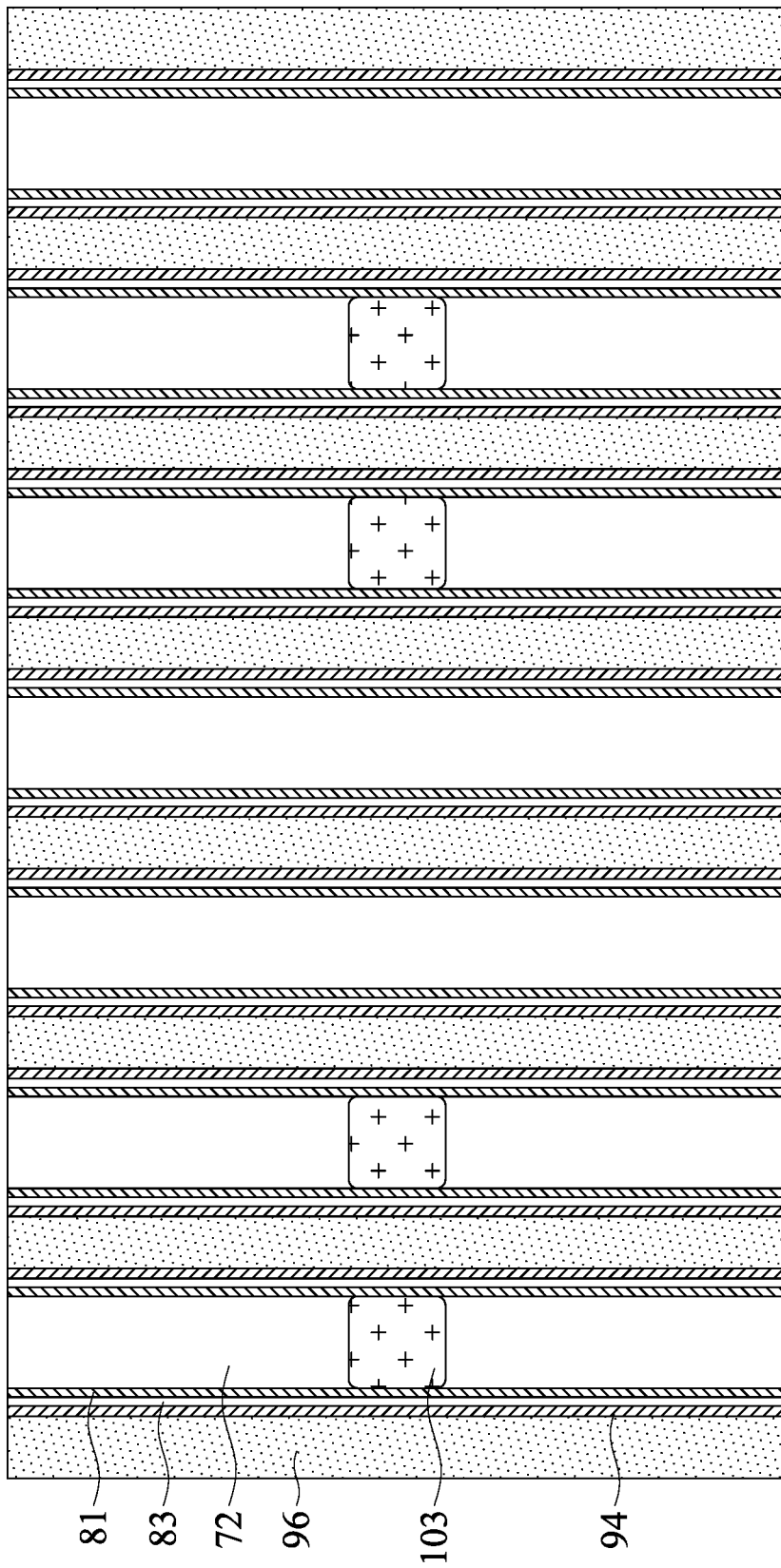
Figure 19D:
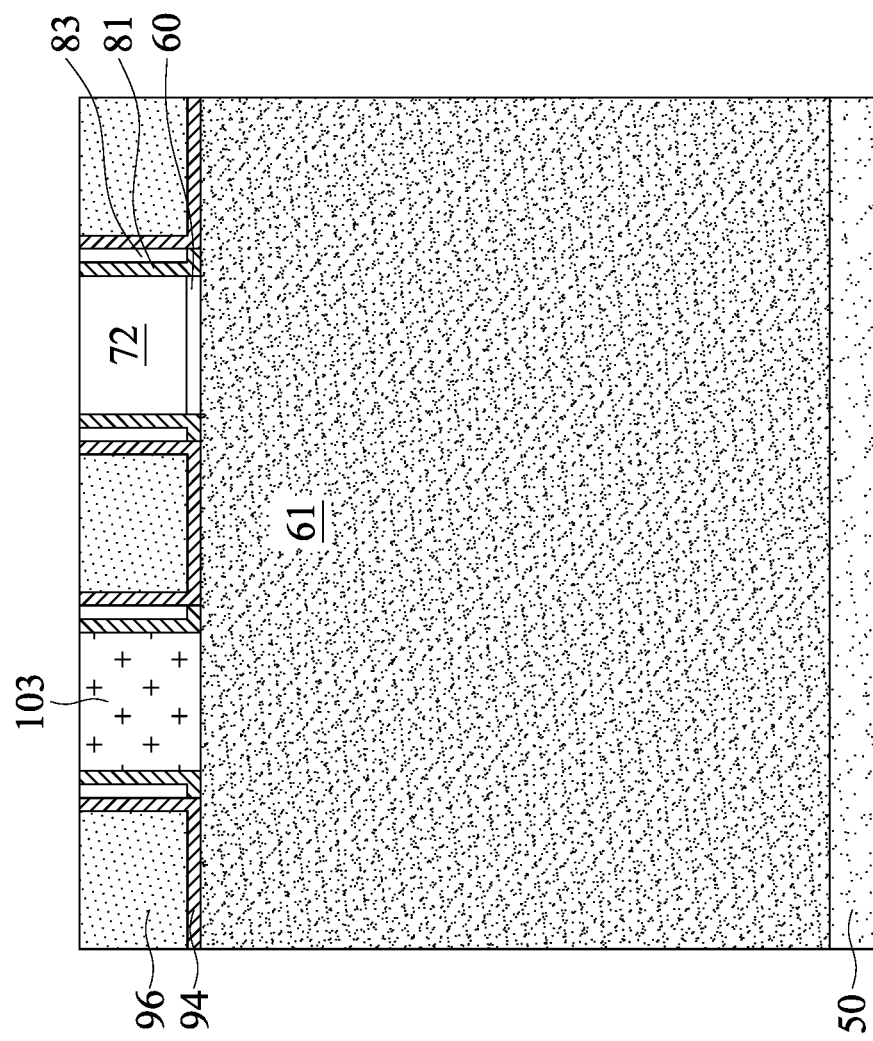
Figure 20B:
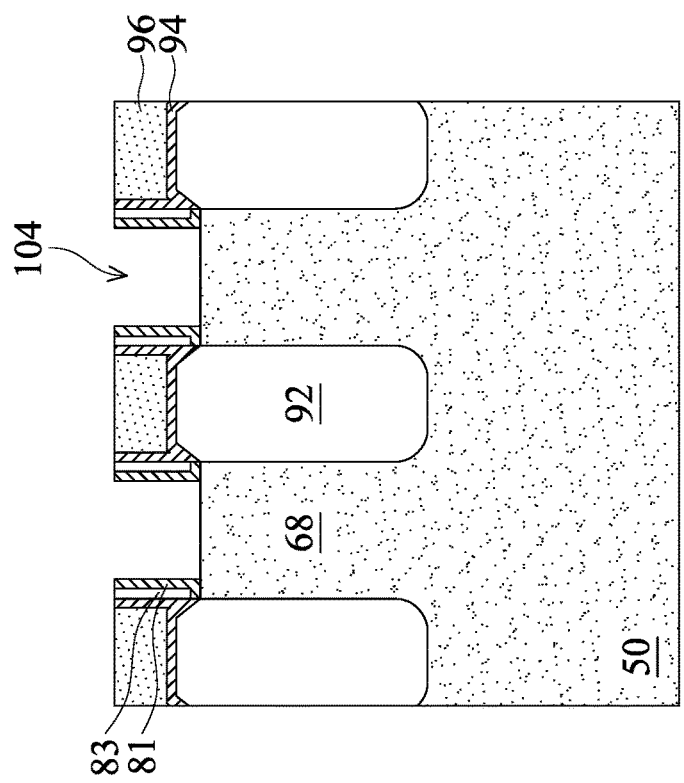
Figure 20A:
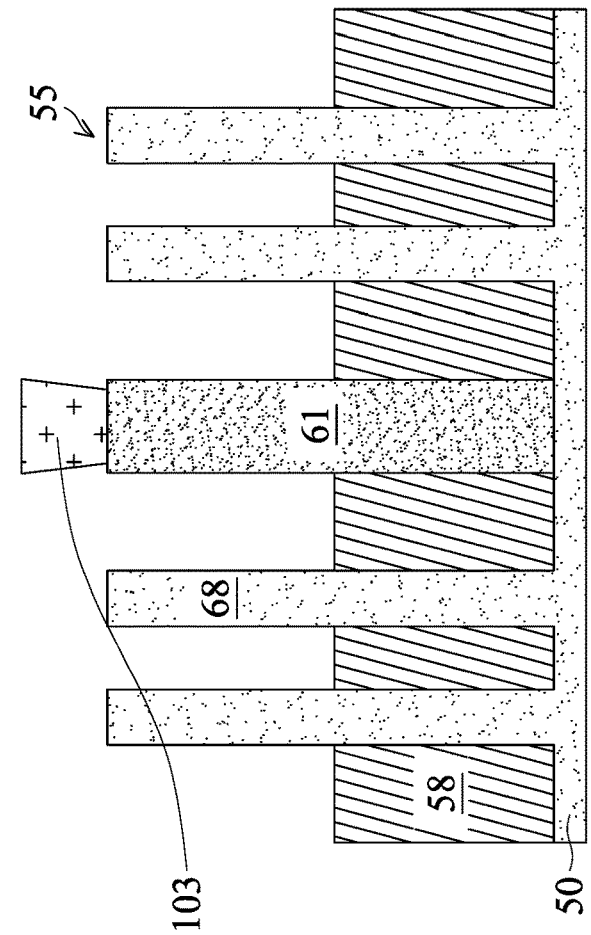
Figure 20C:
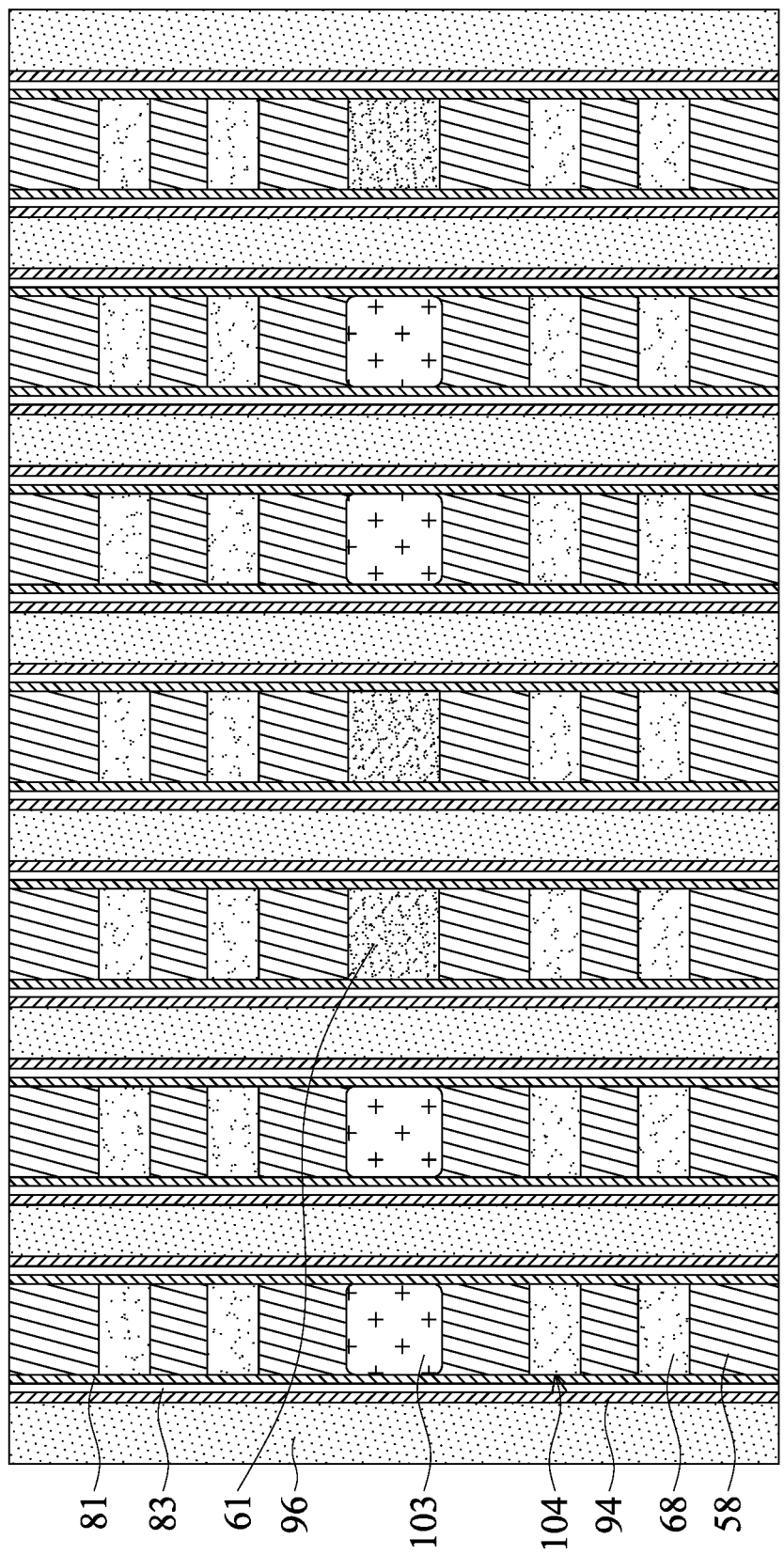
Figure 20D:
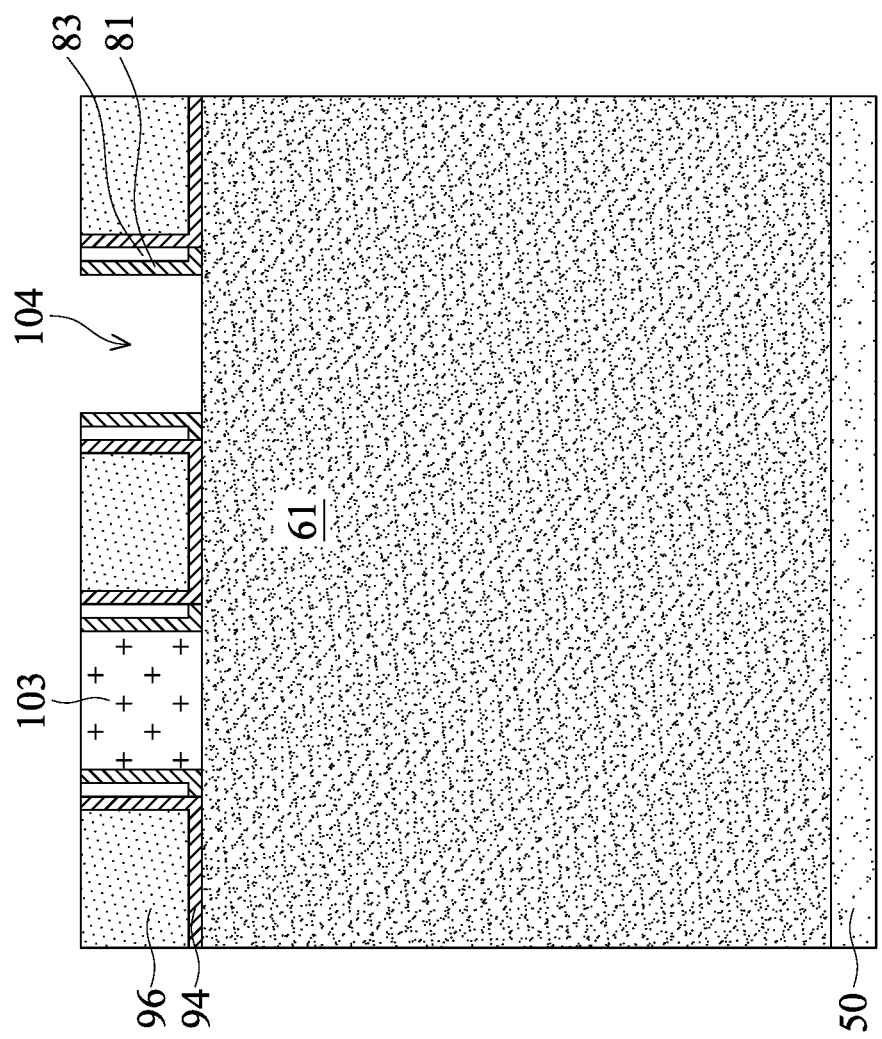
Figures 21A, 21B:
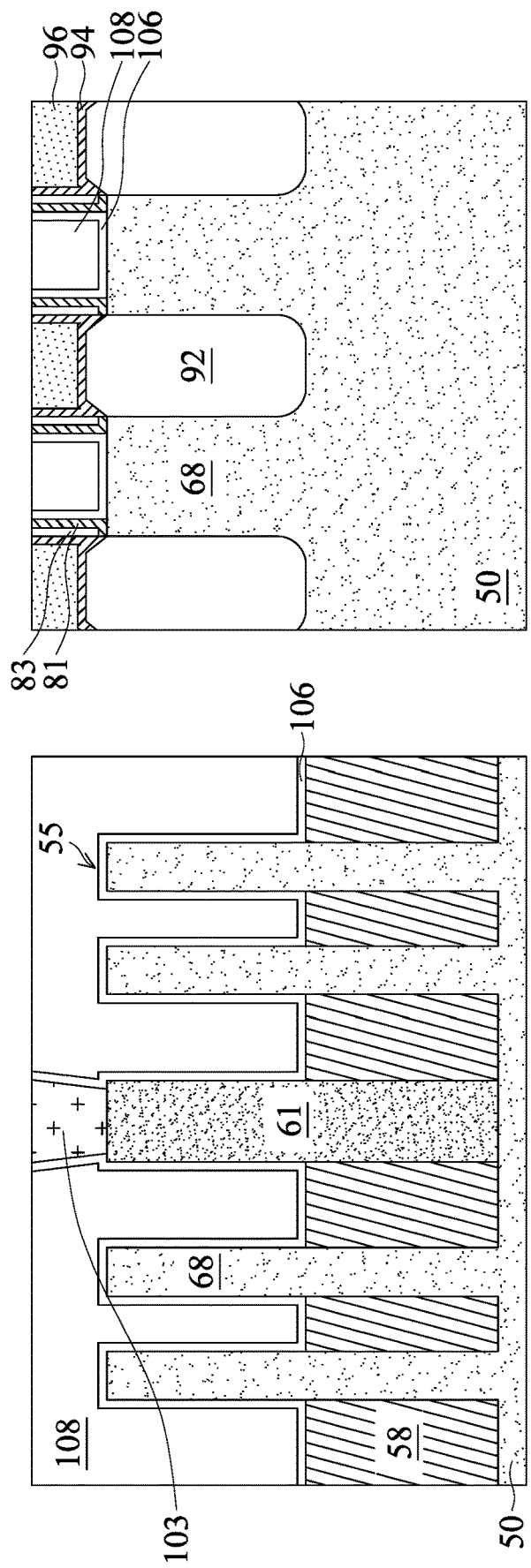
Figure 21C:
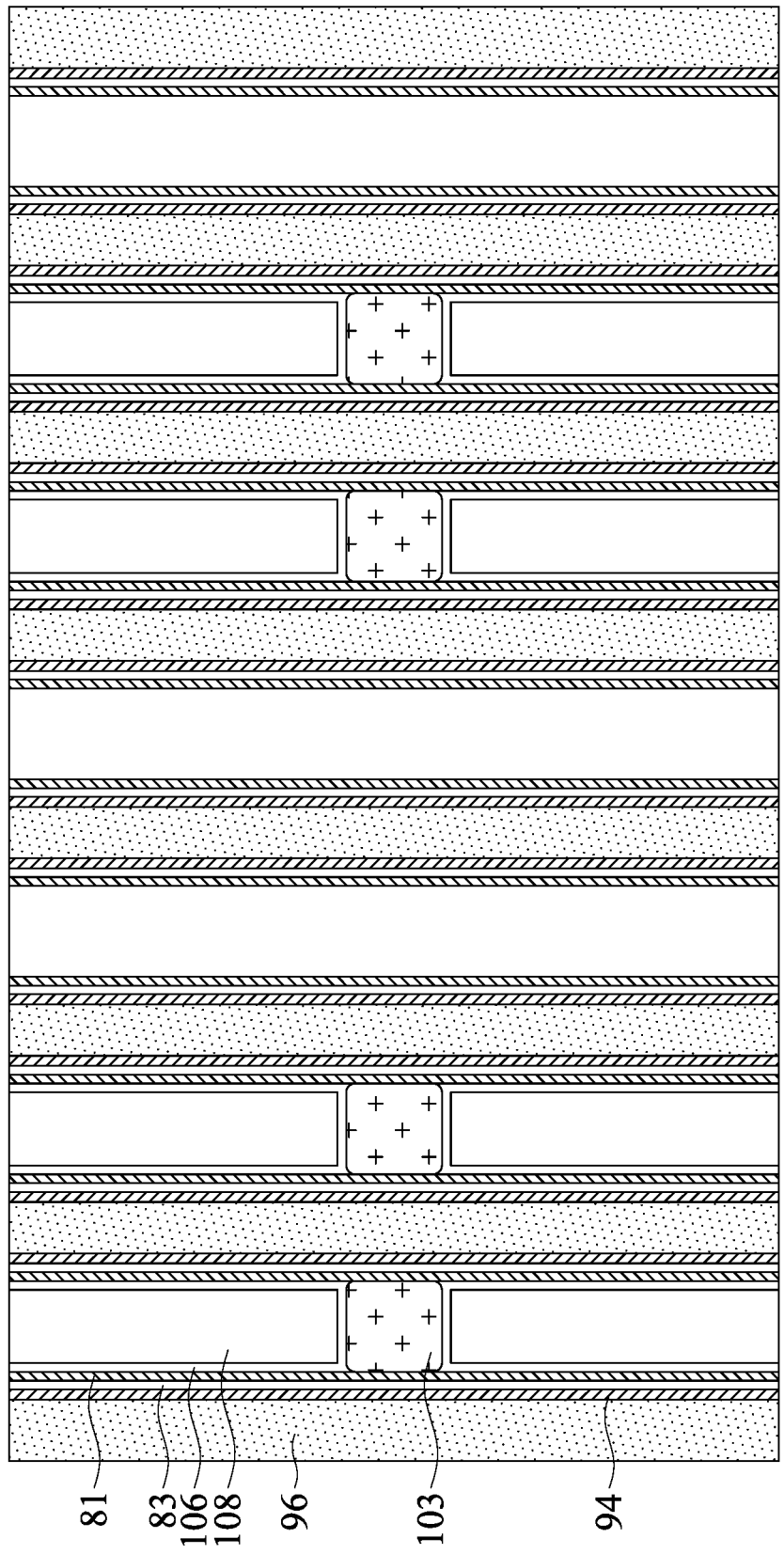
Figure 21D:
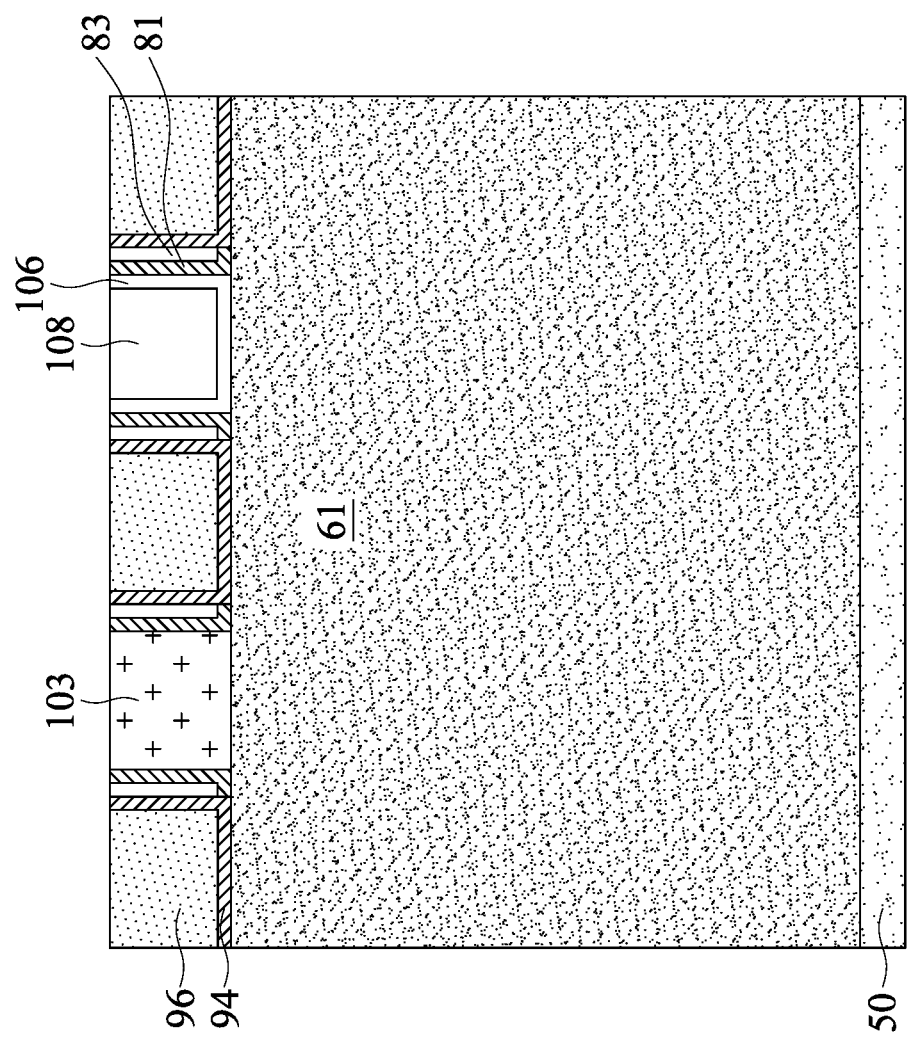

FIG. 17E illustrates an embodiment in which the portions of the first openings 98 extending through the dummy gates 72 and the dummy dielectric layers 60 have widths greater than the width between the third spacers 101. The first openings 98 may have widths $W_6$ level with top surfaces of the dummy gates 72 ranging from about 10 nm to about 28 nm and widths $W_7$ level with bottom surfaces of the dummy dielectric layers 60 on the dielectric fin 61 ranging from about 10 nm to about 22 nm.

In FIGS. 18A through 18D, a gate isolation structure 102 is formed over the structures of FIGS. 17A through 17D, respectively. The gate isolation structure 102 may fill the first openings 98, extending along a top surface of the dielectric fin 61 and along side surfaces of the third spacers 101, the dummy gates 72, and the dummy dielectric layers 60, and extending along top surfaces of the first ILD 96, the CESL 94, the second spacers 83, the masks 74, and the third spacers 101. The gate isolation structure 102 may be used to isolate portions of the dummy gates 72, which are subsequently replaced by gate electrodes (such as the gate electrodes 108, discussed below with respect to FIGS. 21A through 21D).

It is appreciated that although the dummy gates 72 are cut and the gate isolation structure 102 is formed before replacement gate stacks are formed in the illustrated embodiments, the replacement gate stacks may be cut and the gate isolation structure 102 formed after forming the replacement gate stacks. In some embodiments, the material of the gate isolation structure 102 may be deposited using a conformal deposition process, such as ALD, PEALD, thermal ALD, or the like. The gate isolation structure 102 may be formed of a dielectric material, such as silicon nitride, silicon oxide, silicon oxycarbide, silicon oxycarbonitride, combinations or multiple layers thereof, or the like.

In FIGS. 19A through 19D, a planarization process, such as a CMP, may be performed. The planarization process may separate the gate isolation structure 102 illustrated in FIGS. 18A through 18D into separate gate isolation regions 103 and level top surfaces of the gate isolation regions 103 and the first ILD 96 with top surfaces of the dummy gates 72. The planarization process may also remove the masks 74 on the dummy gates 72, the third spacers 101, portions of the second spacers 83, and portions of the CESL 94. After the planarization process, top surfaces of the dummy gates 72, the first spacers 81, the second spacers 83, the gate isolation regions 103, the CESL 94 and the first ILD 96 are level. Accordingly, the top surfaces of the dummy gates 72 are exposed through masks 74. Following the planarization process, top surfaces of the gate isolation regions 103 may have widths $W_4$ ranging from about 12 nm to about 30 nm, bottom surfaces of the gate isolation regions 103 may have widths $W_5$ ranging from about 12 nm to about 25 nm, and the gate isolation regions 103 may have heights $H_1$ ranging from about 80 nm to about 120 nm.

In FIGS. 20A through 20D, the dummy gates 72 are removed in an etching step(s), so that second recesses 104 are formed. Portions of the dummy dielectric layers 60 in the second recesses 104 may also be removed. In some embodiments, the dummy gates 72 are removed, the dummy dielectric layers 60 remain, and the dummy dielectric layers 60 are exposed by the second recesses 104. In some embodiments, the dummy dielectric layers 60 are removed from second recesses 104 in a first region of a die (e.g., a core logic region) and the dummy dielectric layers 60 remain in second recesses 104 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 at a faster rate than the first ILD 96, the CESL 94, the first spacers 81, or the second spacers 83. Each of the second recesses 104 exposes and/or overlies a channel region 68 of a respective fin 55. Each channel region 68 is disposed between neighboring pairs of the epitaxial source/drain regions 92. During the removal, the dummy dielectric layers 60 may be used as an etch stop layer when the dummy gates 72 are etched. The dummy dielectric layers 60 may be optionally removed after removing the dummy gates 72.

In FIGS. 21A through 21D, gate dielectric layers 106 and gate electrodes 108 are formed for replacement gates. The gate dielectric layers 106 may be formed by depositing one or more layers in the second recesses 104, such as on top surfaces and sidewalls of the fins 55, the first spacers 81, and the gate isolation regions 103, and on top surfaces of the STI regions 58, the first ILD 96, the CESL 94, and the second spacers 83. The gate dielectric layers 106 may comprise one or more layers of silicon oxide, silicon nitride, metal oxides, metal silicates, or the like. For example, in some embodiments, the gate dielectric 106 100 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, a combination thereof, or the like. The gate dielectric layers 106 may include a dielectric layer having a k-value greater than about 7.0. The gate dielectric layers 106 may be deposited by molecular-beam deposition (MBD), ALD, PECVD, or the like. In embodiments where portions of the dummy dielectric layers 60 remain in the second recesses 104, the gate dielectric layers 106 may include a material of the dummy dielectric layers 60 (e.g., $SiO_2$).

The gate electrodes 108 are deposited over the gate dielectric layers 106 and fill remaining portions of the second recesses 104. The gate electrodes 108 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 108 is illustrated in FIGS. 21A through 21D, the gate electrodes 108 may comprise any number of liner layers, any number of work function tuning layers, and a fill material (not separately illustrated). After the filling of the second recesses 104, a planarization process, such as a CMP, is performed to remove excess portions of the gate dielectric layers 106 and the gate electrodes 108, which excess portions are over top surfaces of the first ILD 96, the CESL 94, the first spacers 81, the second spacers 83, and the gate isolation regions 103. The remaining portions of the gate electrodes 108 and the gate dielectric layers 106 form replacement gates of the resulting FinFETs. The gate electrodes 108 and the gate dielectric layers 106 may be collectively referred to as "gate stacks." The gate stacks may extend along sidewalls of the channel regions 68 of the fins 55.

The formation of the gate dielectric layers 106 in the n-type region and the n-type region may occur simultaneously such that the gate dielectric layers 106 in each region are formed from the same materials. The formation of the gate electrodes 108 may occur simultaneously such that the gate electrodes 108 in each region are formed from the same materials. In some embodiments, the gate dielectric layers 106 in each region may be formed by distinct processes, such that the gate dielectric layers 106 may be different materials. The gate electrodes 108 in each region may be formed by distinct processes, such that the gate electrodes 108 may be different materials. Various masking steps may be used to mask and expose appropriate regions when using distinct processes.

Figures 22A, 22B:
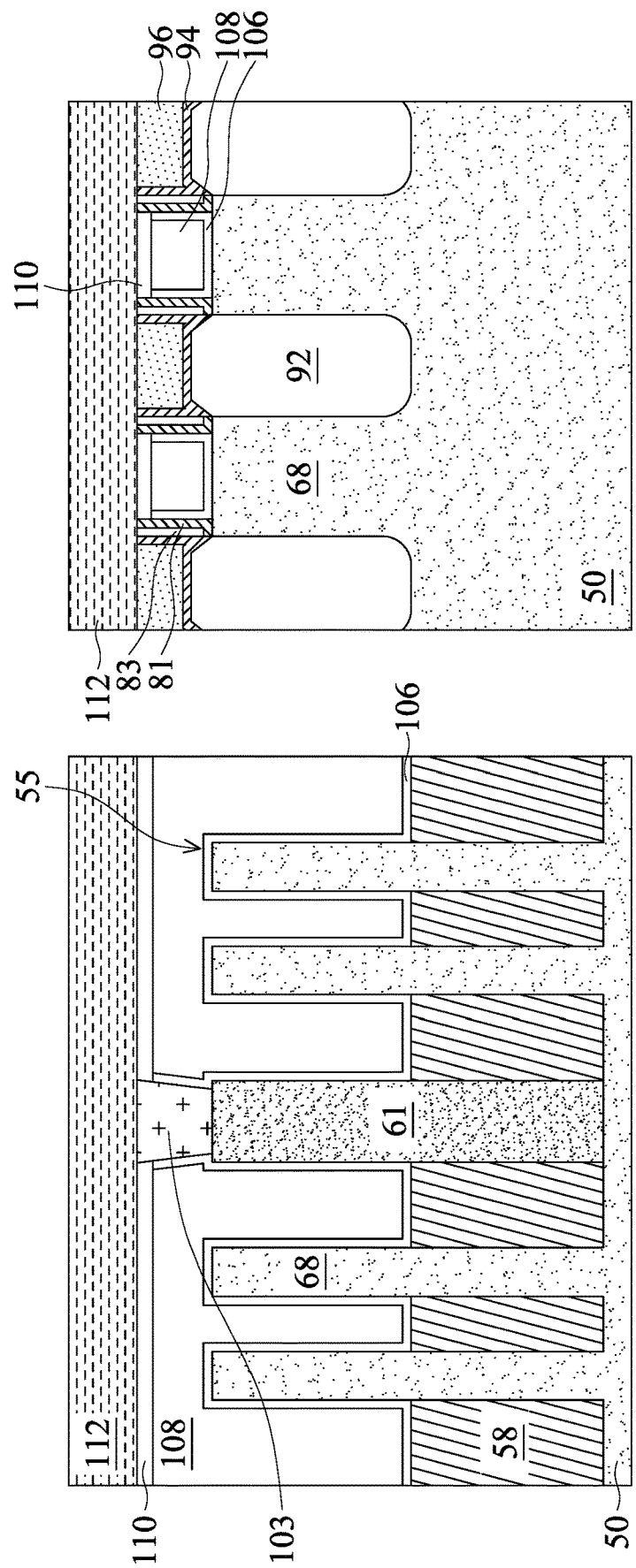

In FIGS. 22A and 22B, a second ILD 112 is deposited over the first ILD 96, the CESL 94, the first spacers 81, the second spacers 83, the gate isolation regions 103, the gate dielectric layers 106, and the gate electrodes 108. In some embodiments, the second ILD 112 is a flowable film formed by FCVD. In some embodiments, the second ILD 112 is formed of a dielectric material such as PSG, BSG, BPSG, USG, or the like, and may be deposited by any suitable method, such as CVD, PECVD, or the like. In some embodiments, the dielectric materials for the second ILD 112 may include silicon oxide, silicon nitride, silicon oxynitride, or the like. In some embodiments, before the formation of the second ILD 112, the gate stacks (including the gate dielectric layers 106 and the corresponding overlying gate electrodes 108) are recessed, so that recesses are formed directly over each of the respective gate stacks and between opposing portions of the first spacers 81. A gate mask 110 comprising one or more layers of dielectric material, such as silicon nitride, silicon oxynitride, or the like, is filled in the recess, followed by a planarization process to remove excess portions of the dielectric material extending over the first ILD 96, the CESL 94, the gate isolation regions 103, the first spacers 81, and the second spacers 83. Subsequently formed gate contacts (such as the gate contacts 114, discussed below with respect to FIGS. 23A and 23B) penetrate through the gate mask 110 to contact top surfaces of the recessed gate electrodes 108.

Figures 23A, 23B:
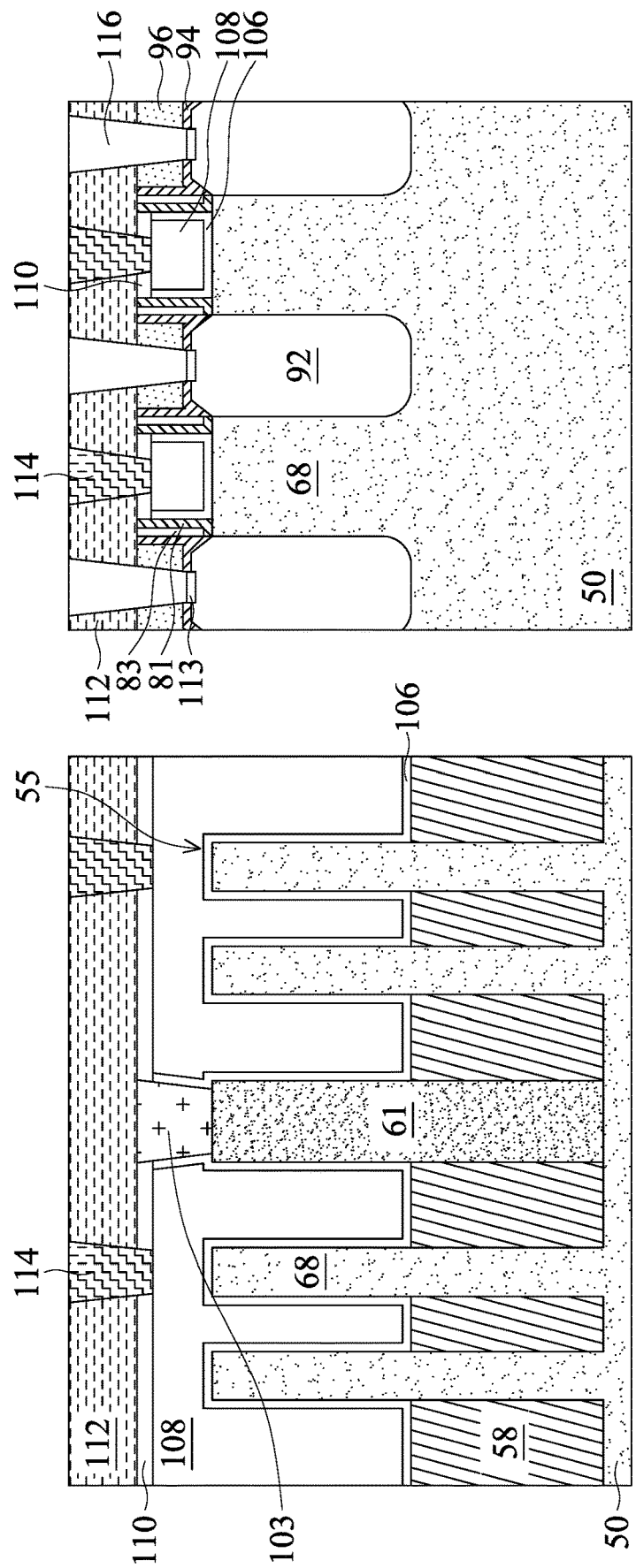

In FIGS. 23A and 23B, gate contacts 114 are formed through the second ILD 112 and the gate masks 110 and source/drain contacts 116 are formed through the second ILD 112, the first ILD 96, and the CESL 94. Openings for the source/drain contacts 116 are formed through the second ILD 112, the first ILD 96, and the CESL 94 and openings for the gate contacts 114 are formed through the second ILD 112 and the gate mask 110. The openings may be formed using acceptable photolithography and etching techniques. In some embodiments, after the openings for the source/drain contacts are formed through the second ILD 112, the first ILD 96, and the CESL 94, silicide regions 113 are formed over the epitaxial source/drain regions 92. The silicide regions 113 may be formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 113.

A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 112. The remaining liner and conductive material form the source/drain contacts 116 and the gate contacts 114 in the openings. The source/drain contacts 116 are electrically coupled to the epitaxial source/drain regions 92 through the silicide regions 113 and the gate contacts 114 are electrically coupled to the gate electrodes 108. The source/drain contacts 116 and the gate contacts 114 may be formed in different processes, or may be formed in the same process. Although shown as being formed in the same cross-sections, it should be appreciated that each of the source/drain contacts 116 and the gate contacts 114 may be formed in different cross-sections, which may avoid shorting of the contacts.

Embodiments may achieve various advantages. For example, forming the first openings 98 through the masks 74, conformally depositing the first dielectric layer 100 in the first openings 98, and anisotropically etching the first dielectric layer 100 to form the third spacers 101 allows a critical dimension of the first openings 98 to be reduced and provides better control over the critical dimension of the first openings 98. This reduces device defects and improves device performance. The third spacers 101 may be formed of materials having high etch selectivity to the dummy gates 72 and the dummy gates 72 may be etched for a time sufficient to eliminate scum in the first openings 98, which reduces leakage current. Gate isolation regions 103 are subsequently formed in the first openings 98 and may be used to isolate adjacent gate stacks from one another.

Figures 24A, 24B:
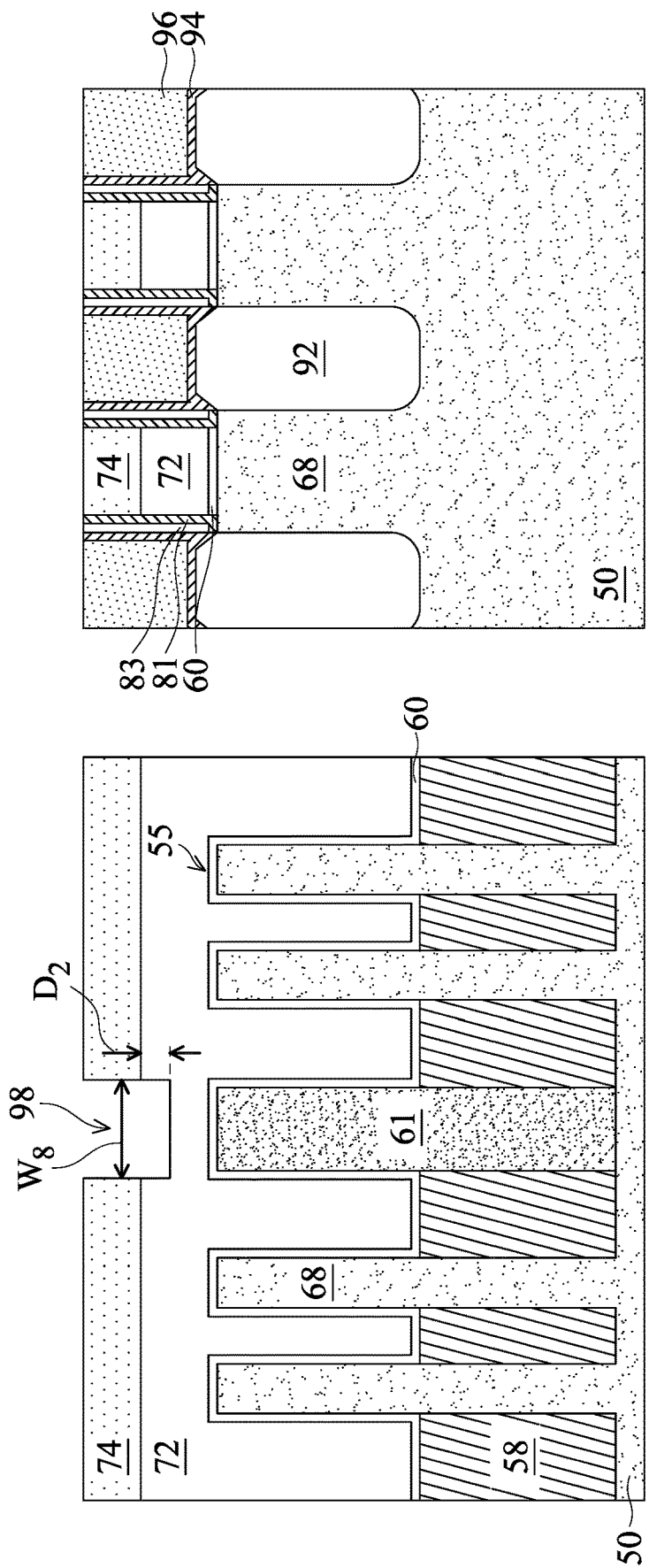
Figure 24D:
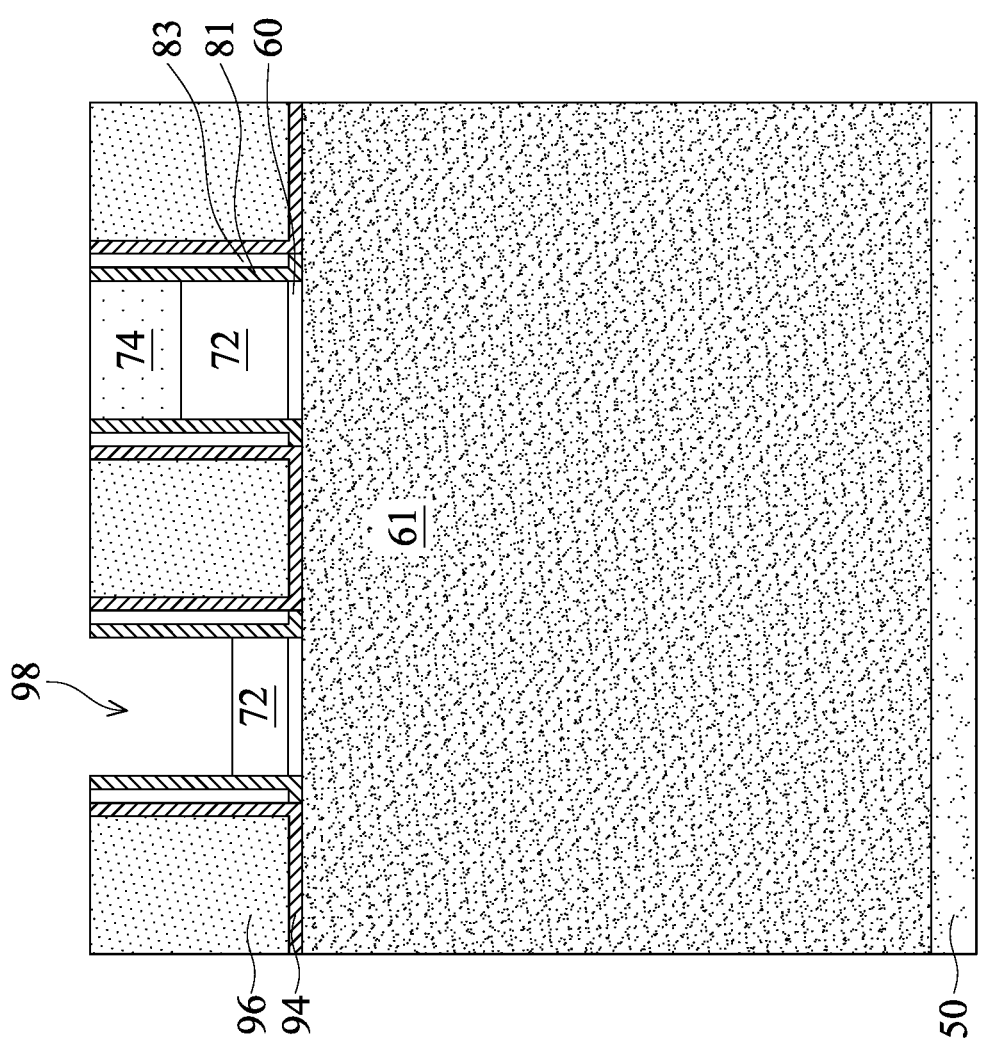
Figures 25A, 25B:
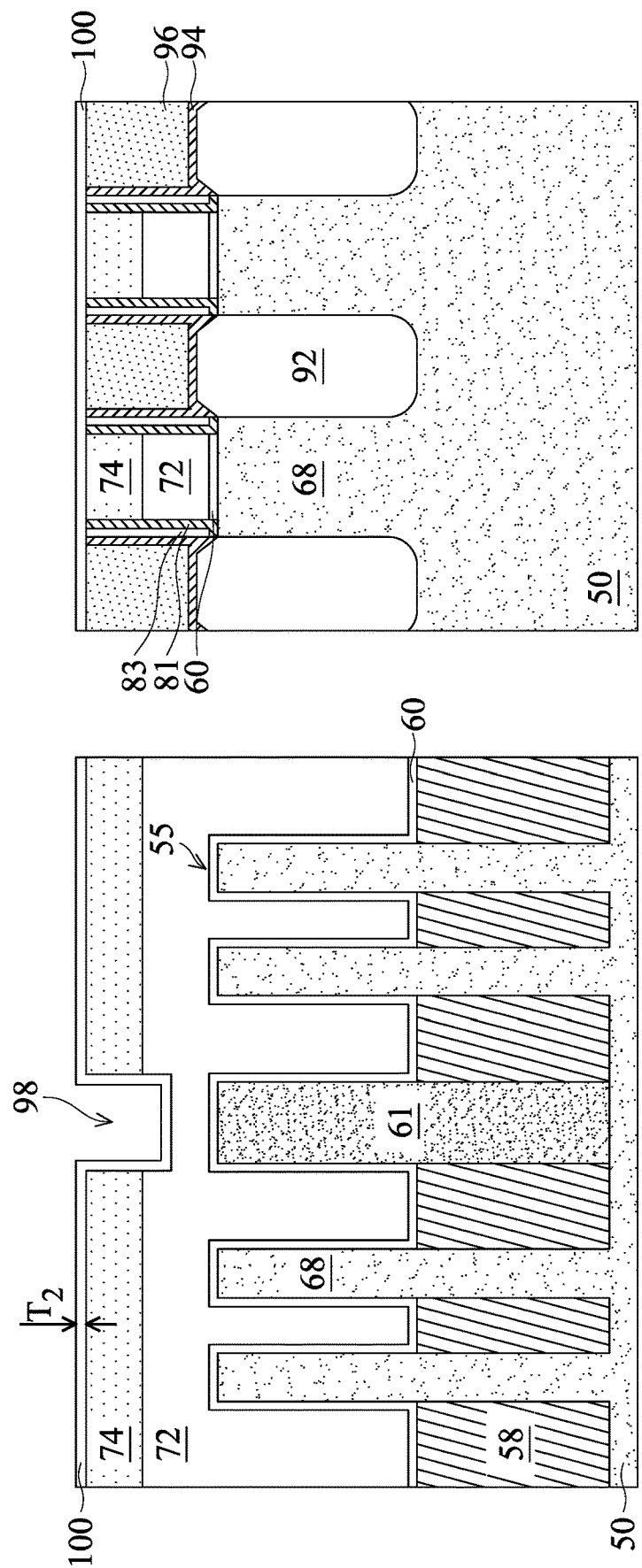
Figure 25C:
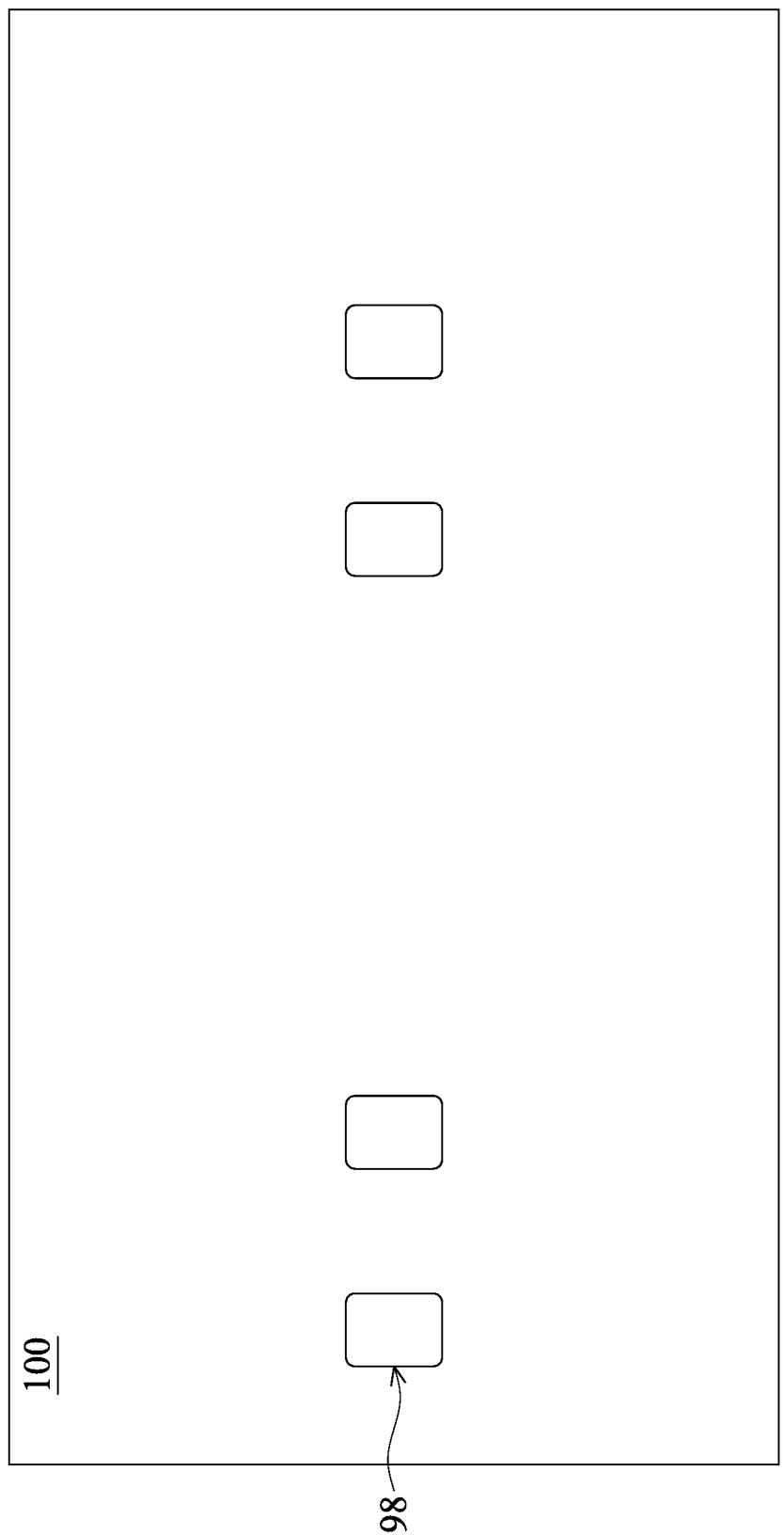
Figure 25D:
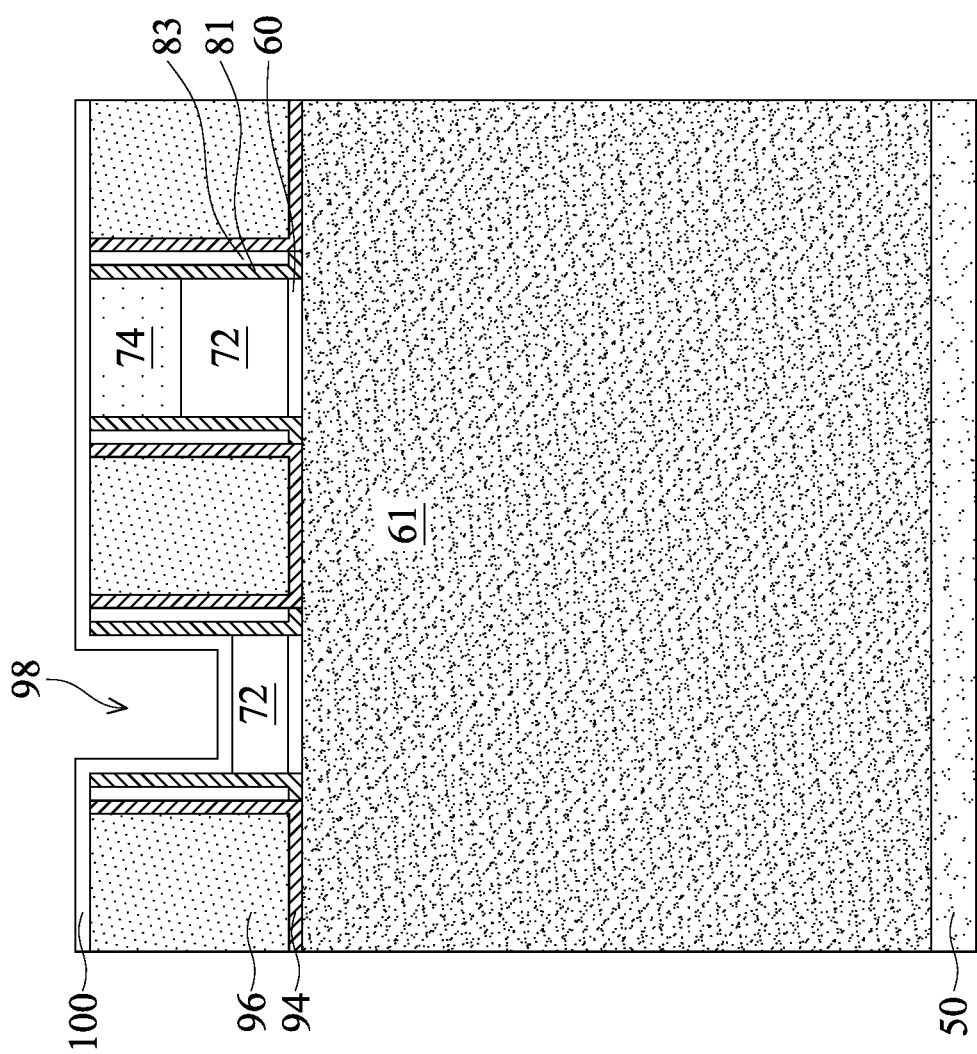
Figures 26A, 26B:
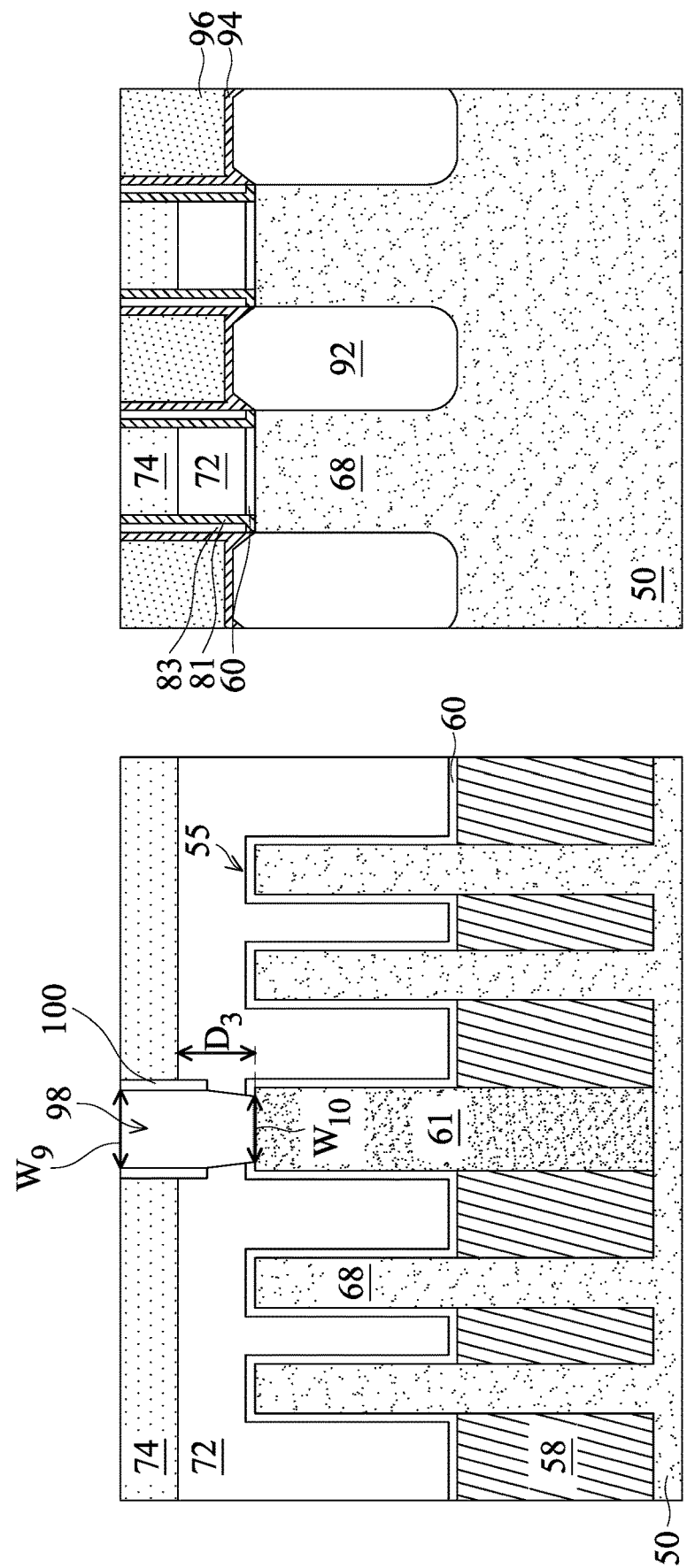
Figure 26C:
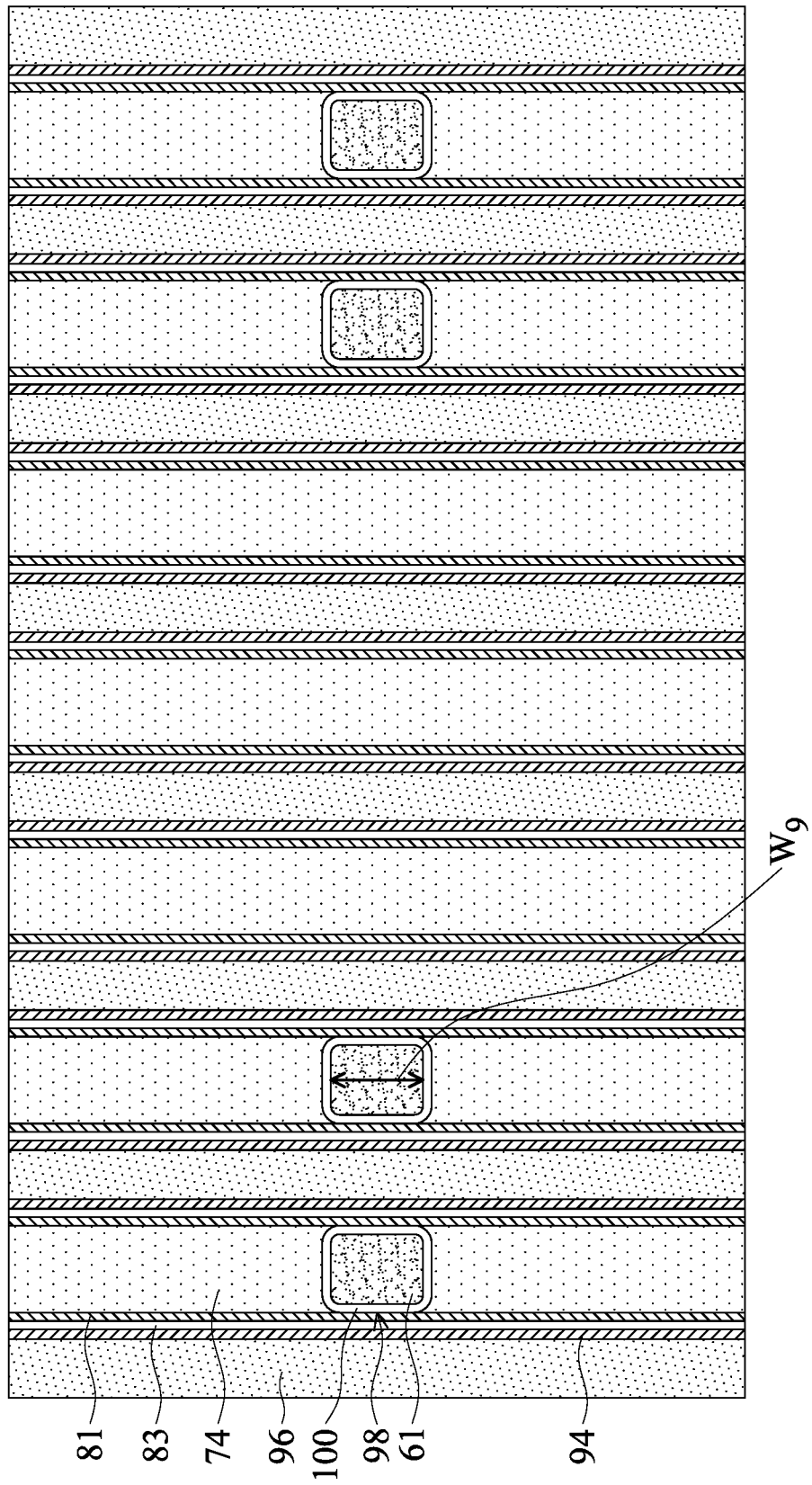
Figure 26D:
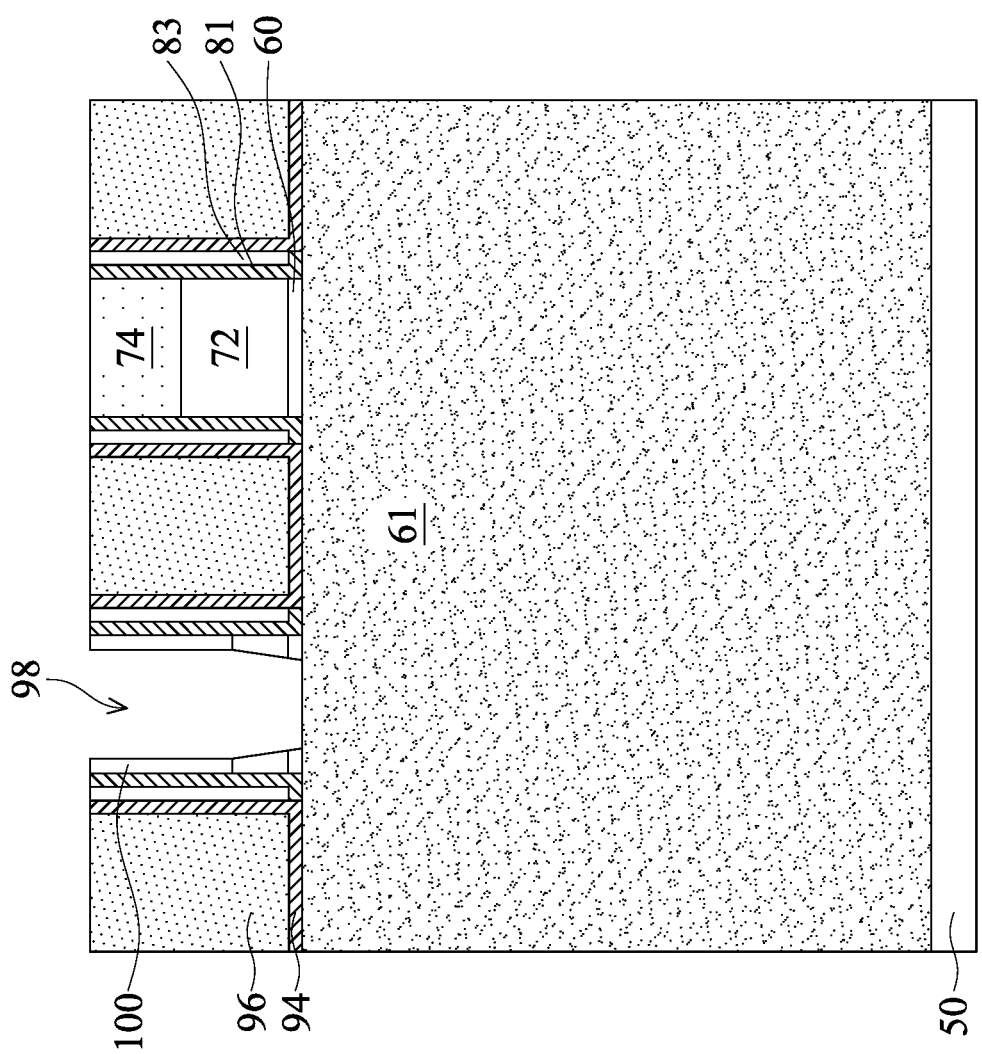
Figures 27A, 27B:
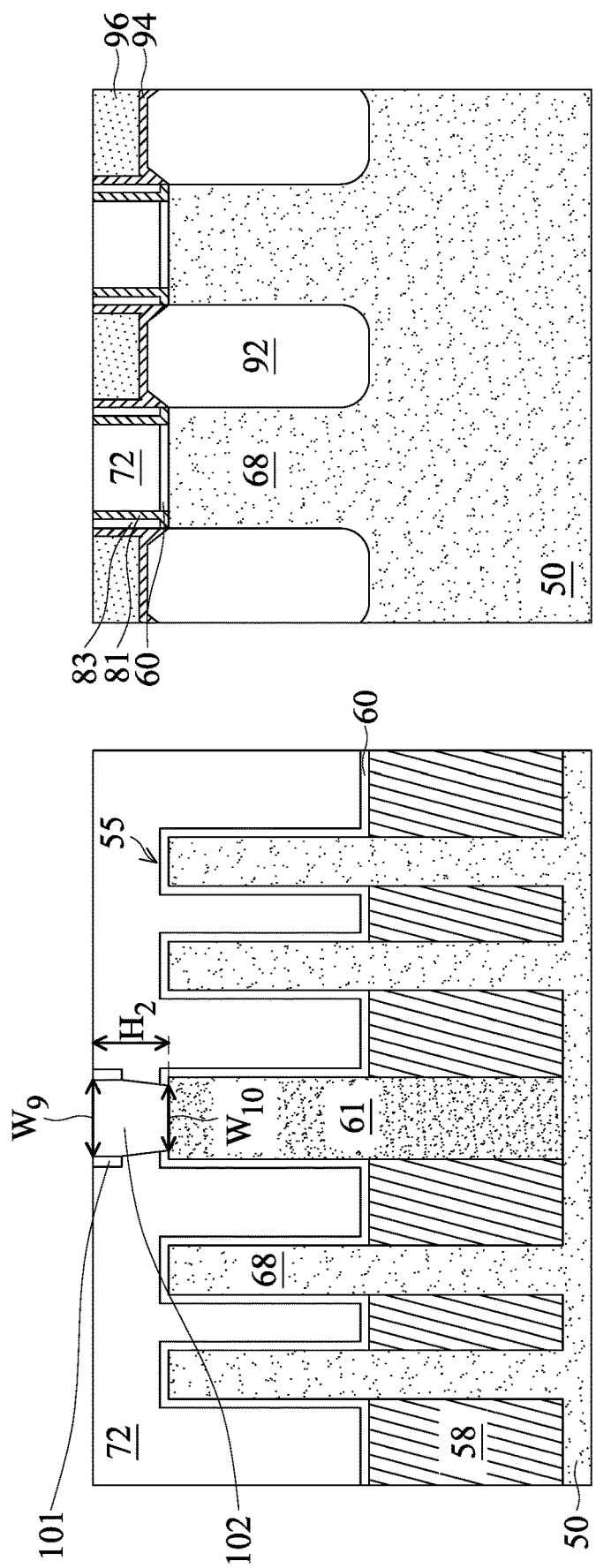
Figure 27C:
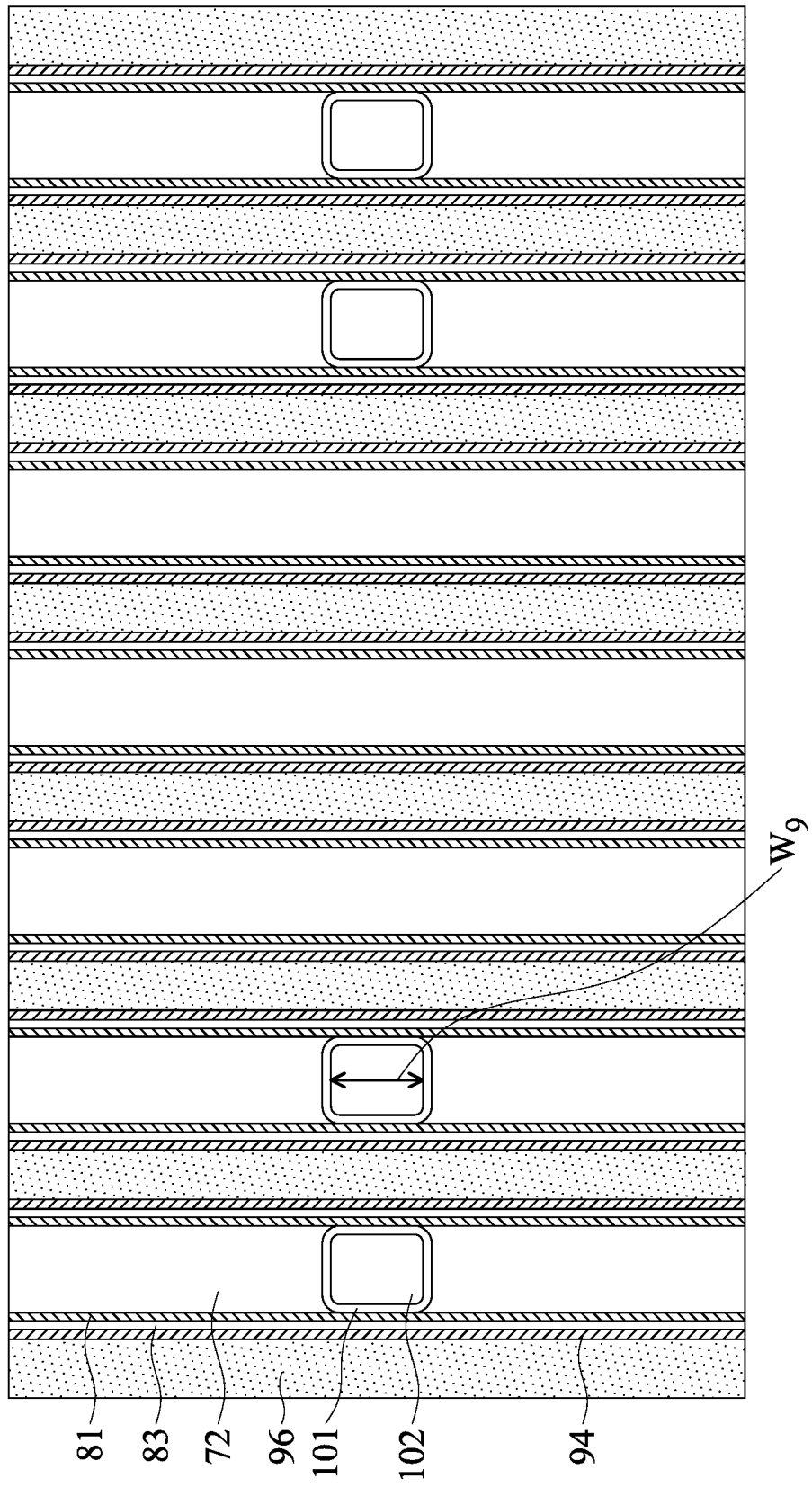
Figure 27D:
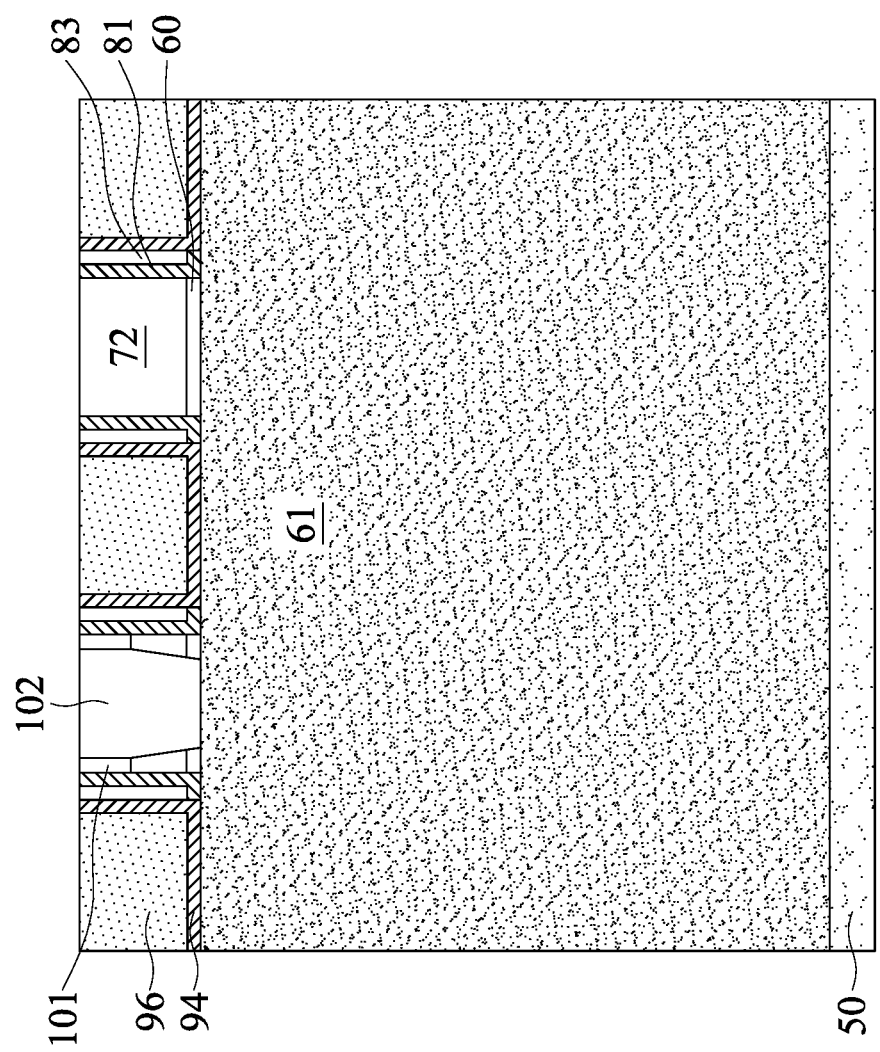

FIGS. 24A through 30B illustrate an embodiment in which the first dielectric layer 100 is formed of a material with low etch selectivity to the dummy gates 72. In FIGS. 24A through 24D, after the masks 74 are etched, as discussed above with respect to FIGS. 14A through 14D, the masks 74 are used as masks to etch the dummy gates 72, extending the first openings 98. The dummy gates 72 may be etched using anisotropic etching processes, such as RIE, NBE, or the like. As illustrated in FIGS. 24A and 24C, the first openings 98 may have a width $W_8$ in a direction perpendicular to a longitudinal axis of the dielectric fin 61. The width $W_8$ may range from about 30 nm to about 45 nm. The first openings 98 may extend a depth $D_2$ below top surfaces of the dummy gates 72 ranging from about 20 nm to about 30 nm.

In FIGS. 25A through 25D, a first dielectric layer 100 is deposited over the structures illustrated in FIGS. 24A through 24D, respectively. The first dielectric layer 100 may be deposited by a conformal deposition process, such as ALD, PEALD, thermal ALD or the like. The first dielectric layer 100 may comprise a material having a low etch selectivity relative to a material of the dummy gates 72. For example, in some embodiments, the dummy gates 72 may be formed of polycrystalline silicon or the like and the first dielectric layer 100 may be formed of polycrystalline silicon, amorphous silicon, another silicon-based material, or the like. The first dielectric layer 100 may be formed to a thickness $T_2$ ranging from about 3 nm to about 5 nm. Forming the first dielectric layer 100 to a thickness greater than 5 nm may require the first openings 98 to have greater widths and may cause increased difficulty in a process subsequently used to etch the first dielectric layer 100 (such as the process described below with respect to FIGS. 26A through 26D. Forming the first dielectric layer 100 to a thickness less than 3 nm may cause increased difficulty in the process used to deposit the first dielectric layer 100.

In FIGS. 26A through 26D, the first dielectric layer 100 and the dummy gates 72 are etched to extend the first openings 98 through the dummy gates 72. The first dielectric layer 100 and the dummy gates 72 may be etched using a suitable etching process, such as an anisotropic etching process (e.g., a dry etching process) or the like. In embodiments in which the dummy gates 72 and the first dielectric layer 100 comprise silicon-based materials, the dummy gates 72 and the first dielectric layer 100 may be etched by a dry etching process using fluorine, which selectively etch the material of the dummy gates 72 and the first dielectric layer 100 relative to the masks 74, the first ILD 96, the CESL 94, the first spacers 81, and the second spacers 83.

Following the etching, the first openings 98 may have the widths $W_9$ level with top surfaces of the masks 74, widths $W_{10}$ level with bottom surfaces of the dummy dielectric layers 60 on the dielectric fin 61, and depths $D_3$ between the top surfaces of the dummy gates 72 and the bottom surfaces of the dummy dielectric layers 60 on the dielectric fin 61. The widths $W_9$ may range from about 12 nm to about 16 nm; the widths $W_{10}$ may range from about 10 nm to about 20 nm; and the depths $D_3$ may range from about 80 nm to about 120 nm. Although the portions of the first openings 98 that are extended through the first dielectric layer 100 and the dummy gates 72 in FIGS. 26A through 26D are illustrated as having tapered profiles, the first openings 98 may have vertical sidewalls or reverse tapered profiles (widening in a direction from top surfaces of the first dielectric layer 100 toward the dielectric fin 61). Forming the first openings 98 and then narrowing the first openings 98 using the first dielectric layer 100 provides for greater control over the widths of the first openings 98 and reduces critical dimensions of the first openings 98, which helps to improve device performance, reduce device defects, and reduce feature size. Further, forming the first dielectric layer 100 of a material having low etch selectivity to a material of the dummy gates 72 allows for the first dielectric layer 100 and the dummy gates 72 to be etched simultaneously, reducing processing times and costs.

In FIGS. 27A through 27D, a gate isolation structure 102 is formed over the structures of FIGS. 26A through 26D, respectively. The gate isolation structure 102 may fill the first openings 98, extending along a top surface of the dielectric fin 61 and along side surfaces of the first dielectric layer 100, the dummy gates 72, and the dummy dielectric layers 60, and extending along top surfaces of the first ILD 96, the CESL 94, the second spacers 83, the masks 74, and the third spacers 101. The gate isolation structure 102 may be used to isolate portions of the dummy gates 72, which are subsequently replaced by gate electrodes (such as the gate electrodes 108, discussed below with respect to FIGS. 21A through 21D).

It is appreciated that although the dummy gates 72 are cut and the gate isolation structure 102 is formed before replacement gate stacks are formed in the illustrated embodiments, the replacement gate stacks may be cut and the gate isolation structure 102 formed after forming the replacement gate stacks. In some embodiments, the material of the gate isolation structure 102 may be deposited using a conformal deposition process, such as ALD, PEALD, thermal ALD, or the like. The gate isolation structure 102 may be formed of a dielectric material, such as silicon nitride, silicon oxide, silicon oxycarbide, silicon oxycarbonitride, combinations or multiple layers thereof, or the like.

Further in FIGS. 27A through 27D, a planarization process, such as a CMP, may be performed. The planarization process may separate the gate isolation structure 102 illustrated in into separate gate isolation structures 102 and level top surfaces of the gate isolation structures 102 and the first ILD 96 with top surfaces of the dummy gates 72. The planarization process may also remove the masks 74 on the dummy gates 72, portions of the first dielectric layer 100, portions of the second spacers 83, and portions of the CESL 94. After the planarization process, top surfaces of the dummy gates 72, the first dielectric layer 100, the first spacers 81, the second spacers 83, the gate isolation structures 102, the CESL 94 and the first ILD 96 are level. Accordingly, the top surfaces of the dummy gates 72 are exposed through the masks 74. Following the planarization process, top surfaces of the gate isolation structures 102 may have widths $W_9$ ranging from about 25 nm to about 30 nm, bottom surfaces of the gate isolation structures 102 may have widths $W_{10}$ ranging from about 10 nm to about 20 nm, and the gate isolation structures 102 may have heights $H_2$ ranging from about 60 nm to about 100 nm.

Figure 28B:
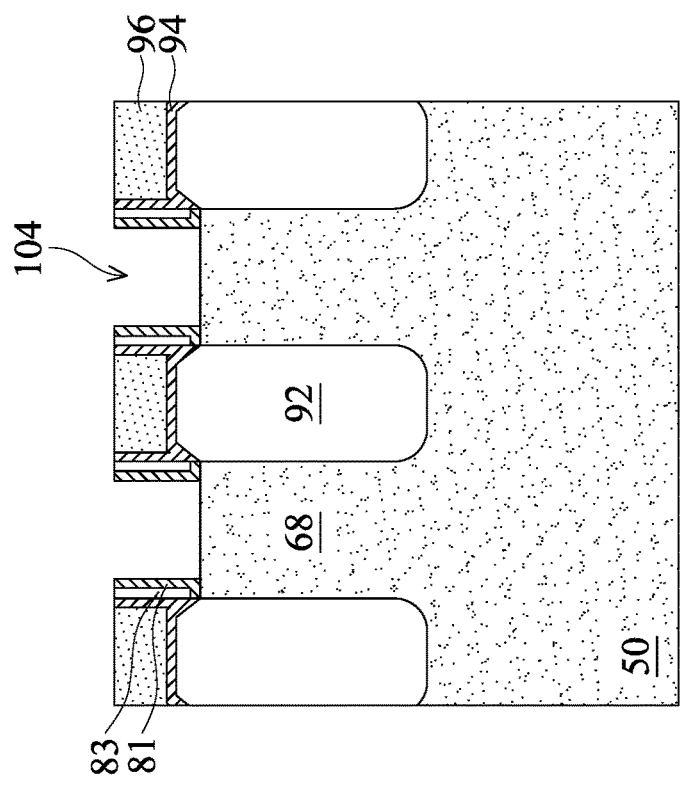
Figure 28A:
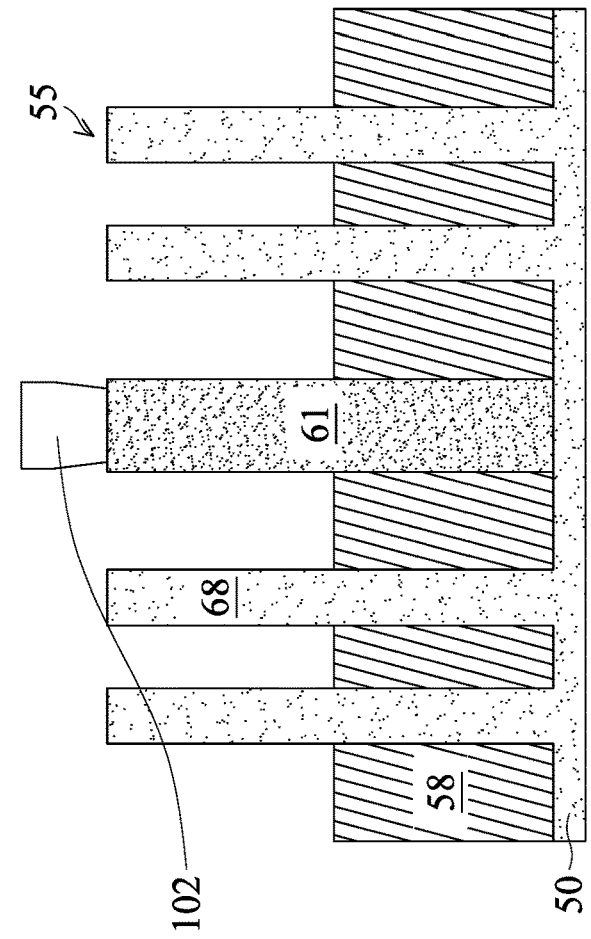
Figure 28C:
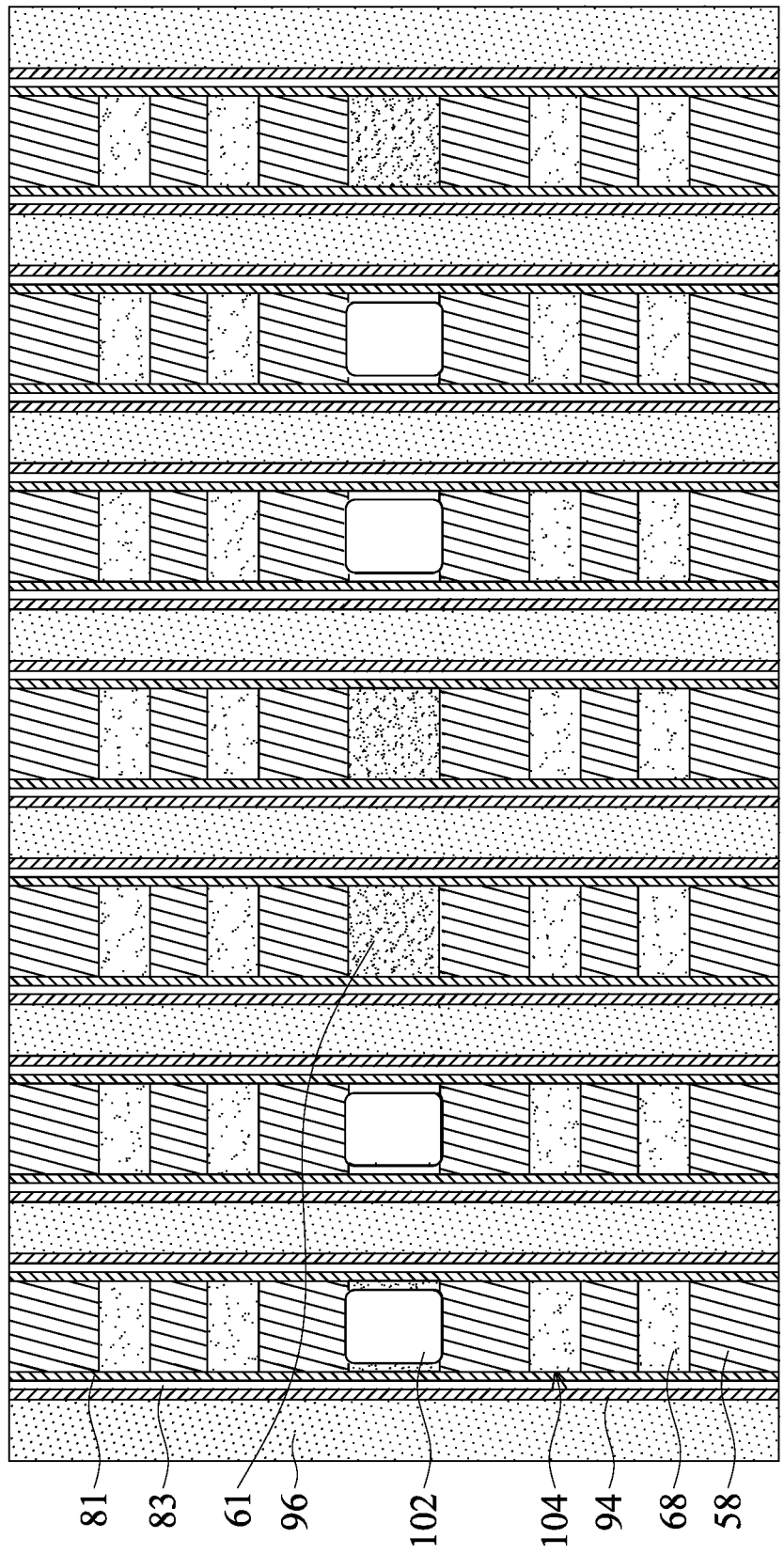
Figure 28D:
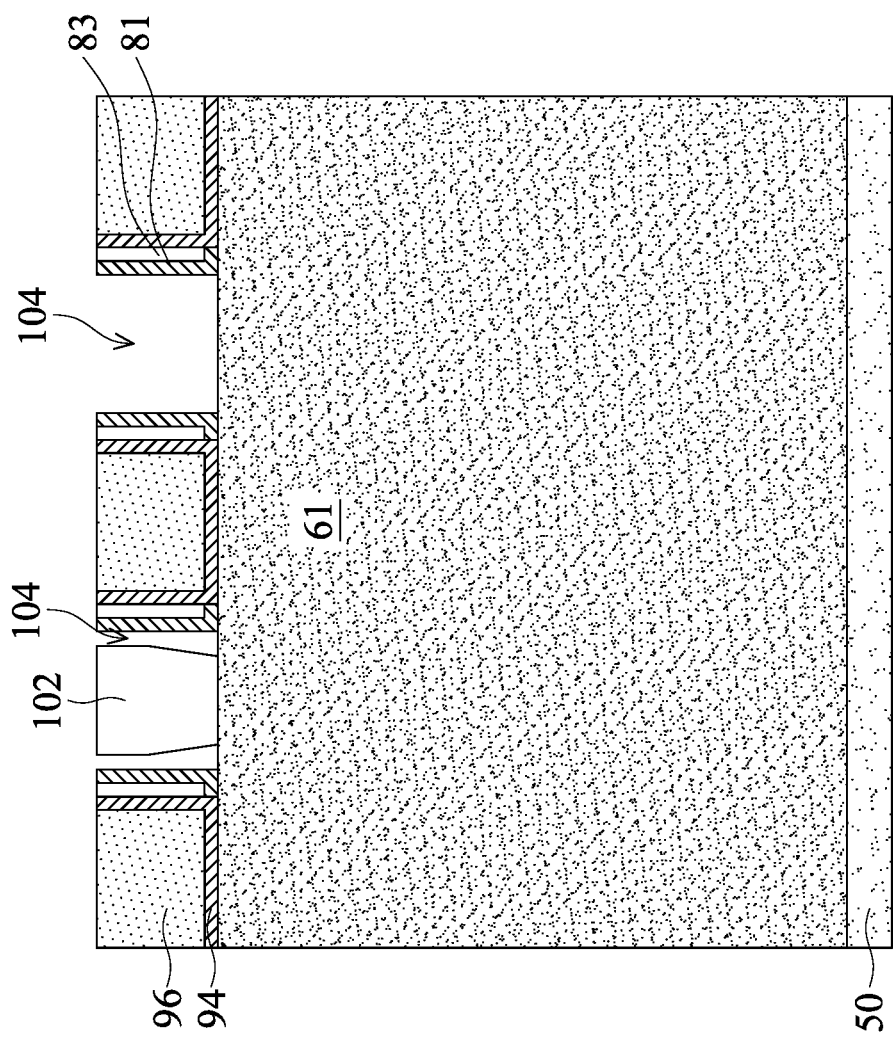

In FIGS. 28A through 28D, the dummy gates 72 and the first dielectric layer 100 are removed in an etching step(s), so that second recesses 104 are formed. Because the first dielectric layer 100 is formed of a material having a low etch selectivity to a material of the dummy gates 72, the dummy gates 72 and the first dielectric layer 100 may be removed simultaneously. Portions of the dummy dielectric layers 60 in the second recesses 104 may also be removed. In some embodiments, the dummy gates 72 and the first dielectric layer 100 are removed, the dummy dielectric layers 60 remain, and the dummy dielectric layers 60 are exposed by the second recesses 104. In some embodiments, the dummy dielectric layers 60 are removed from second recesses 104 in a first region of a die (e.g., a core logic region) and the dummy dielectric layers 60 remain in second recesses 104 in a second region of the die (e.g., an input/output region). In some embodiments, the dummy gates 72 and the first dielectric layer 100 are removed by an anisotropic dry etch process. For example, the etching process may include a dry etch process using reaction gas(es) that selectively etch the dummy gates 72 and the first dielectric layer 100 at a faster rate than the first ILD 96, the CESL 94, the first spacers 81, or the second spacers 83. Each of the second recesses 104 exposes and/or overlies a channel region 68 of a respective fin 55. Each channel region 68 is disposed between neighboring pairs of the epitaxial source/drain regions 92. During the removal, the dummy dielectric layers 60 may be used as an etch stop layer when the dummy gates 72 and the first dielectric layer 100 are etched. The dummy dielectric layers 60 may be optionally removed after removing the dummy gates 72 and the first dielectric layer 100. As illustrated in FIGS. 28C and 28D, the second recesses 104 may separate the gate isolation structures 102 from the first spacers 81.

Figure 29C:
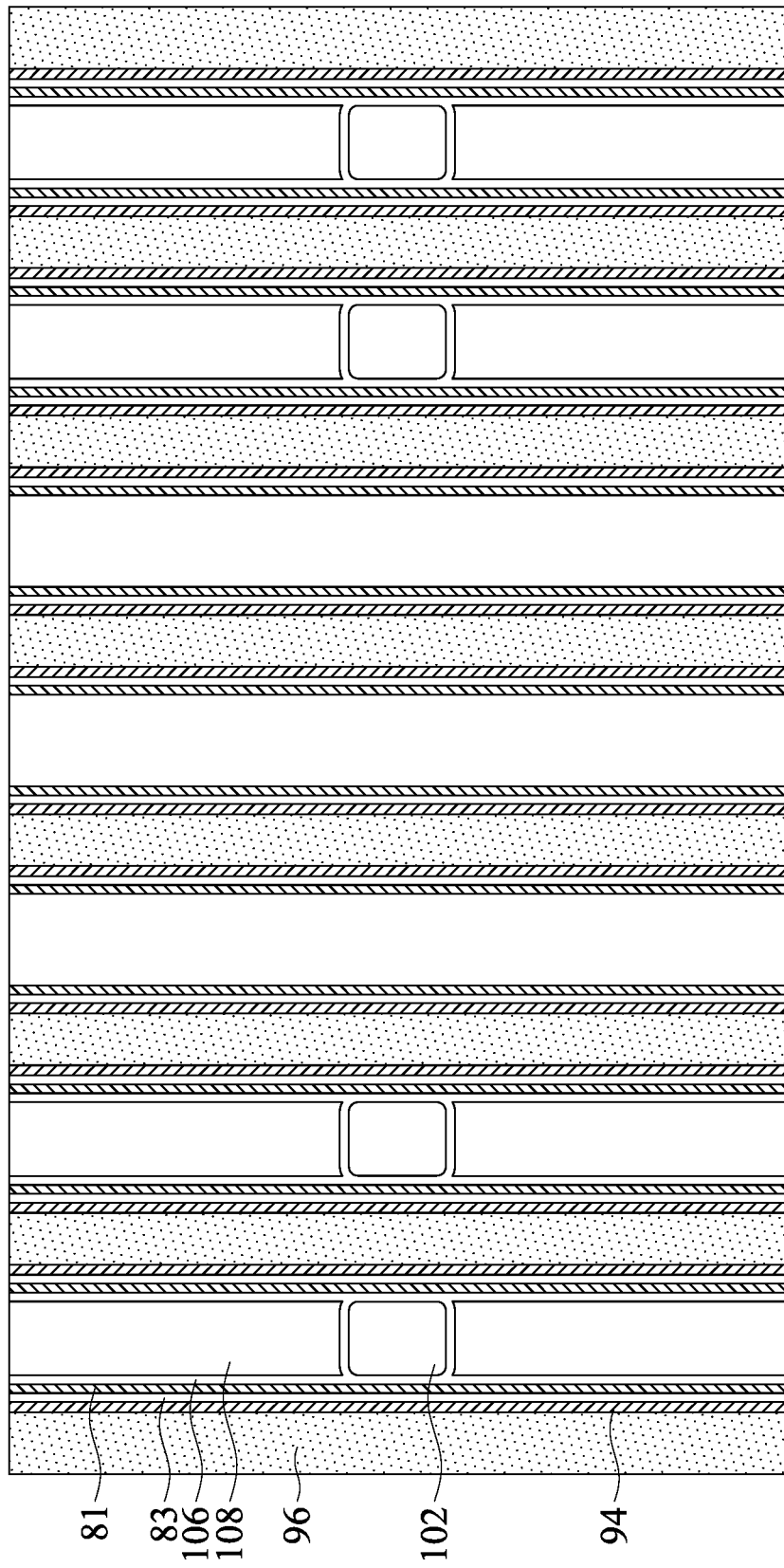
Figure 29D:
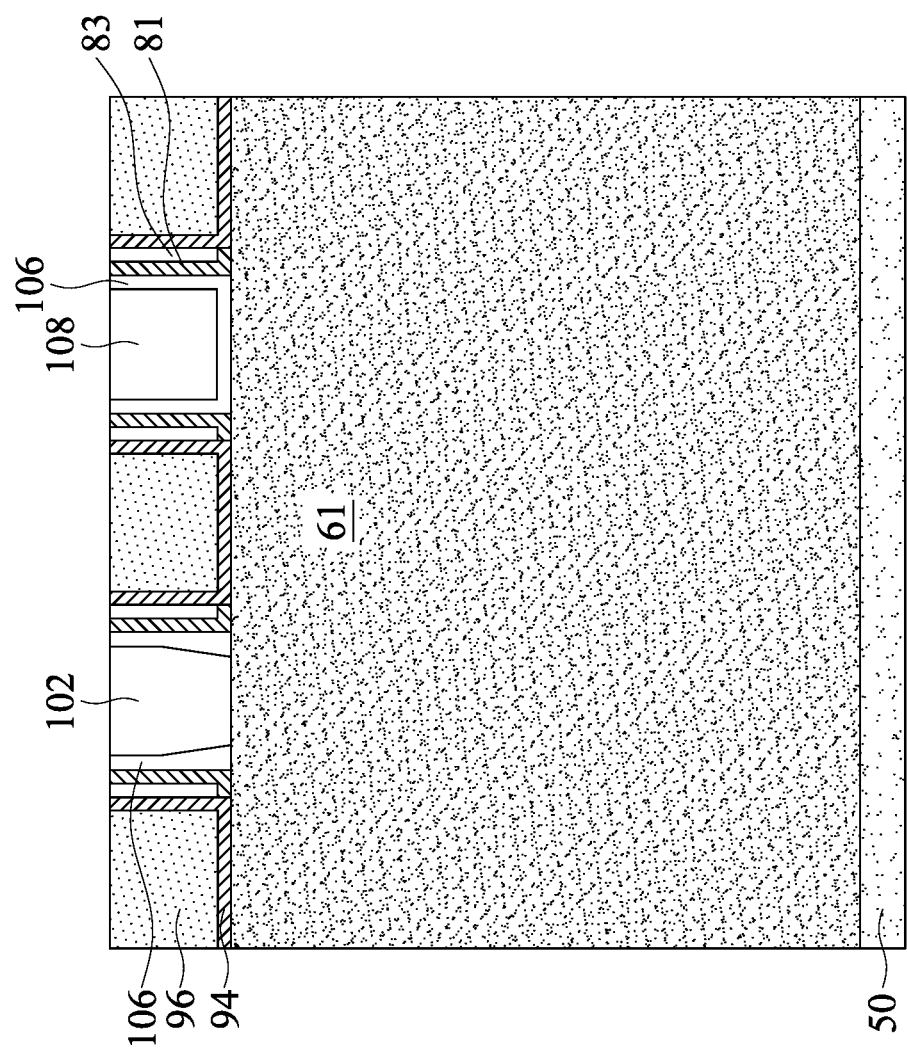

In FIGS. 29A through 29D, gate dielectric layers 106 and gate electrodes 108 are formed for replacement gates. The gate dielectric layers 106 may be formed by depositing one or more layers in the second recesses 104, such as on top surfaces and sidewalls of the fins 55, the first spacers 81, and the gate isolation structures 102, and on top surfaces of the STI regions 58, the first ILD 96, the CESL 94, and the second spacers 83. The gate dielectric layers 106 may be formed of materials and processes the same as or similar to those discussed above with respect to FIGS. 21A through 21D. As illustrated in FIGS. 29C and 29D, the gate dielectric layers 106 may fill the portions of the second recesses 104 separating the gate isolation structures 102 from the first spacers 81.

The gate electrodes 108 are deposited over the gate dielectric layers 106 and fill remaining portions of the second recesses 104. The gate electrodes 108 may be formed of materials and processes the same as or similar to those discussed above with respect to FIGS. 21A through 21D. After the filling of the second recesses 104, a planarization process, such as a CMP, is performed to remove excess portions of the gate dielectric layers 106 and the gate electrodes 108, which excess portions are over top surfaces of the first ILD 96, the CESL 94, the first spacers 81, the second spacers 83, and the gate isolation structures 102. The remaining portions of the gate electrodes 108 and the gate dielectric layers 106 form replacement gates of the resulting FinFETs. The gate electrodes 108 and the gate dielectric layers 106 may be collectively referred to as "gate stacks." The gate stacks may extend along sidewalls of the channel regions 68 of the fins 55.

In FIGS. 30A and 30B, a second ILD 112 is deposited over the first ILD 96, the CESL 94, the first spacers 81, the second spacers 83, the gate isolation structures 102, the gate dielectric layers 106, and the gate electrodes 108. In some embodiments, the second ILD 112 is a flowable film formed by FCVD. In some embodiments, the second ILD 112 is formed of a dielectric material such as PSG, BSG, BPSG, USG, or the like, and may be deposited by any suitable method, such as CVD, PECVD, or the like. In some embodiments, the dielectric materials for the second ILD 112 may include silicon oxide, silicon nitride, silicon oxynitride, or the like. In some embodiments, before the formation of the second ILD 112, the gate stacks (including the gate dielectric layers 106 and the corresponding overlying gate electrodes 108) are recessed, so that recesses are formed directly over each of the respective gate stacks and between opposing portions of the first spacers 81. A gate mask 110 comprising one or more layers of dielectric material, such as silicon nitride, silicon oxynitride, or the like, is filled in the recess, followed by a planarization process to remove excess portions of the dielectric material extending over the first ILD 96, the CESL 94, the gate isolation regions 103, the first spacers 81, and the second spacers 83.

Further in FIGS. 30A and 30B, gate contacts 114 are formed through the second ILD 112 and the gate masks 110 and source/drain contacts 116 are formed through the second ILD 112. Openings for the source/drain contacts 116 are formed through the second ILD 112 and openings for the gate contacts 114 are formed through the second ILD 112 and the gate mask 110. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 112. The remaining liner and conductive material form the source/drain contacts 116 and the gate contacts 114 in the openings. The source/drain contacts 116 are electrically coupled to the epitaxial source/drain regions 92 and the gate contacts 114 are electrically coupled to the gate electrodes 108. The source/drain contacts 116 and the gate contacts 114 may be formed in different processes, or may be formed in the same process. Although shown as being formed in the same cross-sections, it should be appreciated that each of the source/drain contacts 116 and the gate contacts 114 may be formed in different cross-sections, which may avoid shorting of the contacts.

Embodiments may achieve various advantages. For example, forming the first openings 98 through the masks 74 and partially through the dummy gates 72, conformally depositing the first dielectric layer 100 in the first openings 98, and anisotropically etching the first dielectric layer 100 allows a critical dimension of the first openings 98 to be reduced and provides better control over the critical dimension of the first openings 98. This reduces device defects and improves device performance. Further, forming the first dielectric layer 100 of a material having low etch selectivity to a material of the dummy gates 72 allows for the first dielectric layer 100 and the dummy gates 72 to be etched simultaneously, reducing processing times and costs. Gate isolation structures 102 are subsequently formed in the first openings 98 and may be used to isolate adjacent gate stacks from one another.

Figure 31:
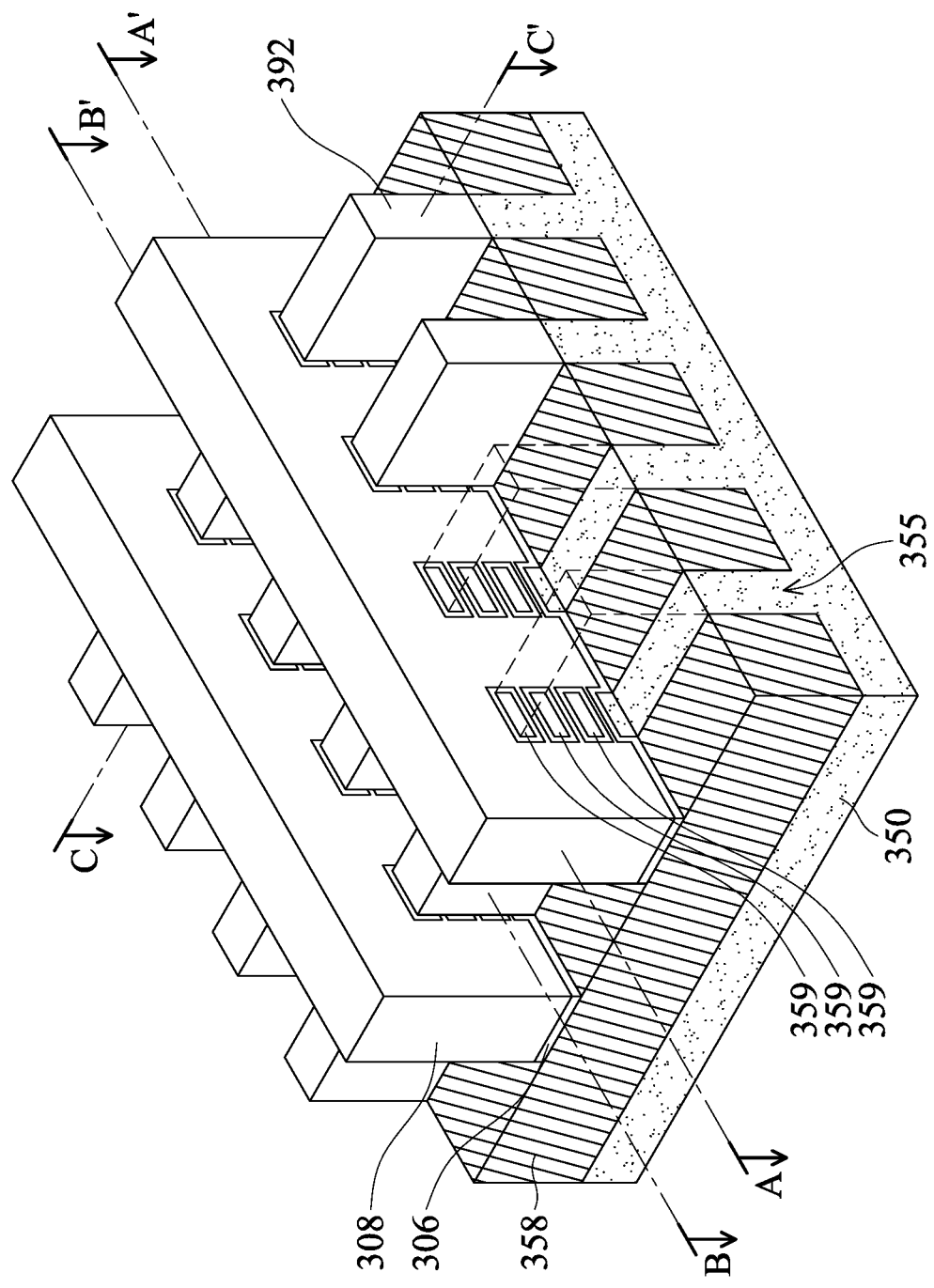
FIG. 31 illustrates an example of a semiconductor device including nanostructure field-effect transistors (nano-FETs) in a three-dimensional view, in accordance with some embodiments.

The disclosed FinFET embodiments could also be applied to nanostructure devices such as nanowire FETs, nanosheet FETs (nano-FETs), or the like. FIG. 31 illustrates an example of nano-FETs in a three-dimensional view, in accordance with some embodiments. The nano-FETs comprise nanostructures 359 (e.g., nanosheets, nanowire, or the like) over fins 366 on a substrate 350 (e.g., a semiconductor substrate). The nanostructures 359 act as channel regions for the nano-FETs. The nanostructures 359 may include p-type nanostructures, n-type nanostructures, or a combination thereof. Isolation regions 358 are disposed between adjacent fins 366, which may protrude above and from between neighboring isolation regions 358. Although the isolation regions 358 are described/illustrated as being separate from the substrate 350, as used herein, the term "substrate" may refer to the semiconductor substrate alone or a combination of the semiconductor substrate and the isolation regions. Additionally, although bottom portions of the fins 366 are illustrated as being single, continuous materials with the substrate 350, the bottom portions of the fins 366 and/or the substrate 350 may comprise single materials or a plurality of materials. In this context, the fins 366 refer to the portion extending between the neighboring isolation regions 358.

Gate dielectric layers 306 are along top surfaces and sidewalls of the fins 366, along top surfaces, sidewalls, and bottom surfaces of the nanostructures 359, and along top surfaces of the isolation regions 358. Gate electrodes 308 are over the gate dielectric layers 306. Epitaxial source/drain regions 392 are disposed on the fins 366 on opposing sides of the gate dielectric layers 306 and the gate electrodes 308.

FIG. 31 further illustrates reference cross-sections that are used in later figures. Cross-section A-A' is along a longitudinal axis of a gate electrode 306 and in a direction, for example, perpendicular to the direction of current flow between the epitaxial source/drain regions 392 of a nano-FET. Cross-section B-B' is perpendicular to cross-section A-A' and is parallel to a longitudinal axis of a fin 366 of the nano-FET and in a direction of, for example, a current flow between the epitaxial source/drain regions 392 of the nano-FET. Subsequent figures refer to these reference cross-sections for clarity.

FIGS. 32 through 41B are cross-sectional views of intermediate stages in the manufacturing of nano-FETs, in accordance with some embodiments. FIGS. 32, 33, 34, 35A, 36A, 37A, 38A, 39A, 40A, and 41A are illustrated along reference cross-section A-A' illustrated in FIG. 31. FIGS. 35B, 36B, 37B, 38B, 39B, 40B, and 41B are illustrated along reference cross-section B-B' illustrated in FIG. 31. FIGS. 35C, 36C, 37D, 38C, and 39C are illustrated along reference cross-section D-D', parallel to cross-section B-B', and illustrated in FIG. 37C. FIG. 37C is a top-down view.

Figure 32:
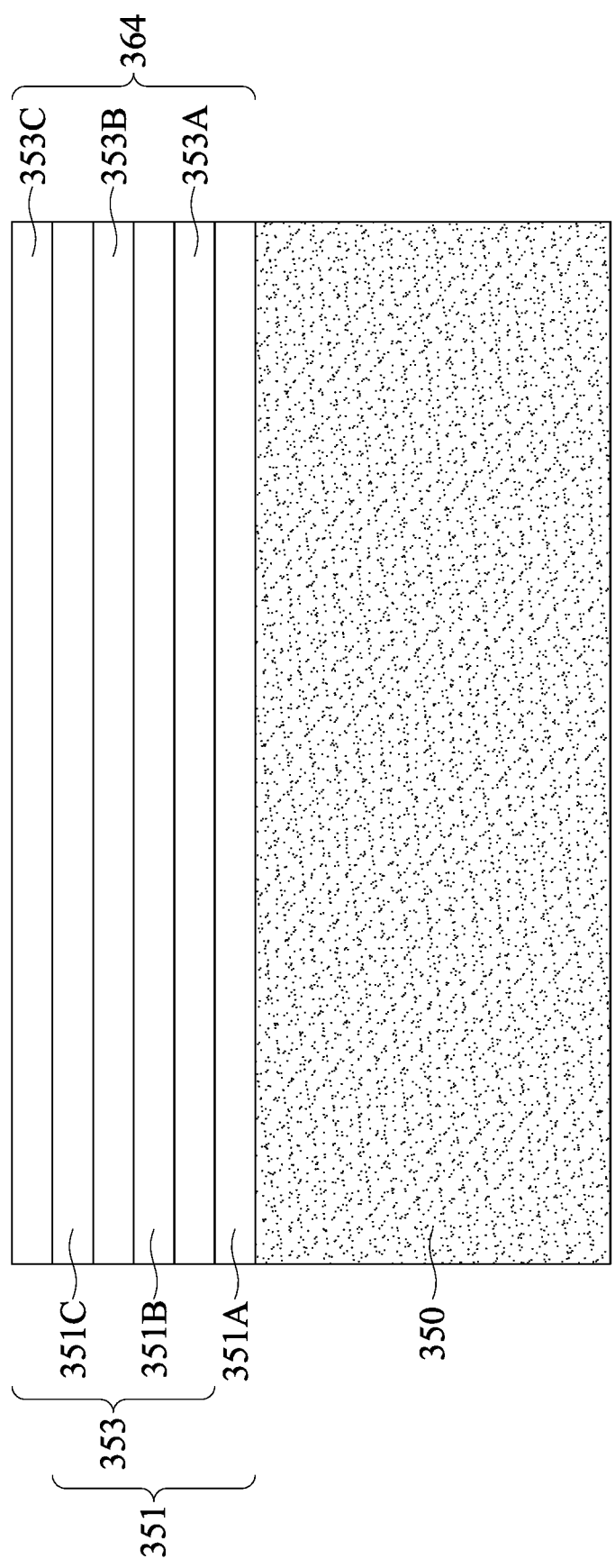

In FIG. 32, a substrate 350 is provided. The substrate 350 may be the same as or similar to the substrate 50, discussed above with respect to FIG. 2. Although not separately illustrated, the substrate 350 may include an n-type region for forming n-type devices, such as NMOS transistors, e.g., n-type nano-FETs, and a p-type region for forming p-type devices, such as PMOS transistors, e.g., p-type nano-FETs.

A multi-layer stack 364 is formed over the substrate 350. The multi-layer stack 364 includes alternating layers of first semiconductor layers 351A-C (collectively referred to as first semiconductor layers 351) and second semiconductor layers 353A-C (collectively referred to as second semiconductor layers 353). For purposes of illustration and as discussed in greater detail below, the first semiconductor layers 351 will be removed and the second semiconductor layers 353 will be patterned to form channel regions of nano-FETs in the n-type region and the p-type region. In such embodiments, the channel regions in both the n-type region and the p-type region may have a same material composition (e.g., silicon, or the another semiconductor material) and may be formed simultaneously.

The multi-layer stack 364 is illustrated as including three layers of the first semiconductor layers 351 and three layers of the second semiconductor layers 353 for illustrative purposes. In some embodiments, the multi-layer stack 364 may include any number of the first semiconductor layers 351 and the second semiconductor layers 353. Each of the layers of the multi-layer stack 364 may be epitaxially grown using a process such as CVD, ALD, VPE, MBE, or the like. In some embodiments, the first semiconductor layers 351 may be formed of a first semiconductor material, such as silicon germanium or the like, and the second semiconductor layers 353 may be formed of a second semiconductor material, such as silicon, silicon carbide, or the like. The multi-layer stack 364 is illustrated as having a bottommost first semiconductor layer 351 formed of the first semiconductor material for illustrative purposes. In some embodiments, the multi-layer stack 364 may be formed having a bottommost second semiconductor layer 353 formed of the second semiconductor material.

The first semiconductor materials and the second semiconductor materials may be materials having a high etch selectivity to one another. As such, the first semiconductor layers 351 of the first semiconductor material may be removed without significantly removing the second semiconductor layers 353 of the second semiconductor material. This allows the second semiconductor layers 353 to be patterned to form channel regions of nano-FETs. Similarly, in embodiments in which the second semiconductor layers 353 are removed and the first semiconductor layers 351 are patterned to form channel regions, the second semiconductor layers 353 of the second semiconductor material may be removed without significantly removing the first semiconductor layers 351 of the first semiconductor material. This allows the first semiconductor layers 351 to be patterned to form channel regions of nano-FETs.

Figure 33:
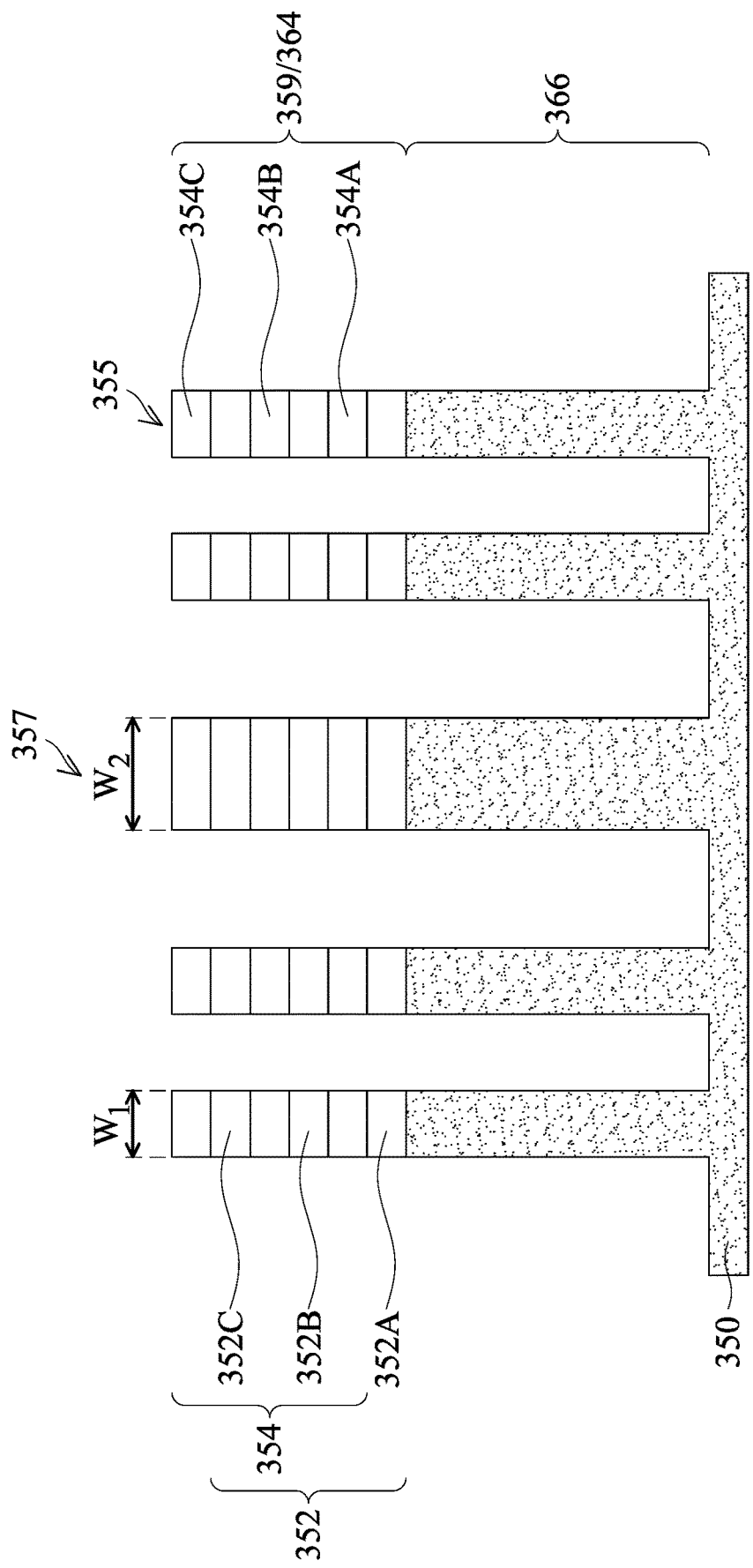

In FIG. 33, fins 366 are formed in the substrate 350 and nanostructures 359 are formed in the multi-layer stack 364. In some embodiments, the nanostructures 359 and the fins 366 may be formed in the multi-layer stack 364 and the substrate 350, respectively, by etching trenches in the multi-layer stack 364 and the substrate 350. The etching may be any acceptable etch process, such as a reactive ion etching (RIE), neutral beam etching (NBE), the like, or a combination thereof. The etching may be anisotropic. Forming the nanostructures 359 by etching the multi-layer stack 364 may further define first nanostructures 352A-C (collectively referred to as first nanostructures 352) from the first semiconductor layers 351 and define second nanostructures 354A-C (collectively referred to as second nanostructures 354) from the second semiconductor layers 353. The first nanostructures 352 and the second nanostructures 354 may be collectively referred to as nanostructures 359. The fins 366 and the nanostructures 359 may be patterned using processes the same as or similar to those discussed above with respect to FIG. 3 for forming the fins 55 and the dummy fin 57.

The fins 366 and the nanostructures 359 may be patterned to form channel structures 355 and a dummy structure 357. As will be discussed below with respect to FIG. 34, the dummy structure 357 may be replaced by subsequent processing. The channel structures 355 may have widths $W_1$ ranging from about 5 nm to about 15 nm, the dummy structure 357 may have a width $W_2$ ranging from about 10 nm to about 20 nm, and a ratio of the width $W_2$ to the widths $W_1$ may range from about 2 to about 4.

Figure 34:
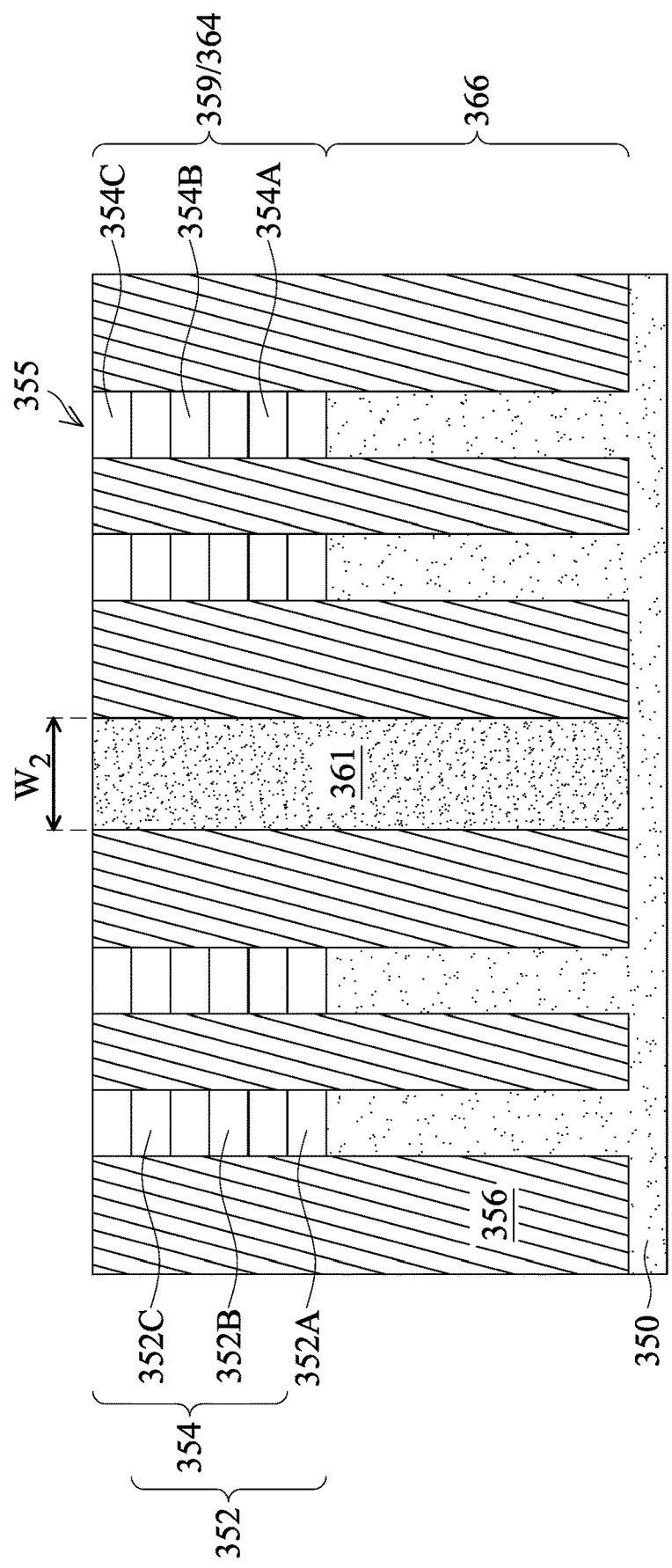

In FIG. 34, an insulation material 356 is formed surrounding the fins 366 and the nanostructures 359 and the dummy structure 357 is replaced by a dielectric fin 361 (sometimes referred to as a hybrid fin 361 or a fin isolation structure 361). The insulation material 356 may be the same as or similar to the insulation material 56 discussed above with respect to FIG. 4. The dielectric fin 361 may be formed by etching the dummy structure 357, including the nanostructures 359 and the fin 366, to form a recess in the insulation material 356, then filling the recess with a dielectric material. The dielectric fin 361 may be deposited by chemical vapor deposition (CVD), atomic layer deposition (ALD), or the like. The dielectric material may comprise silicon nitride, silicon oxide, combinations or multiple layers thereof, or the like. In some embodiments, the dielectric fin 361 may be formed of doped silicon nitride (e.g., silicon nitride doped with carbon (C), oxygen (O), combinations thereof, or the like). In some embodiments, the dielectric fin 361 may be formed of a dielectric material having a high etch selectivity relative to the materials of the insulation material 356 and to the materials of subsequently formed dummy gates (such as the dummy gates 372, discussed below with respect to FIGS. 35A through 35C). The bottom surface of the dielectric fin 361 may be disposed higher than, lower than, or level with bottom surfaces of the insulation material 356. After the dielectric fin 361 is deposited, a removal process, such as a CMP, an etch-back process, or the like, may be performed to planarize the dielectric fin 361, the insulation material 356, and the nanostructures 359. The dielectric fin 361 may have the width $W_2$ ranging from about 10 nm to about 20 nm.

Figures 35A, 35B:
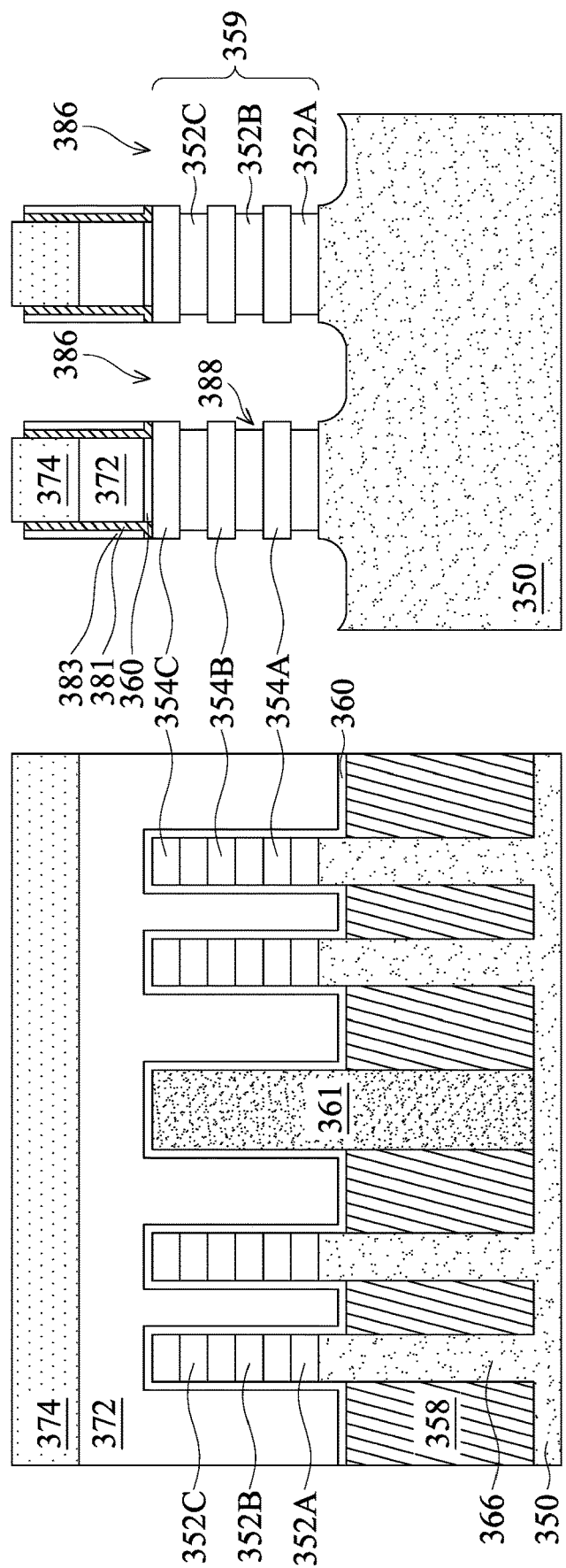
Figure 35C:
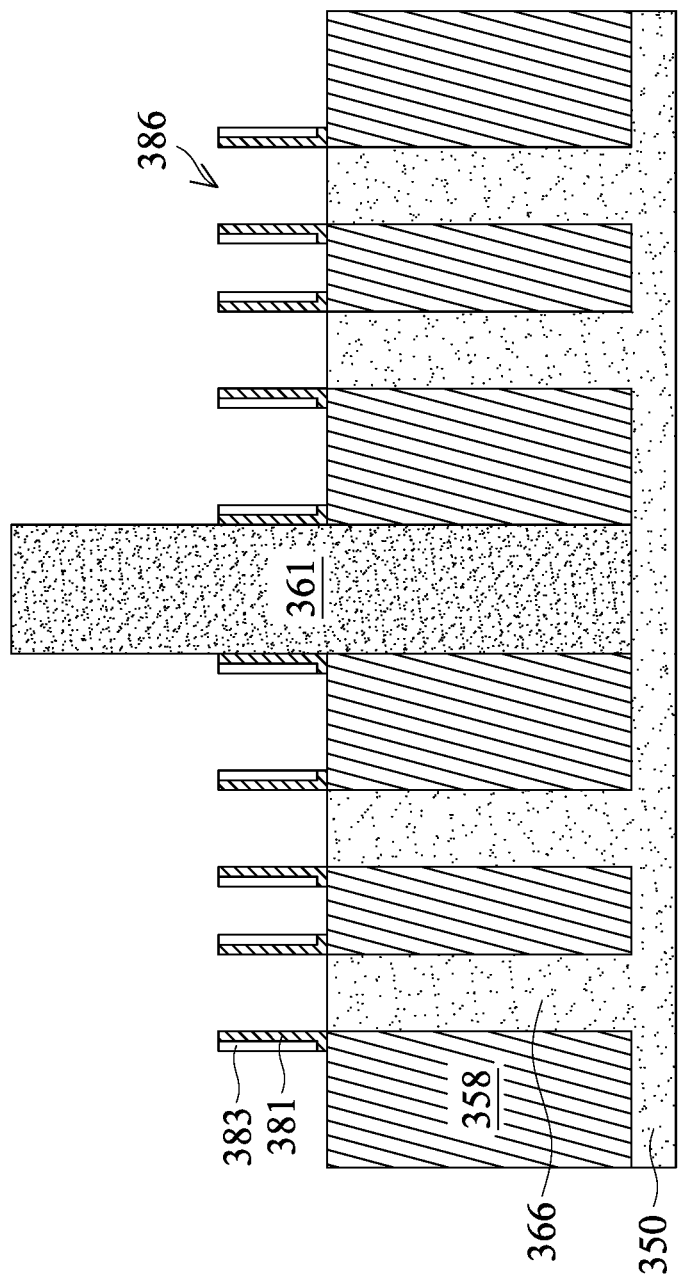

In FIGS. 35A through 35C, processes the same as or similar to those discussed above with respect to FIGS. 6 through 11C are performed to form STI regions 358 (similar to or the same as the STI regions 58) adjacent the fins 366; dummy dielectric layers 360 (similar to or the same as the dummy dielectric layers 60), dummy gates 372 (similar to or the same as the dummy gates 72), and masks 374 (similar to or the same as the masks 74) over the nanostructures 359, the fins 366, and the STI regions 358; first spacers 381 (similar to or the same as the first spacers 81) and second spacers 383 (similar to or the same as the second spacers 83) adjacent the dummy dielectric layers 360, the dummy gates 372, and the masks 374; and first recesses 386 (similar to or the same as the first recesses 86) adjacent the first spacers 381 and the second spacers 383. The first recesses 386 may extend through the first nanostructures 352 and the second nanostructures 354, and into the substrate 350. As illustrated in FIG. 35C, top surfaces of the STI regions 358 may be level with bottom surfaces of the first recesses 386. In some embodiments, the fins 366 may be etched such that bottom surfaces of the first recesses 386 are disposed below the top surfaces of the STI regions 358 or the like.

Further in FIGS. 35A through 35C, portions of sidewalls of the layers of the multi-layer stack 364 formed of the first semiconductor materials (e.g., the first nanostructures 352) exposed by the first recesses 386 are etched to form sidewall recesses 388. Although sidewalls of the first nanostructures 352 adjacent the sidewall recesses 388 are illustrated as being straight in FIG. 35B, the sidewalls may be concave or convex. The sidewalls may be etched using isotropic etching processes, such as wet etching or the like. In an embodiment in which the first nanostructures 352 include, e.g., SiGe, and the second nanostructures 354 include, e.g., Si or SiC, a wet or dry etch process with hydrogen fluoride, another fluorine-based etchant, or the like may be used to etch sidewalls of the second nanostructures 354.

Figures 36A, 36B:
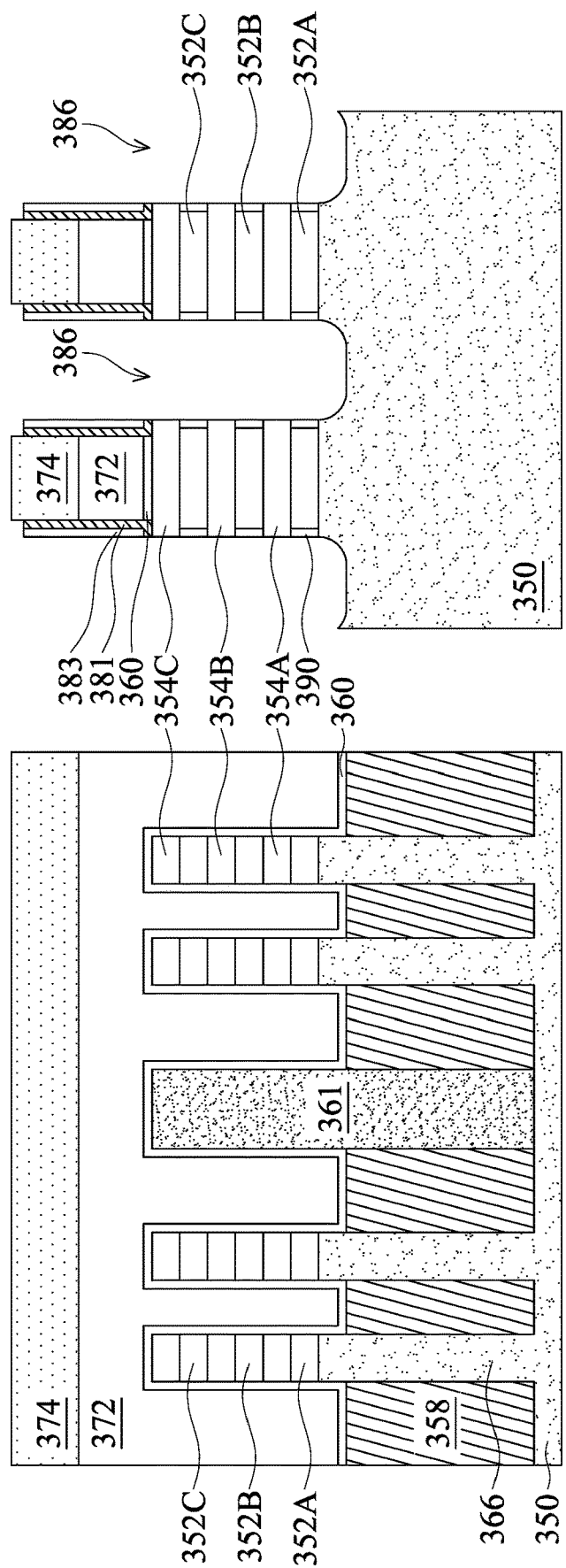
Figure 36C:
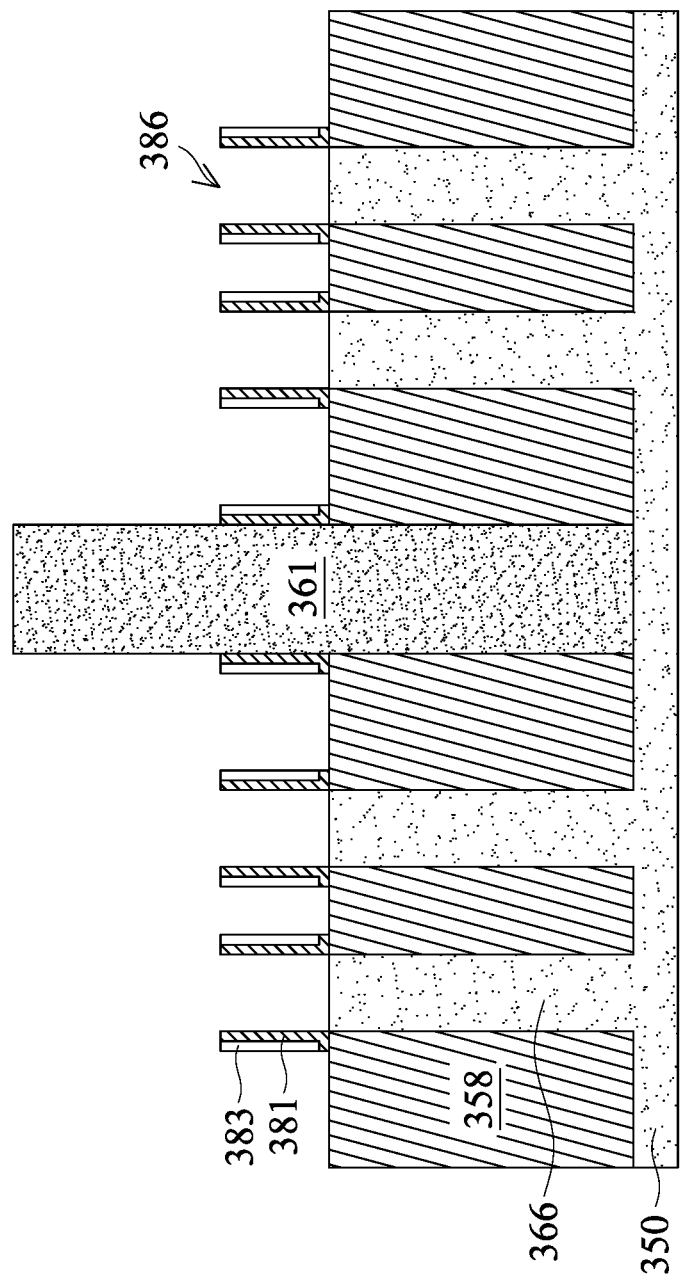

In FIGS. 36A through 36C, first inner spacers 390 are formed in the sidewall recess 388. The first inner spacers 390 may be formed by depositing an inner spacer layer (not separately illustrated) over the structures illustrated in FIGS. 35A through 35C. The first inner spacers 390 act as isolation features between subsequently formed source/drain regions and gate structures. As will be discussed in greater detail below, the source/drain regions will be formed in the first recesses 386, while the second nanostructures 354 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 390. Although outer sidewalls of the first inner spacers 390 are illustrated as being flush with sidewalls of the first nanostructures 352, the outer sidewalls of the first inner spacers 390 may extend beyond or be recessed from the sidewalls of the first nanostructures 352. Moreover, although the outer sidewalls of the first inner spacers 390 are illustrated as being straight in FIG. 36B, the outer sidewalls of the first inner spacers 390 may be concave or convex. The inner spacer layer may be etched by an anisotropic etching process, such as RIE, NBE, or the like. The first inner spacers 390 may be used to prevent damage to subsequently formed source/drain regions (such as the epitaxial source/drain regions 392, discussed below with respect to FIGS. 37A through 37C) by subsequent etching processes, such as etching processes used to form gate structures.

Figures 37A, 37B:
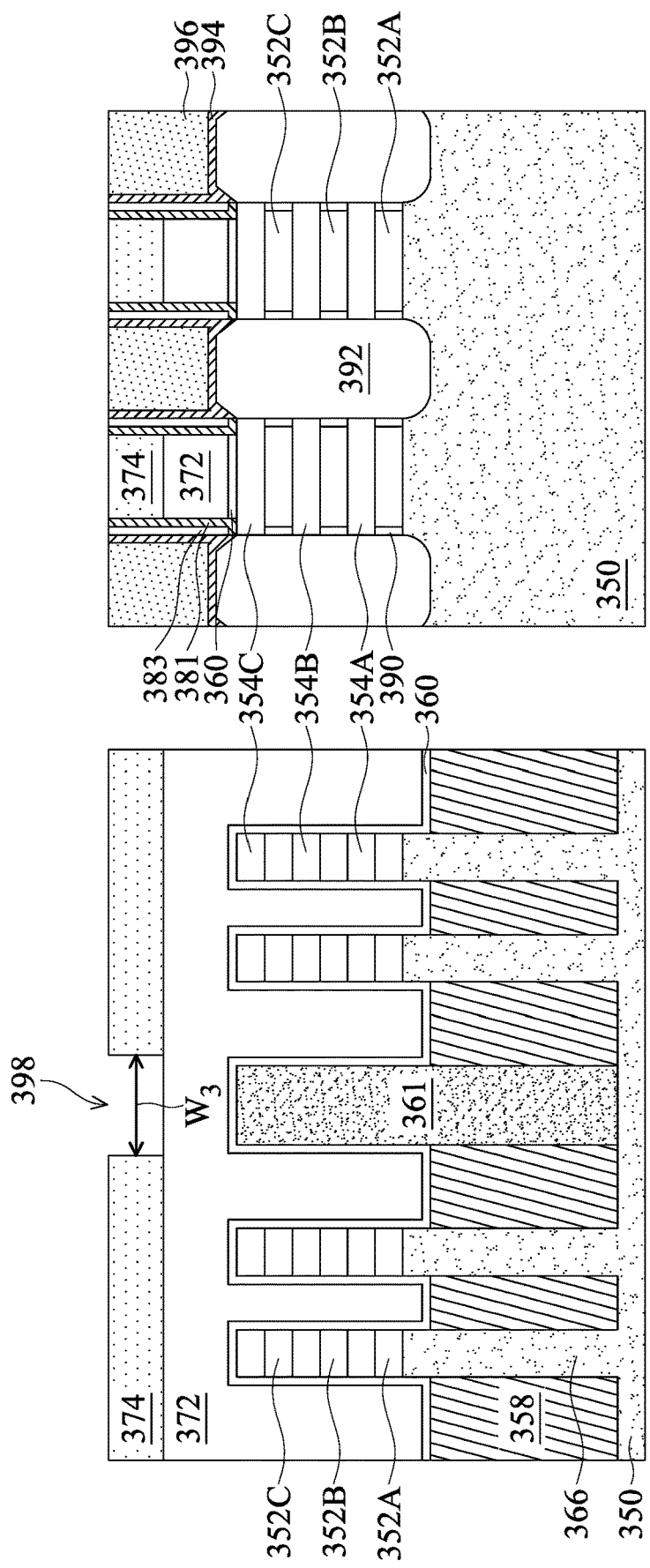
Figure 37C:
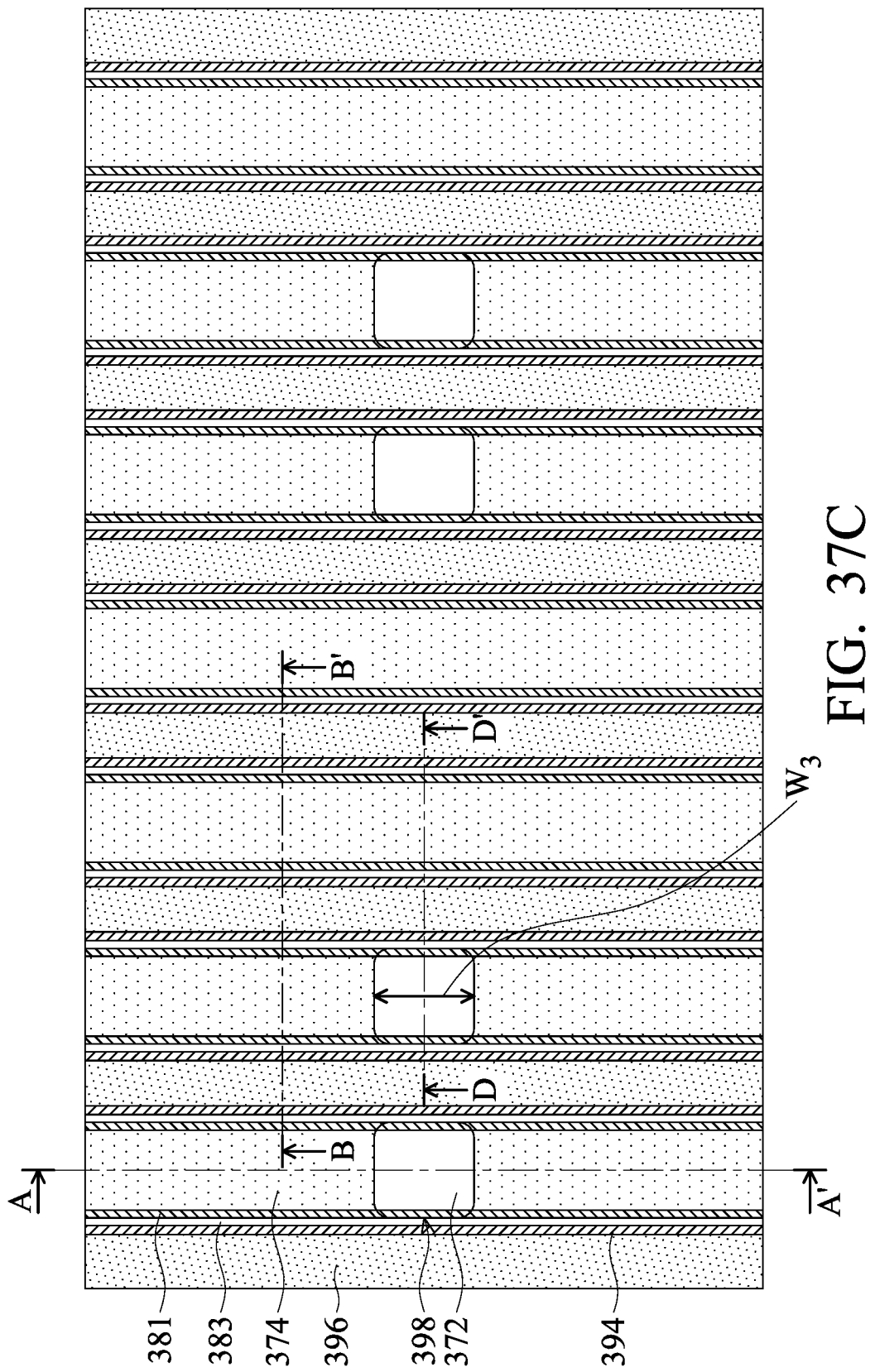
Figure 37D:
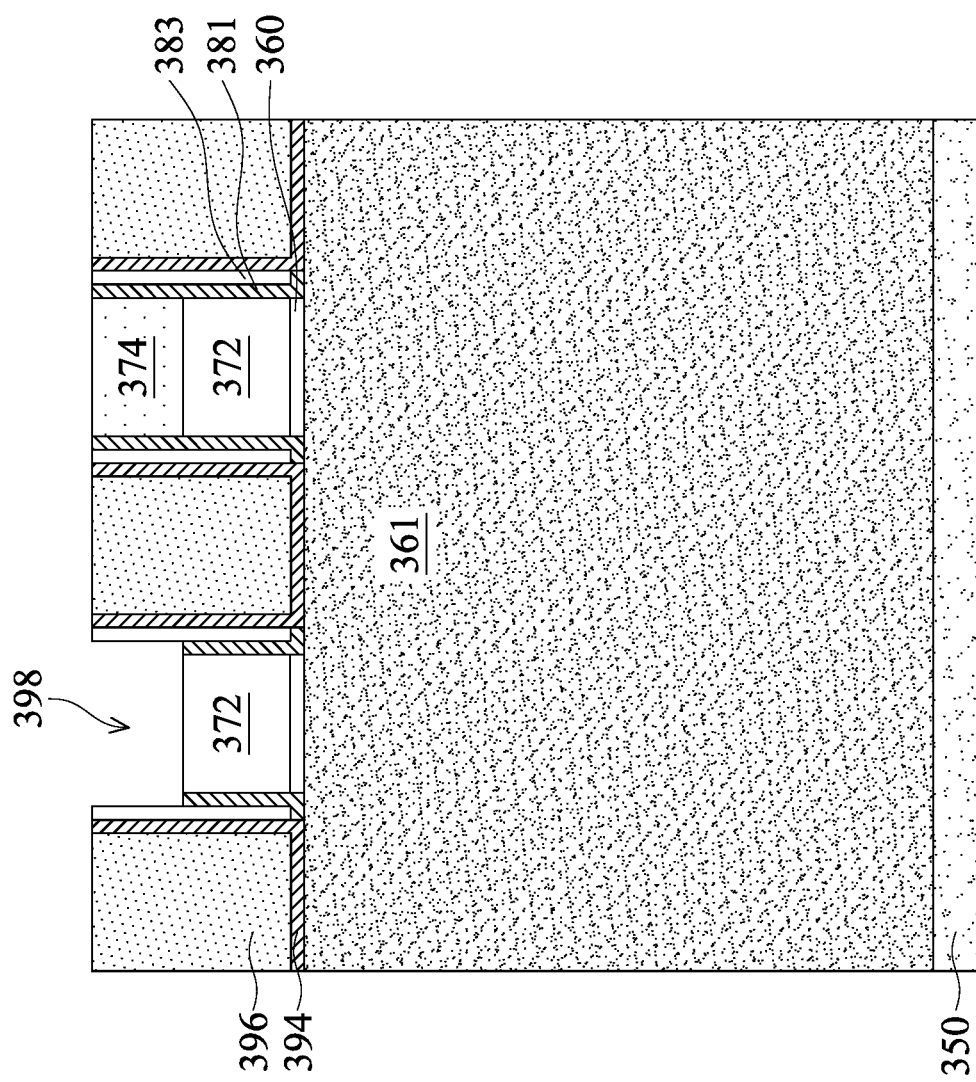

In FIGS. 37A through 37C, processes the same as or similar to those discussed above with respect to FIGS. 12A through 14D are performed to form epitaxial source/drain regions 392 (similar to or the same as the epitaxial source/drain regions 92) in the first recesses 386; a CESL 394 (similar to or the same as the CESL 94) and a first ILD 396 (similar to or the same as the first ILD 96) over the epitaxial source/drain regions 392 and adjacent the second spacers 383; and to form first openings 398 in the masks 374. The first openings 398 may be etched through the masks 374 and may expose the dummy gates 372. In some embodiments, the first spacers 381 may be formed of the same materials as the masks 374 and may be etched simultaneously with the masks 374. For example, in some embodiments, the first spacers 381 and the masks 374 may comprise a nitride, such as silicon nitride. The masks 374 may be etched using anisotropic etching processes, such as RIE, NBE, or the like. As illustrated in FIG. 37A, the first openings 398 may have a width $W_3$ in a direction perpendicular to a longitudinal axis of the dielectric fin 361. The width $W_3$ may range from about 18 nm to about 40 nm. In some embodiments, the width $W_3$ may be enlarged to range from about 30 nm to about 50 nm.

Figures 38A, 38B:
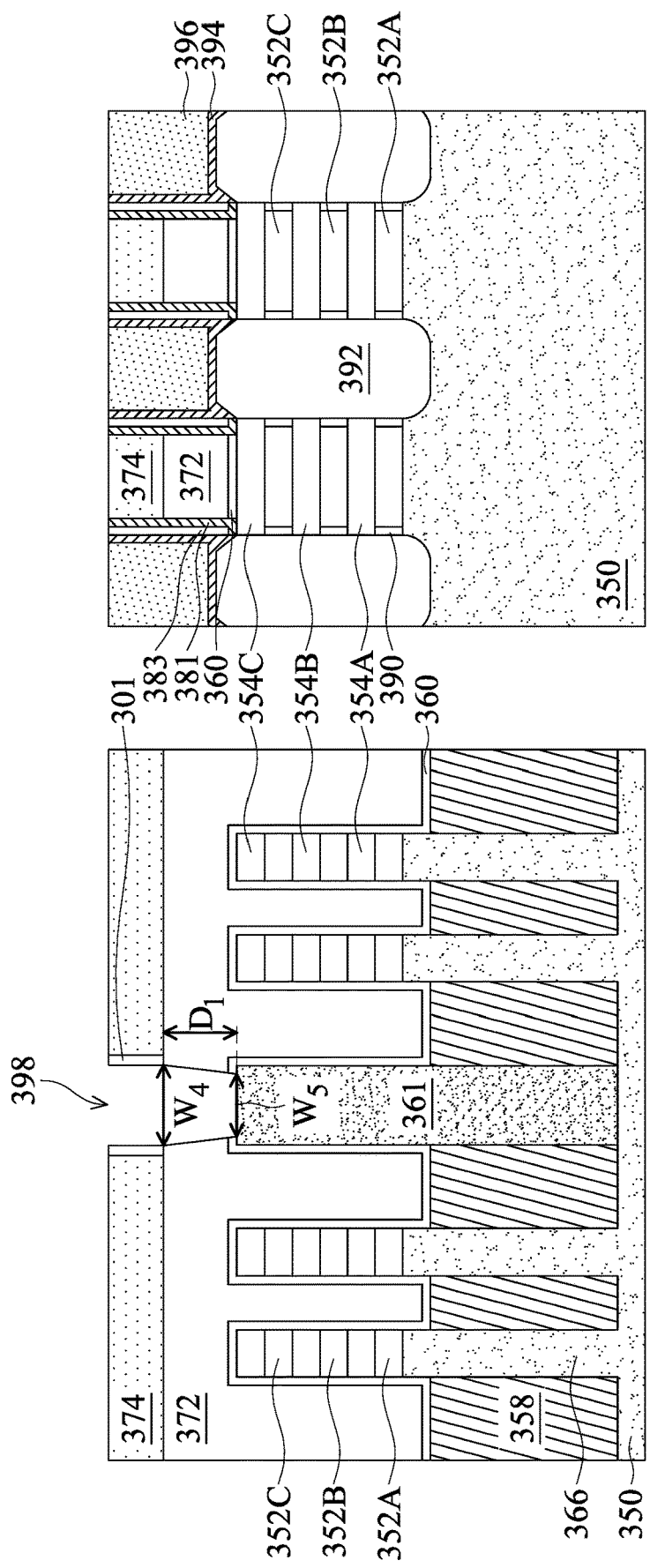
Figure 38C:
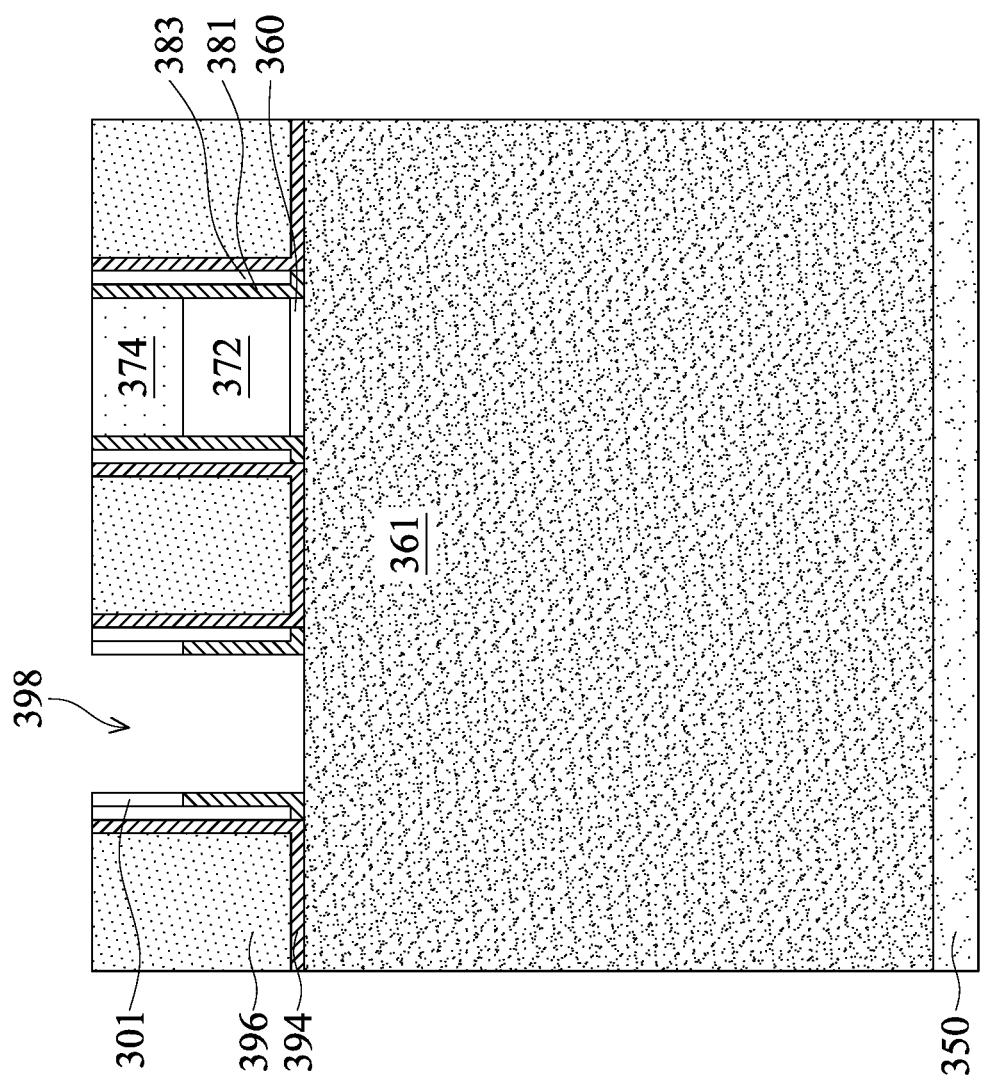

In FIGS. 38A through 38C, third spacers 301 are formed in the first openings 398 and the first openings 398 are extended through the dummy gates 372 and the dummy dielectric layers 360 to the dielectric fin 361. The third spacers 301 may be formed of materials and by processes the same as or similar to those discussed above with respect to FIGS. 15A through 16D for the third spacers 101 or with respect to FIGS. 25A through 26D for the first dielectric layer 100. As illustrated in FIGS. 38A and 38C, opposite ones of the third spacers 301 disposed in the same first opening 398 may be separated from one another by a width $W_4$ in the direction perpendicular to the longitudinal axis of the dielectric fin 361. The width $W_4$ may range from about 12 nm to about 30 nm. In some embodiments, the width $W_4$ may be greater than the width $W_2$ of the dielectric fin 361 by a distance ranging from about 1 nm to about 2 nm and a ratio of the width $W_4$ to the width $W_2$ may range from about 0.5 to about 1.5.

Forming the first openings 398 and then narrowing the first openings 398 using the third spacers 301 provides for greater control over the widths of the first openings 398 and reduces critical dimensions of the first openings 398. This helps to improve device performance, reduce device defects, and reduce feature size. Because the third spacers 301 are formed of a material having high etch selectivity to the underlying dummy gates 372, the dummy gates 372 may be etched with reduced scum. This allows for the third spacers 301 to be formed with the width $W_4$ less than 16 nm. The improved etching process with reduced scum may reduce leakage current, which improves device performance.

The dummy gates 372 may be etched using a suitable etching process, such as an anisotropic etching process (e.g., a dry etching process) or the like. In embodiments in which the dummy gates 372 comprise polycrystalline silicon, the dummy gates 372 may be etched by a dry etching process using fluorine, which selectively etch the material of the dummy gates 372 relative to the third spacers 301, the masks 374, the first ILD 396, the CESL 394, the first spacers 381, and the second spacers 383. Following the etching, the first openings 398 may have the widths $W_4$ level with top surfaces of the dummy gates 372, widths $W_5$ level with bottom surfaces of the dummy dielectric layers 360 on the dielectric fin 361, and depths $D_1$ between the top surfaces of the dummy gates 372 and the bottom surfaces of the dummy dielectric layers 360 on the dielectric fin 361. The widths $W_4$ may range from about 12 nm to about 30 nm, as discussed above; the widths $W_5$ may range from about 12 nm to about 25 nm; and the depths $D_1$ may range from about 80 nm to about 140 nm. Although the first openings 398 are illustrated as having tapered profiles extending through the dummy gates 372 and the dummy dielectric layers 360, the first openings 398 may have vertical sidewalls or reverse tapered profiles (widening in a direction from the top surfaces of the dummy gates 372 to the bottom surfaces of the dummy dielectric layers 60). Forming the first openings 398 and then narrowing the first openings 398 using the third spacers 301 provides for greater control over the widths of the first openings 398 and reduces critical dimensions of the first openings 398. Because the third spacers 301 are formed of a material having a high etch selectivity relative to the dummy gates 372, the dummy gates 372 may be etched for a time sufficient to completely etch through the dummy gates 372, reducing scum left in the first openings 398, which reduces leakage current and allows for smaller critical dimensions to be achieved. As such, the methods described help to improve device performance, reduce device defects, and reduce feature size. In some embodiments, the processes and materials described with respect to FIGS. 25A through 26D may be used in place of the third spacers 101 to form the first openings 398.

Figures 39A, 39B:
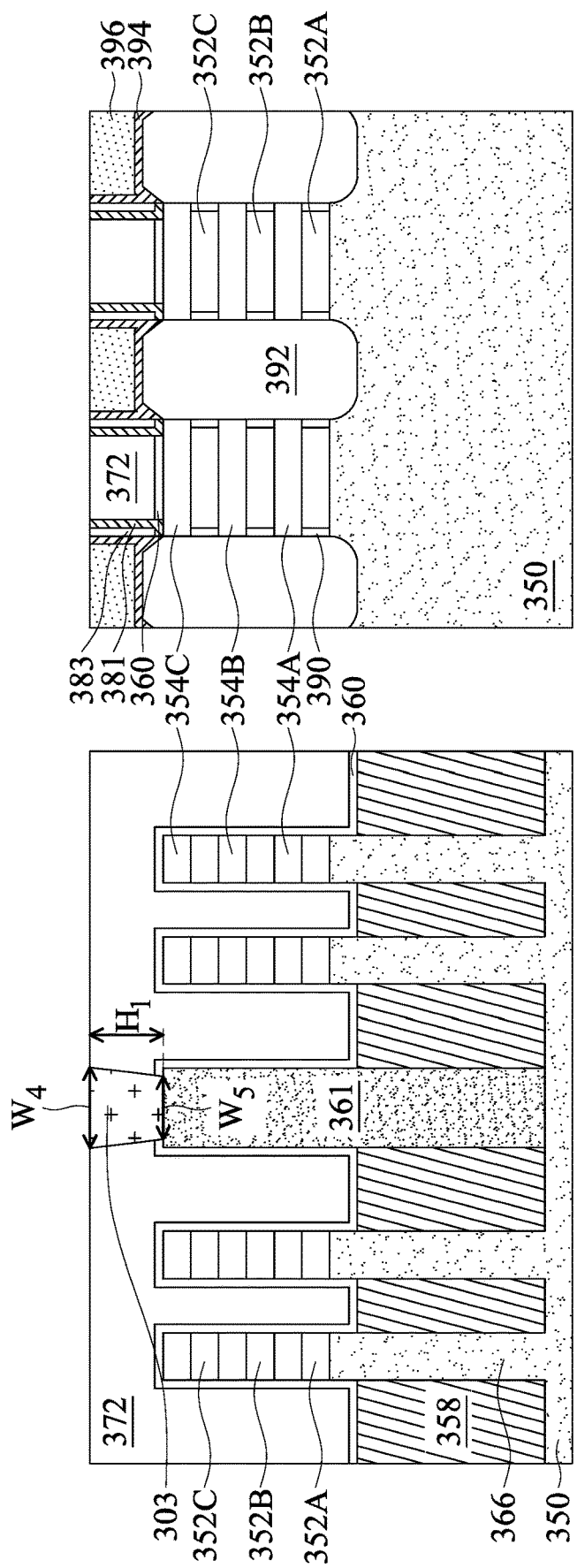
Figure 39C:
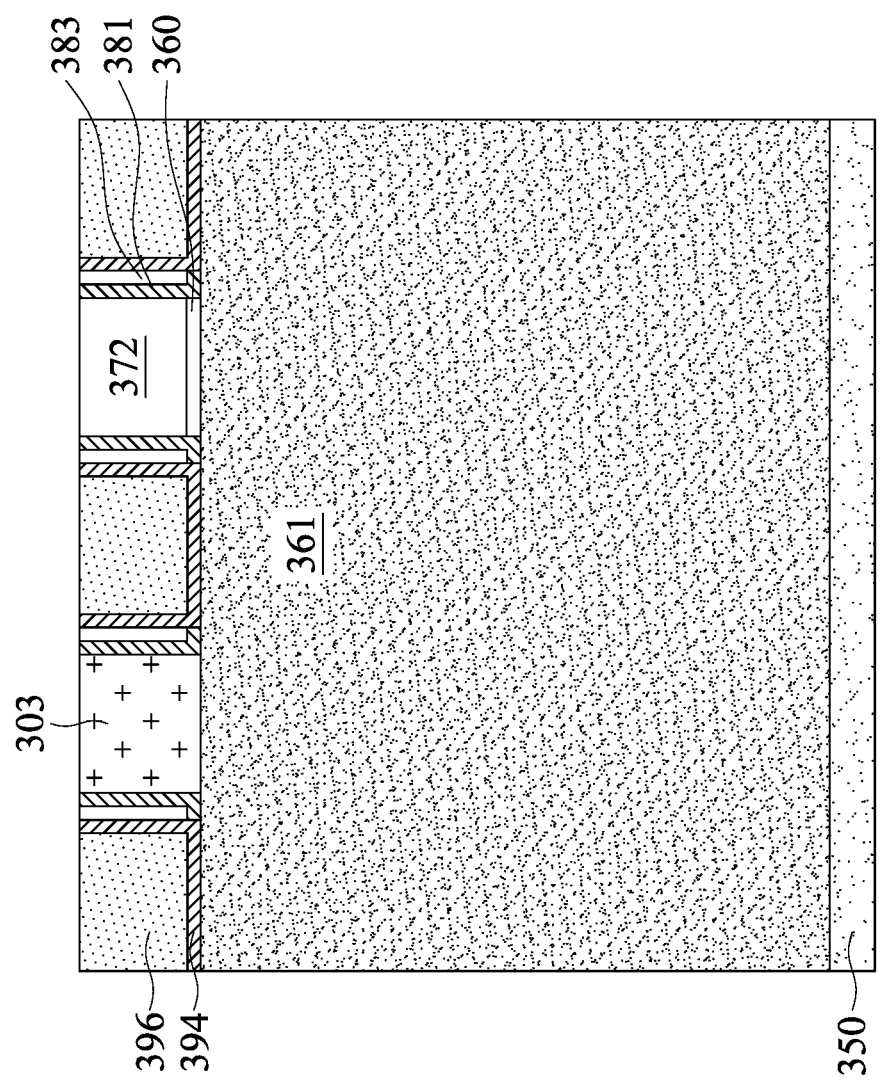

In FIGS. 39A through 39C, gate isolation regions 303 are formed in the first openings 398. The gate isolation regions may be formed of materials and by processes the same as or similar to those discussed above with respect to FIGS. 18A through 19D for the gate isolation regions 103. The gate isolation regions 303 may be used to isolate portions of the dummy gates 72, which are subsequently replaced by gate electrodes (such as the gate electrodes 308, discussed below with respect to FIGS. 41A and 41B). Top surfaces of the gate isolation regions 303 may have widths $W_4$ ranging from about 12 nm to about 30 nm, bottom surfaces of the gate isolation regions 303 may have widths $W_5$ ranging from about 12 nm to about 25 nm, and the gate isolation regions 303 may have heights $H_1$ ranging from about 80 nm to about 120 nm.

In FIGS. 40A and 40B, the dummy gates 372, the dummy dielectric layers 360, and the first nanostructures 352 are removed in one or more etching steps, forming second recesses 304. In some embodiments, the dummy gates 372 and the dummy dielectric layers 360 are removed by an anisotropic dry etch process. For example, the etching process may include a dry etch process using reaction gas(es) that selectively etch the dummy gates 372 at a faster rate than the first ILD 396, the CESL 394, the first spacers 381, the second spacers 383, or the gate isolation regions 303. During the removal, the dummy dielectric layers 360 may be used as etch stop layers when the dummy gates 372 are etched. The dummy dielectric layers 360 may then be removed after the removal of the dummy gates 372. Each of the second recesses 304 exposes and/or overlies portions of the nanostructures 359, which act as channel regions in subsequently completed nano-FETs. Portions of the nanostructures 359, which act as the channel regions, are disposed between neighboring pairs of the epitaxial source/drain regions 392.

The first nanostructures 352 are then removed extending the second recesses 304. The first nanostructures 352 may be removed by performing an isotropic etching process, such as wet etching or the like, using etchants which are selective to the materials of the first nanostructures 352, while the second nanostructures 354, the substrate 350, the STI regions 358, the first ILD 396, the CESL 394, the first spacers 381, the second spacers 383, the first inner spacers 390, the gate isolation regions 303, and the dielectric fin 361 remain relatively un-etched as compared to the first nanostructures 352. In embodiments in which the first nanostructures 352 include, e.g., SiGe, and the second nanostructures 354 include, e.g., Si or SiC, tetramethylammonium hydroxide (TMAH), ammonium hydroxide (NH$_4$OH), or the like may be used to remove the first nanostructures 352.

Figures 41A, 41B:
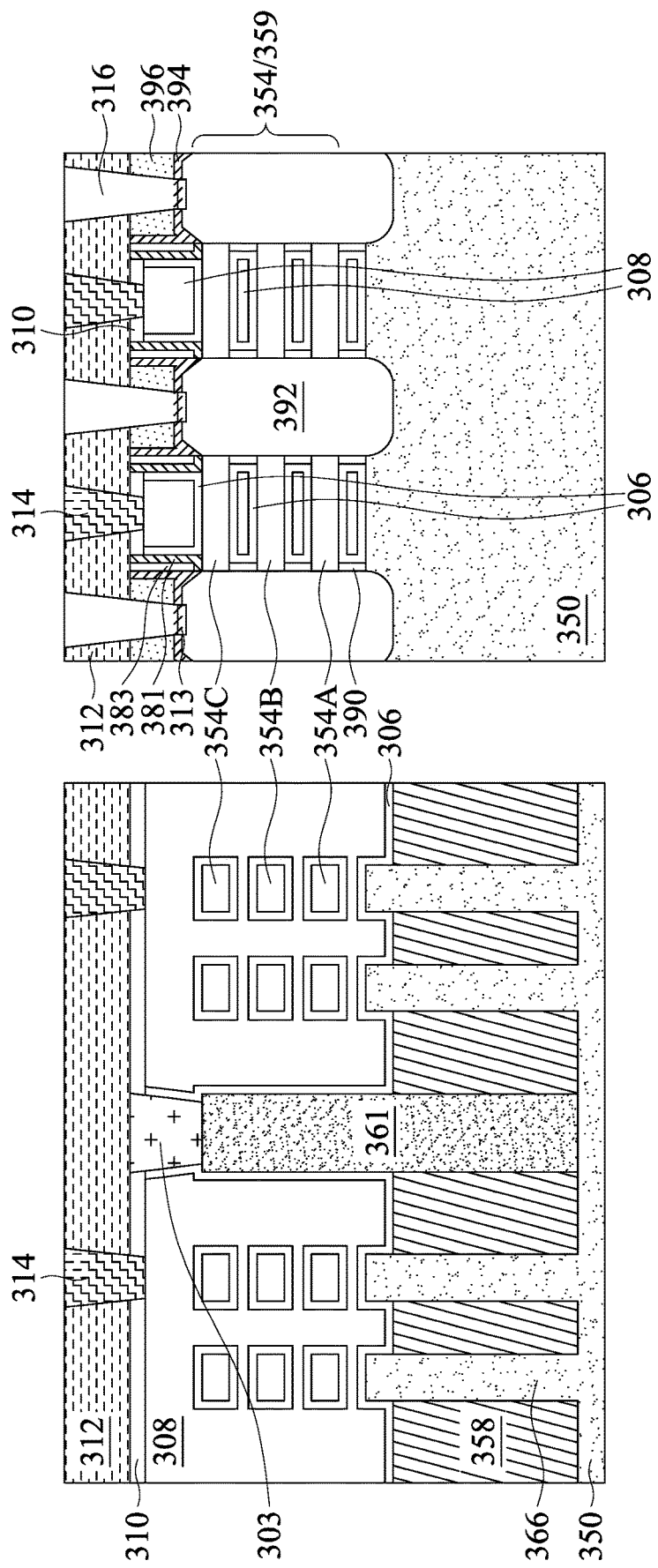

In FIGS. 41A and 41B, processes the same as or similar to those discussed above with respect to FIGS. 20A through 23B are performed to form gate dielectric layers 306 (similar to or the same as the gate dielectric layers 106) and gate electrodes 308 (similar to or the same as the gate electrodes 108) in the second recesses 304; a gate mask 310 (similar to or the same as the gate mask 110) over the gate electrodes 308; a second ILD 312 (similar to or the same as the second ILD 112) over the gate mask 310, the first ILD 396, the CESL 394, the gate isolation regions 303, the first spacers 381, and the second spacers 383; source/drain contacts 316 (similar to or the same as the source/drain contacts 116) extending through the second ILD 312, the first ILD 396, and the CESL 394; silicide regions 313 (similar to or the same as the silicide regions 113) electrically coupling the source/drain contacts 316 to the epitaxial source/drain regions 392; and gate contacts 314 (similar to or the same as the gate contacts 114) extending through the second ILD 312 and the gate mask 310. The gate dielectric layers 306 and the gate electrodes 308 may be formed by conformal deposition processes, such as CVD, ALD, molecular-beam deposition (MBD), or the like, with the gate dielectric layers 306 being deposited on top surfaces and sidewalls of the fins 66 and on top surfaces, sidewalls, and bottom surfaces of the second nanostructures 354.

Embodiments may achieve various advantages. For example, forming the first openings 398 through the masks 374 and forming the third spacers 301 in the first openings 398 allows a critical dimension of the first openings 398 to be reduced and provides better control over the critical dimension of the first openings 398. This reduces device defects and improves device performance. The third spacers 301 may be formed of materials having high etch selectivity to the dummy gates 372 and the dummy gates 372 may be etched for a time sufficient to eliminate scum in the first openings 398, which reduces leakage current. Gate isolation regions 303 are subsequently formed in the first openings 398 and may be used to isolate adjacent gate stacks from one another.

In accordance with an embodiment, a method includes forming a channel structure over a substrate; forming a first isolation structure extending in a direction parallel to the channel structure; forming a dummy gate structure over the channel structure and the first isolation structure; depositing a hard mask layer over the dummy gate structure; etching the hard mask layer to form a first opening through the hard mask layer over the first isolation structure; conformally depositing a first dielectric layer over the hard mask layer, in the first opening, and over the dummy gate structure; etching the first dielectric layer to extend the first opening and expose the dummy gate structure; and etching the dummy gate structure to extend the first opening and expose the first isolation structure. In an embodiment, forming the first isolation structure includes forming a first dummy structure over the substrate; forming an isolation region adjacent the channel structure and the first dummy structure; etching the first dummy structure to form a second opening in the isolation region; and forming the first isolation structure in the second opening. In an embodiment, the dummy gate structure includes polycrystalline silicon, and the first dielectric layer includes silicon nitride. In an embodiment, the method further includes depositing a gate isolation structure in the first opening after etching the dummy gate structure. In an embodiment, the method further includes removing the hard mask layer and the first dielectric layer using a planarization process. In an embodiment, the method further includes removing the dummy gate structure to form a second opening; and forming a replacement gate structure in the second opening, the replacement gate structure contacting the first isolation structure and the gate isolation structure.

In accordance with another embodiment, a method includes forming a gate structure over a semiconductor substrate; depositing a hard mask over the gate structure; etching the hard mask to form a first opening exposing the gate structure; depositing a first dielectric layer in the first opening; etching the first dielectric layer to form a first spacer and expose the gate structure; and etching the gate structure to expose a dielectric fin disposed between the gate structure and the semiconductor substrate. In an embodiment, the gate structure includes polycrystalline silicon, and the first dielectric layer includes silicon nitride. In an embodiment, the gate structure includes polycrystalline silicon, the first dielectric layer includes silicon, and etchants for etching the first dielectric layer are the same as etchants for etching the gate structure. In an embodiment, the gate structure includes polycrystalline silicon, and includes the first dielectric layer comprises silicon oxide. In an embodiment, the method further includes depositing a second dielectric layer in the first opening over the first dielectric layer, etching the first dielectric layer further including etching the second dielectric layer to expose the gate structure. In an embodiment, the method further includes forming a first fin structure, a second fin structure, and a third fin structure extending from the semiconductor substrate, the second fin structure being between the first fin structure and the third fin structure; and replacing the second fin structure with the dielectric fin. In an embodiment, the dielectric fin includes silicon nitride.

In accordance with yet another embodiment, a method includes forming a hard mask over a dummy gate structure; etching a first opening extending through the hard mask and partially through the dummy gate structure; conformally depositing a first dielectric layer over the hard mask and the dummy gate structure and in the first opening; simultaneously etching through the first dielectric layer and the dummy gate structure to extend the first opening; and forming a gate isolation structure in the first opening. In an embodiment, the method further includes forming a first fin and a second fin extending from a semiconductor substrate, the first fin and the second fin including a semiconductor material; and replacing the second fin with a dielectric fin; and forming the dummy gate structure over the first fin and the dielectric fin. In an embodiment, the dielectric fin and the gate isolation structure are formed of materials including silicon nitride. In an embodiment, the dummy gate structure and the first dielectric layer are formed of materials including polycrystalline silicon. In an embodiment, simultaneously etching through the first dielectric layer and the dummy gate structure includes dry etching using an etchant comprising fluorine. In an embodiment, the method further includes performing a planarization process on the hard mask and the first dielectric layer to remove the hard mask, at least a portion of the first dielectric layer remaining after performing the planarization process. In an embodiment, the method further includes simultaneously removing the dummy gate structure and the first dielectric layer to form a second opening; and forming a replacement gate structure in the second opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a channel structure over a substrate;
   forming a first isolation structure extending in a direction parallel to the channel structure;
   forming a dummy gate structure over the channel structure and the first isolation structure;
   depositing a hard mask layer over the dummy gate structure;
   etching the hard mask layer to form a first opening through the hard mask layer over the first isolation structure;
   conformally depositing a first dielectric layer over the hard mask layer, in the first opening, and over the dummy gate structure;
   etching the first dielectric layer to extend the first opening and expose the dummy gate structure; and
   etching the dummy gate structure to extend the first opening and expose the first isolation structure.

2. The method of claim 1, wherein forming the first isolation structure comprises:
   forming a first dummy structure over the substrate;
   forming an isolation region adjacent the channel structure and the first dummy structure;
   etching the first dummy structure to form a second opening in the isolation region; and
   forming the first isolation structure in the second opening.

3. The method of claim 1, wherein the dummy gate structure comprises polycrystalline silicon, and wherein the first dielectric layer comprises silicon nitride.

4. The method of claim 1, further comprising depositing a gate isolation structure in the first opening after etching the dummy gate structure.

5. The method of claim 4, further comprising removing the hard mask layer and the first dielectric layer using a planarization process.

6. The method of claim 5, further comprising:
   removing the dummy gate structure to form a second opening; and
   forming a replacement gate structure in the second opening, the replacement gate structure contacting the first isolation structure and the gate isolation structure.

7. A method comprising:
   forming a gate structure over a semiconductor substrate;
   depositing a hard mask over the gate structure;
   etching the hard mask to form a first opening exposing the gate structure;
   depositing a first dielectric layer in the first opening;
   etching the first dielectric layer to form a first spacer and expose the gate structure; and
   etching the gate structure to expose a dielectric fin disposed between the gate structure and the semiconductor substrate.

8. The method of claim 7, wherein the gate structure comprises polycrystalline silicon, and wherein the first dielectric layer comprises silicon nitride.

9. The method of claim 7, wherein the gate structure comprises polycrystalline silicon, wherein the first dielectric layer comprises silicon, and wherein etchants for etching the first dielectric layer are the same as etchants for etching the gate structure.

10. The method of claim 7, wherein the gate structure comprises polycrystalline silicon, and wherein the first dielectric layer comprises silicon oxide.

11. The method of claim 7, further comprising depositing a second dielectric layer in the first opening over the first dielectric layer, wherein etching the first dielectric layer further comprises etching the second dielectric layer to expose the gate structure.

12. The method of claim 7, further comprising:
   forming a first fin structure, a second fin structure, and a third fin structure extending from the semiconductor substrate, wherein the second fin structure is between the first fin structure and the third fin structure; and
   replacing the second fin structure with the dielectric fin.

13. The method of claim 12, wherein the dielectric fin comprises silicon nitride.

14. A method comprising:
   forming a hard mask over a dummy gate structure;
   etching a first opening extending through the hard mask and partially through the dummy gate structure;
   conformally depositing a first dielectric layer over the hard mask and the dummy gate structure and in the first opening;

simultaneously etching through the first dielectric layer and the dummy gate structure to extend the first opening; and forming a gate isolation structure in the first opening.

15. The method of claim 14, further comprising:

forming a first fin and a second fin extending from a semiconductor substrate, the first fin and the second fin comprising a semiconductor material;

replacing the second fin with a dielectric fin; and forming the dummy gate structure over the first fin and the dielectric fin.

16. The method of claim 15, wherein the dielectric fin and the gate isolation structure are formed of materials comprising silicon nitride.

17. The method of claim 16, wherein the dummy gate structure and the first dielectric layer are formed of materials comprising polycrystalline silicon.

18. The method of claim 14, wherein simultaneously etching through the first dielectric layer and the dummy gate structure comprises dry etching using an etchant comprising fluorine.

19. The method of claim 14, further comprising performing a planarization process on the hard mask and the first dielectric layer to remove the hard mask, wherein at least a portion of the first dielectric layer remains after performing the planarization process.

20. The method of claim 14, further comprising:

simultaneously removing the dummy gate structure and the first dielectric layer to form a second opening; and forming a replacement gate structure in the second opening.

* * * * *